United States Patent [19]
Haruki et al.

[11] Patent Number: 5,465,220
[45] Date of Patent: Nov. 7, 1995

[54] OPTICAL EXPOSURE METHOD

[75] Inventors: Tamae Haruki; Kenji Nakagawa; Masao Taguchi; Hiroyuki Tanaka; Satoru Asai; Isamu Hanyu, all of Kawasaki, Japan

[73] Assignee: Fujitsu Limited, Kanagawa, Japan

[21] Appl. No.: 69,853

[22] Filed: Jun. 1, 1993

[30] Foreign Application Priority Data

| Jun. 2, 1992 | [JP] | Japan | 4-141548 |
| Jun. 2, 1992 | [JP] | Japan | 4-141755 |
| Jun. 18, 1992 | [JP] | Japan | 4-182913 |
| Oct. 6, 1992 | [JP] | Japan | 4-267415 |
| Mar. 19, 1993 | [JP] | Japan | 5-60593 |

[51] Int. Cl.$^6$ .................................................. G06F 9/00
[52] U.S. Cl. ................................. 364/525; 430/5
[58] Field of Search ............... 364/525, DIG. 1, 364/224.7; 430/5, 320, 321; 395/800

[56] References Cited

U.S. PATENT DOCUMENTS

| 4,440,839 | 4/1984 | Mottier .......................................... 430/5 |
| 4,593,351 | 6/1986 | Hong et al. .......................... 364/DIG. 1 |
| 5,326,659 | 7/1994 | Liu et al. ..................................... 430/5 |

FOREIGN PATENT DOCUMENTS

| 0025380 | 3/1981 | European Pat. Off. . |
| 0486316A3 | 5/1992 | European Pat. Off. . |
| 1572195 | 3/1970 | Germany . |
| 2037590 | 2/1972 | Germany . |

OTHER PUBLICATIONS

"Photolithography System Using Annular Illuminaton", Kamon et al., Japanese Journal of Applied Physics, vol. 30, No. 11B, Nov. 1991, pp. 3021–3029.
"Improving Projection Lithography Image Illumination by Using Sources Far from the Optical Axis", Asai et al., Journal of Vacuum Science & Technology, Part B, vol. 9, No. 6, Nov. 1991, pp. 2788–2791.

Primary Examiner—Ellis B. Ramirez
Attorney, Agent, or Firm—Nikaido, Marmelstein, Murray & Oram

[57] ABSTRACT

An optical exposure method in photolithography applied for precise processing when semiconductor devices are produced. A pattern on a photomask is projected and exposed on a register on a base plate with an exposure device including a deformation illumination system, a photomask and a projection lens. The deformation illumination system is composed of a light source, a diaphragm and a condenser lens, and the diaphragm is provided with a linear through-hole. The optical exposure method uses a ray of linear light for illumination or two rays of linear light for illumination that are parallel with the pattern. The two rays of linear light are symmetrical with respect to an optical axis. These rays are parallel with the pattern in a position separate from the optical axis of the exposure device when the photomask pattern is a line and space pattern.

6 Claims, 54 Drawing Sheets

Fig.4(a) IN FOCUS
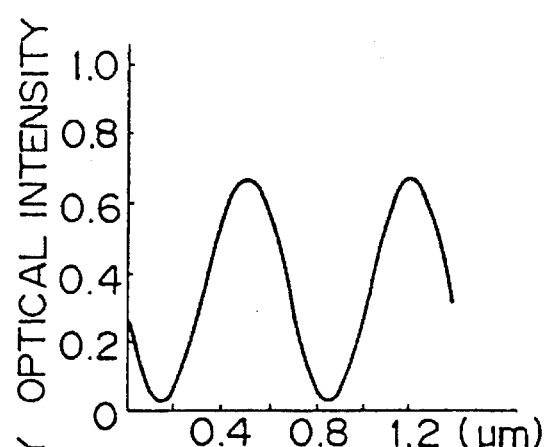
Fig.4(b) OUT OF FOCUS 0.5 μm
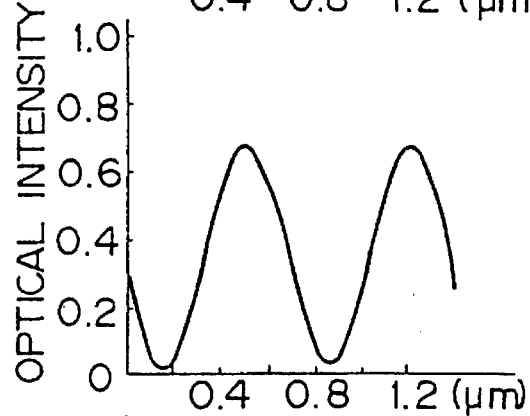
Fig.4(c) OUT OF FOCUS 1.0 μm
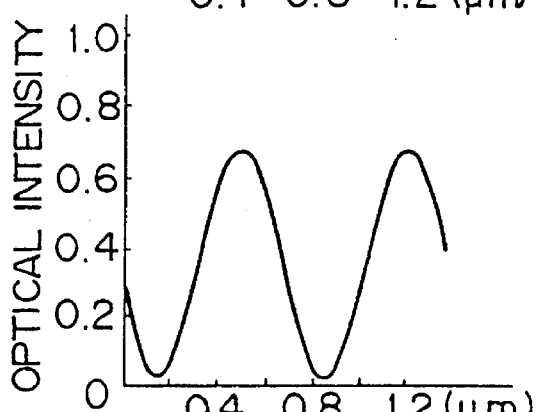
Fig.4(d) OUT OF FOCUS 1.5 μm
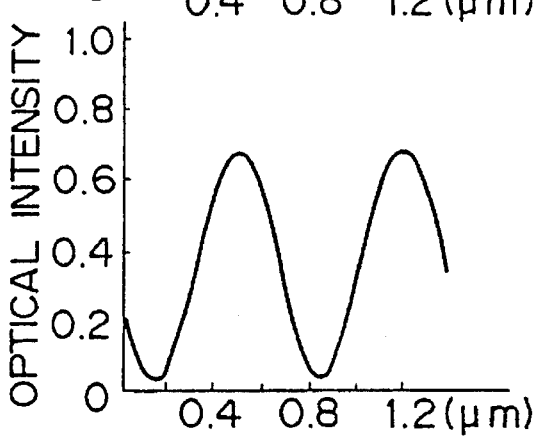

Fig.5(a) IN FOCUS
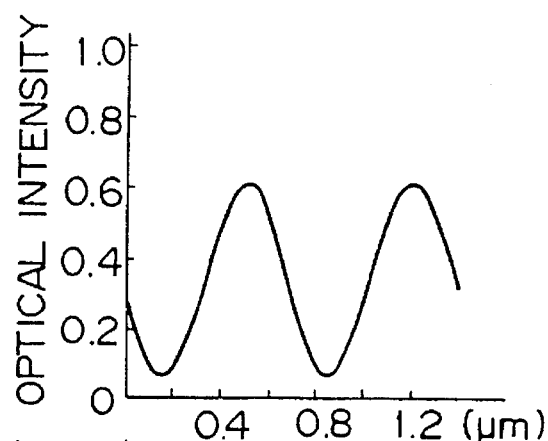
Fig.5(b) OUT OF FOCUS 0.5 μm
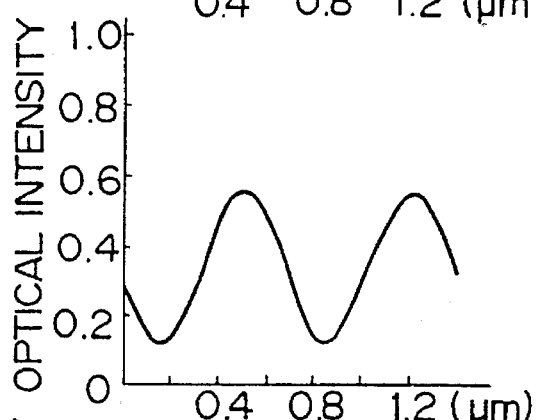
Fig.5(c) OUT OF FOCUS 1.0 μm
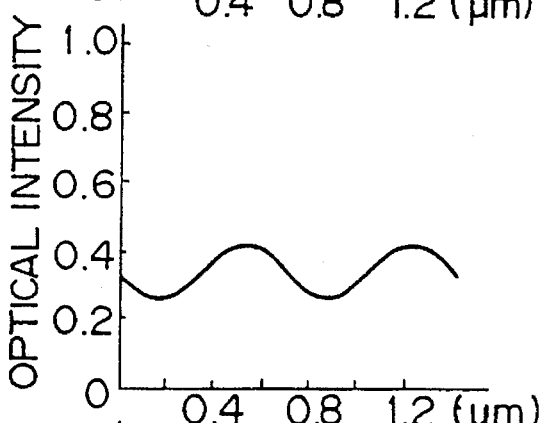
Fig.5(d) OUT OF FOCUS 1.5 μm
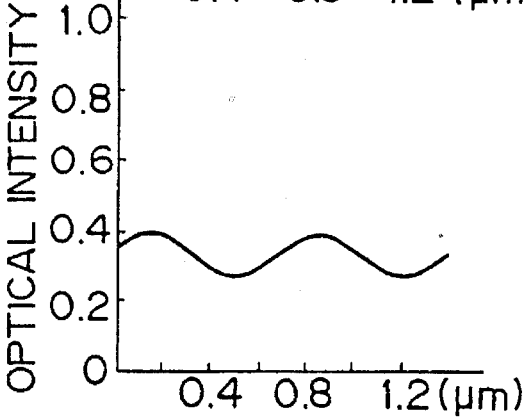

PATTEN OF LINE AND SPACE AT RIGHT ANGLE

IN FOCUS

OUT OF FOCUS 0.2 μm

OUT OF FOCUS 0.4 μm

OUT OF FOCUS 0.6 μm

OUT OF FOCUS 0.8 μm

OUT OF FOCUS 1.0 μm

IN FOCUS

OUT OF FOCUS 0.6 μm

OUT OF FOCUS 0.2 μm

OUT OF FOCUS 0.8 μm

OUT OF FOCUS 0.4 μm

OUT OF FOCUS 1.0 μm

IN FOCUS

OUT OF FOCUS
0.2 μm

OUT OF FOCUS
0.4 μm

OUT OF FOCUS
0.6 μm

OUT OF FOCUS
0.8 μm

OUT OF FOCUS
1.0 μm

OUT OF FOCUS
1.2 μm

IN FOCUS

OUT OF FOCUS
0.2 μm

OUT OF FOCUS
0.4 μm

OUT OF FOCUS
0.6 μm

OUT OF FOCUS
0.8 μm

OUT OF FOCUS
1.0 μm

OUT OF FOCUS
1.2 μm

Fig.39(a)
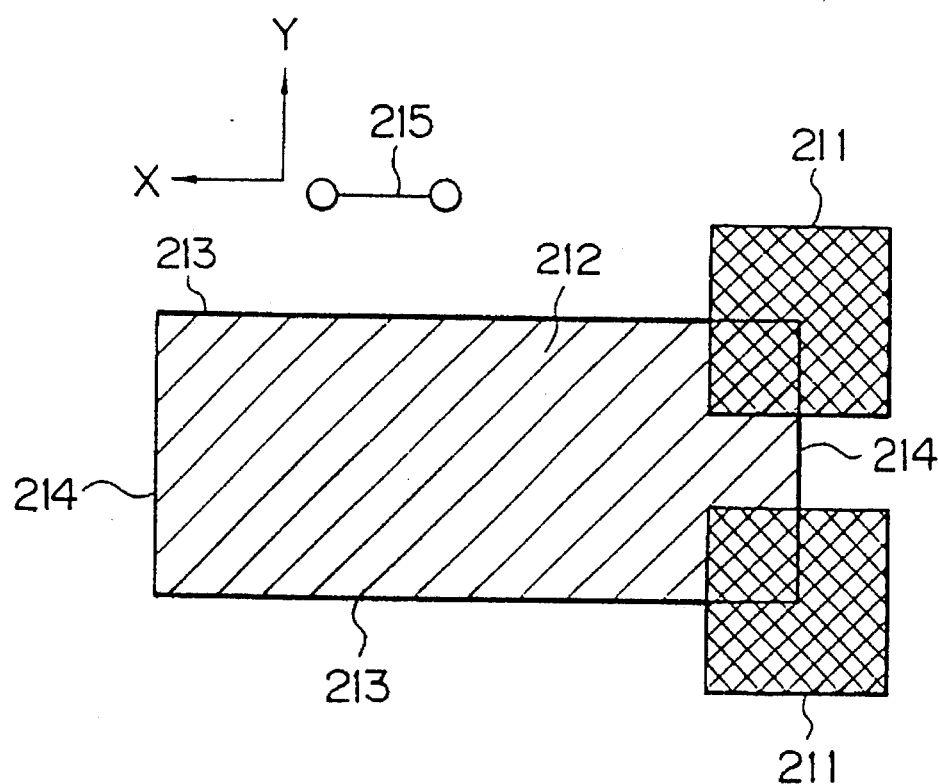
Fig.39(b)
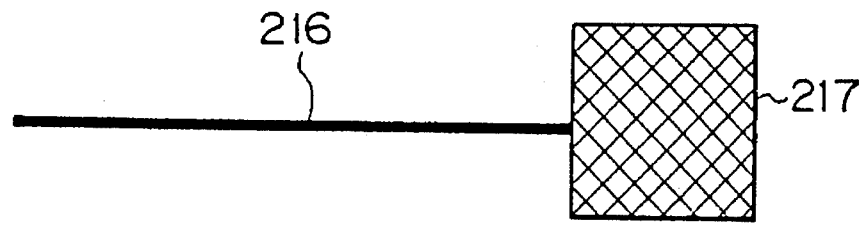
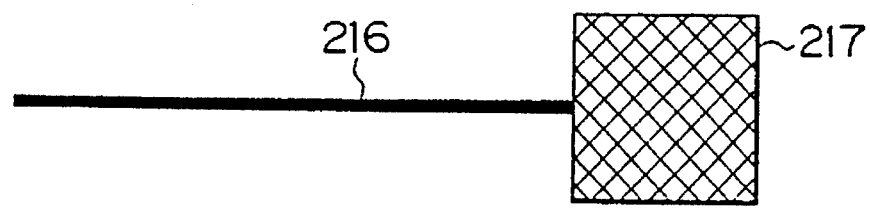

Fig.43(a)
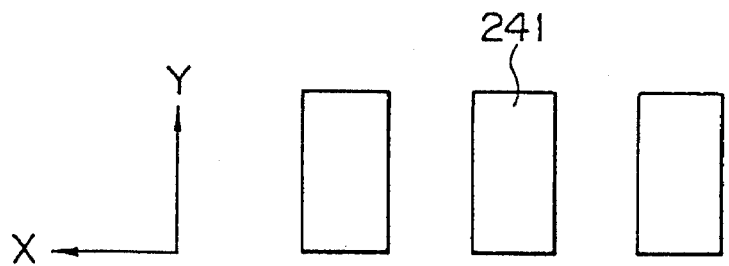
Fig.43(b)
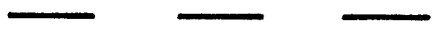
Fig.43(c)
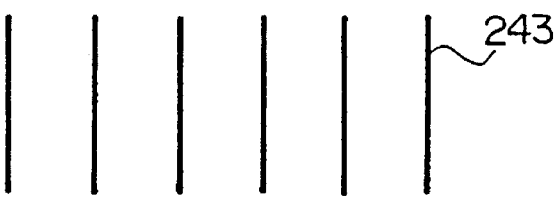
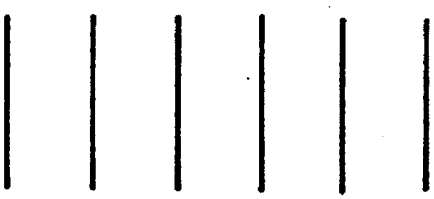

0.5 0.5

0.65

1.5 0.35

X-DIRECTION

Y-DIRECTION

Fig.60
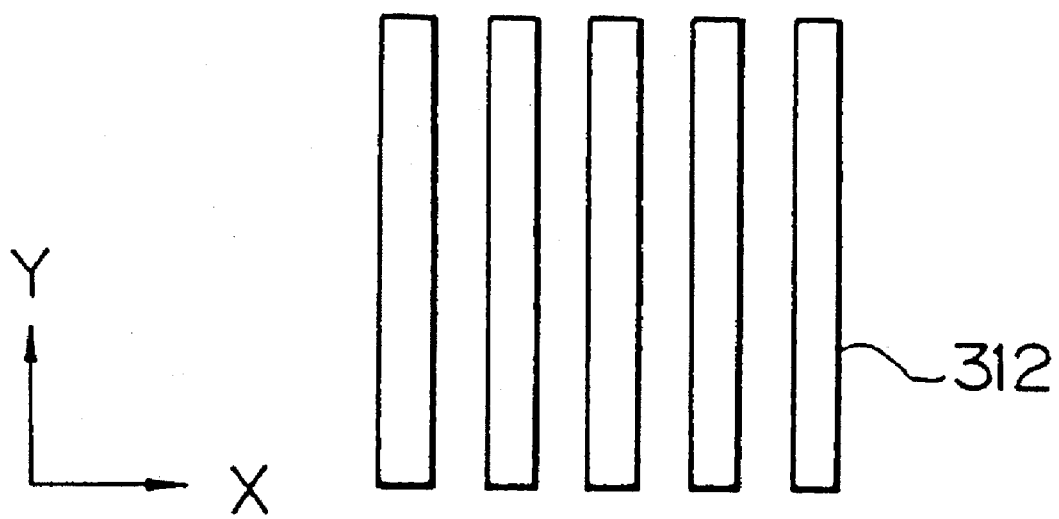
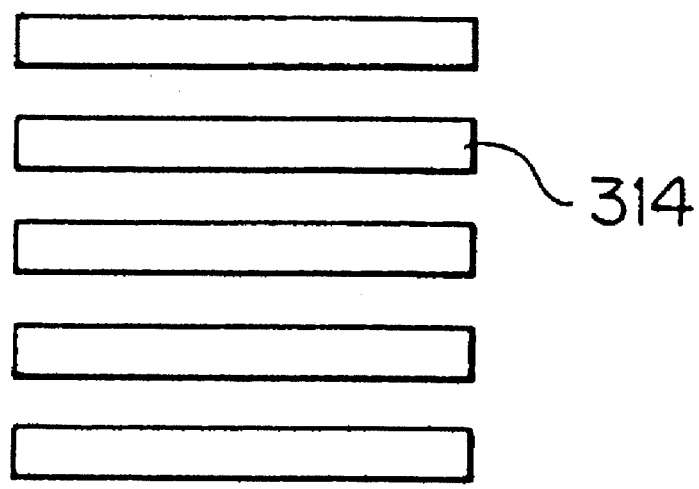

Fig.63(a)
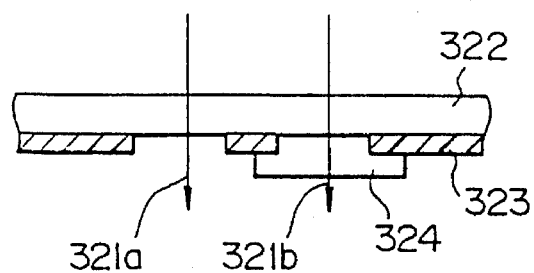
Fig.63(b)
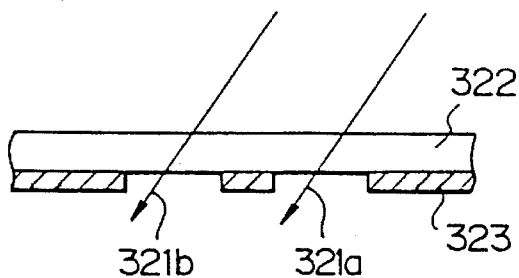
Fig.63(c)
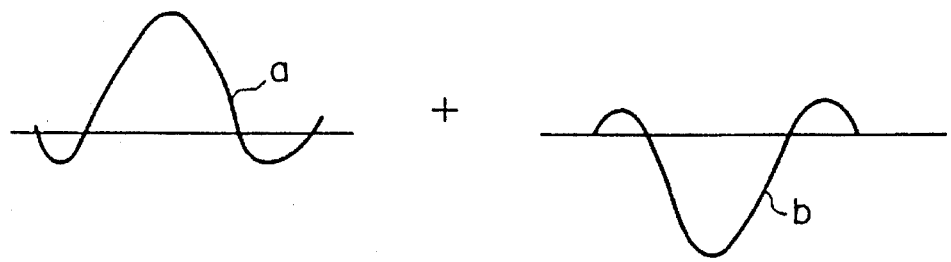
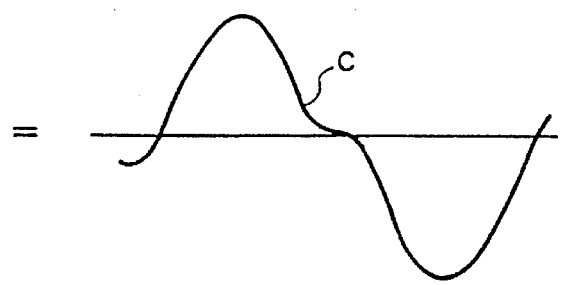
Fig.63(d)
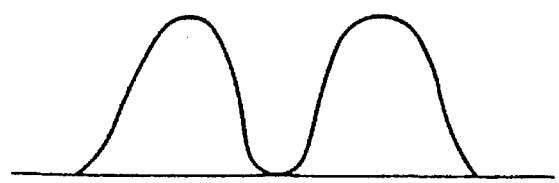

Fig.65(a)₁

$$\sigma = \frac{\sin \theta_1}{\sin \theta_2}$$

$$\sin \theta_2 = \frac{NA}{m}$$

$$NA = \sin \theta_3$$

$$\sin \theta_1 = \sigma \cdot \sin \theta_2 = \sigma \cdot \frac{NA}{m}$$

OPTICAL EXPOSURE METHOD

BACKGROUND OF THE INVENTION

1. Field of the Invention

The present invention relates to photolithography applied for precise processing when semiconductor devices are produced, and more particularly relates to an optical exposure method in photolithography.

When semiconductor devices such as ultra-LSIs are highly integrated and precise processing is required, manufactures greatly rely on improvements in lithographic technology. Photolithography using light is suitable for mass production. Therefore, it is adopted for the economical reasons.

2. Description of the Related Art

In order to improve resolution in optical exposure technology, it is important to increase the numerical aperture (NA) and to reduce the wavelength of light generated by a light source. On the other hand, the focal depth is reduced as NA is increased. Recently, a deformation illumination method (an oblique incident illumination method) improving the critical resolution and focal depth has been given attention (for example, shown in pages 28–37 of "Nikkei Micro Device" No. 82, April, 1992).

As holes in the diaphragm (the apertures) in the deformation illumination method, zonal holes and four holes symmetrical with respect to a point are well known. In a conventional illumination method, a ray of illumination light sent from a circular hole coinciding with an optical axis to a photomask (reticule) is vertically incident and an image is formed by three beams of light of 0, +1, and −1. However, in the deformation illumination method, the position of the diaphragm is shifted from the optical axis, so that illumination light sent from the hole is obliquely incident on the photomask, and image formation is conducted by two beams of light of 0 and +1 sent from the photomask. In a focal position, higher contrast can be provided by the conventional illumination method, however, in a defocal position, higher contrast can be provided by the deformation illumination method, so that the focal depth and resolution can be considerably improved.

In the conventional deformation illumination method, i.e., only for a simple line and space pattern, a pattern of the photomask is projected and exposed on a register with a diaphragm having the aforementioned general type of diaphragm holes. Accordingly, the illumination system does not meet the requirement of each pattern, so that the effect of oblique incidence of the deformation illumination method is not sufficient.

Also, recently, a lithographic technology using a phase shift mask has been given attention, and the following pattern forming method has been reported to be an effective technology: an unexposed portion (pattern) is used that is accompanied by a sharp decrease of optical intensity generated by a step portion (the phase of exposure light is changed by 180° by this step portion) of a phase shifter of a phase shift mask.

However, when a pattern is formed by this technology, the unexposed portion (pattern) is formed in all step portions of the phase shifter. Therefore, in many applicable fields, it is necessary to provide a process to inhibit the formation Of a pattern generated by the unexposed portion generated by an unnecessary step portion of the phase shifter.

Therefore, the following techniques have been conventionally proposed to ease the sharp decrease of optical intensity: another exposure mask is put on the unnecessary unexposed portion so as to conduct an exposure operation (double exposure); and a multi-shifter (step of 90°) is provided stepwise in a step portion of the phase shifter, the pattern formation of which is not necessary.

However, in the double exposure method that has been conventionally proposed as a method to remove an unnecessary unexposed portion, it is necessary to manufacture a plurality of masks so as to conduct multi-exposure Accordingly, it is necessary to increase the number of the mask manufacturing processes. On the other hand, it is also necessary to ensure an alignment of double exposure, so that the throughput is lowered.

Moreover, when a multi-shifter is manufactured, complicated and difficult process technique is required in order to provide an optically accurate multi-shifter, and further a big problem is caused when a manufactured phase shift is inspected and corrected.

In order to meet the demand of forming minute patterns, for example, attention is given to an oblique incidence illumination method disclosed in the official gazette of Japanese Unexamined Patent Publication No. 2-142111 (1990). According to this method, a ray of light that is vertically incident on a lens is incident being oblique at a predetermined angle, so that focusing is conducted using interference of light.

However, in the aforementioned conventional method, the same light source is used for any device patterns without giving attention to the profile of the light source. Accordingly, the following problems are caused.

SUMMARY OF THE INVENTION

It is an object of the present invention to provide a projection exposure method with a deformation illumination system optimal for a device pattern (photomask pattern).

It is another object of the present invention to provide a method by which an unnecessary unexposed portion can be easily removed without using the aforementioned multi-exposure method or relying on the technique in which the phase shift mask having a multi-shifter is used, in the case where a pattern is formed using the unexposed portion accompanied by a sharp decrease of optical intensity caused by a step portion of the phase shifter.

It is another object of the present invention to provide an optimization method for a light source profile to obtain an optimal light source profile in accordance with a device pattern.

It is another object of the present invention to realize an optical projection exposure in which resolving power can be provided that is higher than that of the conventional phase shift mask or oblique incidence illumination.

The aforementioned object can be accomplished by an optical exposure method by which a pattern on a photomask is projected and exposed on a register on a base plate with an exposure device including a deformation illumination system composed of a light source, a diaphragm and a condenser lens, and also including a photomask and a projection lens, wherein the optical exposure method uses a ray of linear light for illumination that is parallel with a photomask pattern in a position separate from an optical axis of the exposure device (or the optical exposure method uses two rays of linear light for illumination that are symmetrical with respect to the optical axis) when the photomask pattern is a line and space pattern.

The aforementioned object can be accomplished by an optical exposure method, wherein the optical exposure method uses a ray of first linear light for illumination that is parallel with a first pattern portion in a position separate from the optical axis of the exposure system (or the optical exposure method uses two rays of first linear light for illumination that are parallel with the first pattern portion symmetrical with respect to the optical axis), the optical exposure method also uses a ray of second linear light for illumination that is parallel with a second pattern portion in a position separate from the optical axis of the exposure system (or the optical exposure method also uses two rays of second linear light for illumination that are parallel with the second pattern, two rays of second linear light being symmetrical with respect to the optical axis), when the first pattern portion of line and space, and the second pattern portion of similar line and space make a right angle with each other in the photomask pattern.

Moreover, it is preferable to use an optical exposure method in which the first linear light and the second linear light are oblique by an angle $\phi$ with respect to the optical axis in a position on the photomask, and an equation $2p \cdot \sin \phi = \lambda$ is satisfied (where p is a setting pitch of the line and space pattern on the projection surface, and $\lambda$ is a wavelength of light).

The object of the present invention can be accomplished by an optical exposure method by which a pattern on a photomask is projected and exposed on a register on a base plate with an exposure device including a deformation illumination system composed of a light source, a diaphragm and a condenser lens, and also including a photomask and a projection lens, wherein the optical exposure method uses a ray of first block light for illumination that is parallels with the bottom surface of the triangular wave in a position separate from the optical axis of the exposure device (or the optical exposure method uses two rays of first block light for illumination that are symmetrical with respect to the optical axis and parallel with the bottom surface of the triangular wave), and the optical exposure method also uses a ray of second block light for illumination that is perpendicular to the bottom surface of the triangular wave (or the optical exposure method also uses two rays of second block light for illumination that are symmetrical with respect to the optical axis and perpendicular to the bottom surface of the triangular wave), when the photomask pattern is a line and space pattern of a triangular shape, thee bottom angle of which is θ.

Moreover, it is preferable to adopt an optical exposure method in which the optical exposure method characterized in that: the first block light is oblique by an angle $\phi_x$ with respect to the optical axis in a position on the photomask, an equation $2p \cdot \sin \phi_x = \lambda \sin \theta$ being satisfied (p is a setting pitch of line and space pattern in a register, and $\lambda$ is a wavelength of light); the second block light is oblique by an angle $\phi_y$ with respect to the optical axis in a position on the photomask, an equation $2p \cdot \sin \phi_y = \lambda \cos \theta$ being satisfied; and a ratio of the illumination area of the first block light to that of the second block light is sin θ:cos θ.

In the optical exposure method of the present invention, the most appropriate illumination light shape and oblique incident angle $\phi$ are Set in accordance with each photomask pattern, so that the resolution and focal depth and improved for each pattern. Especially when the pitch of line and space of a photomask pattern is close to 1:1, the optical exposure method of the invention is especially effective. In this connection, a pattern of line and space corresponds to a plurality of linear shading (or transmission) stripes of a photomask that are disposed in parallel at regular intervals on a developed register pattern.

In the aforementioned equation $2p \cdot \sin \phi = \lambda$, wavelength $\lambda$ becomes constant for g ray (434 nm), i ray (365 nm) or excimer laser beam (254 nm for KeF excimer laser beam), and incident angle $\phi$ is determined in accordance with pattern pitch width p.

According to another aspect of the present invention, there is provided a projection exposure method of the present invention comprising the steps of: irradiating an exposure mask with exposing light having an optical intensity distribution extending in a primary direction in its section; and projecting the light transmitted through the exposure mask on a surface to be exposed, wherein exposure is carried out with exposure characteristics relying on a direction of the mask pattern of the exposure mask.

Moreover, the present invention is to provide a projection exposure method comprising the steps of: irradiating a phase shift exposure mask with exposing light having an optical intensity distribution extending in a primary direction in its section; and projecting the light transmitted through the phase shift exposure mask on a surface to be exposed, wherein exposure is carried out with exposure characteristics relying on a direction of the mask pattern of the phase shift exposure mask. Especially, an exposing process is adopted in which exposure is carried out with non-symmetrical exposure characteristics including one direction of a step in which an unexposed portion is formed having a sharp decrease of optical intensity caused close to an edge portion of the phase shifter of the phase shift exposure mask, and also including the other direction of a step in which an unexposed portion is not formed.

BRIEF DESCRIPTION OF THE DRAWINGS

FIGS. 4(a)–4(d) are a set of graphs showing the optical intensity in perpendicular directions in accordance with the pattern of FIG. 2 on a projection surface when the diaphragm of FIG. 3 is used. FIG. 4(a) is a graph showing the optical intensity in the case where an image is in focus, FIG. 4(b) is a graph showing the optical intensity in the case where an image is out of focus, wherein the focus slippage is 0.5 μm, FIG. 4(c) is a graph showing the optical intensity in the case where an image is out of focus, wherein the focus slippage is 1.0 μm, and FIG. 4(d) is a graph showing the optical intensity in the case where an image is out of focus, wherein the focus slippage is 1.5 μm;

FIGS. 5(a)–5(d) are a set of graphs showing the optical intensity in perpendicular directions on projection surfaces in accordance with the pattern of FIG. 2 when a conventional circular hole diaphragm is used. FIG. 5(a) is a graph showing the optical intensity in the case where an image is in focus, FIG. 5(b) is a graph showing the optical intensity in the case where an image is out of focus, wherein the focus slippage is 0.5 μm, FIG. 5(c) is a graph showing the optical intensity in the case where an image is out of focus, wherein the focus slippage is 1.0 μm, and FIG. 5(d) is a graph showing the optical intensity in the case where an image is out of focus, wherein the focus slippage is 1.5 μm;

In FIG. 9(a), the optical intensity distribution is shown in the case of image formation conducted in a focal position (in focus). In FIG. 9(b), the optical intensity distribution is shown in the case of image formation conducted out of focus, wherein the amount of focus slippage is 0.2 μm. In FIG. 9(c), the optical intensity distribution is shown in the case of image formation conducted out of focus, wherein the amount of focus slippage in 0.4 μm. In FIG. 9(d), the optical intensity distribution is shown in the case of image formation conducted out of focus, wherein the amount of focus slippage is 0.6 μm. In FIG. 9(e), the optical intensity distribution is shown in the case of image formation conducted in a position out of focus, wherein an amount of focus slippage is 0.8 μm. In FIG. 9(f), the optical intensity distribution is shown in the case of image formation conducted out of focus, wherein the amount of focus slippage is 1.0 μm;

FIG. 10(a) is a graph showing the optical intensity distribution in the case of image formation conducted in a focal position (in focus). FIG. 10(b) is a graph showing the optical intensity distribution in the case of image formation conducted out of focus, wherein the amount of focus slippage is 0.2 μm. FIG. 10(c) is a graph showing the optical intensity distribution in the case of image formation conducted out of focus, wherein the amount of out of focus is 0.4 μm. FIG. 10(d) is a graph showing the optical intensity distribution in the case of image formation conducted out of focus, wherein the amount of focus slippage is 0.6 μm. FIG. 10(e) is a graph showing the optical intensity distribution in the case of image formation conducted in a position out of focus, wherein an amount of focus slippage is 0.8 μm. FIG. 10(f) is a graph showing the optical intensity distribution in the case of image formation conducted out of focus, wherein the amount of focus slippage is 1.0 μm;

FIG. 16(a) is a graph showing the optical intensity distribution in the case of image formation conducted in a focal position (in focus). FIG. 16(b) is a graph showing the optical intensity distribution in the case of image formation conducted out of focus, wherein the amount of focus slippage is 0.2 μm. FIG. 16(c) is a graph showing the optical intensity distribution in the case of image formation conducted out of focus, wherein the amount of focus slippage is 0.4 μm;

FIG. 17(a) is a graph showing the optical intensity distribution in the case of image formation conducted out of focus, wherein the amount of focus slippage is 0.6 μm. FIG. 17(b) is a graph showing the optical intensity distribution in the case of image formation conducted in a position out of focus, wherein an amount of focus slippage is 0.8 μm. FIG. 17(c) is a graph showing the optical intensity distribution in the case of image formation conducted out of focus, wherein the amount of focus slippage is 1.0 μm. FIG. 17(d) is a graph showing the optical intensity distribution in the case of image formation conducted out of focus, wherein the amount of focus slippage is 1.2 μm;

FIG. 19(a) is a graph showing the optical intensity distribution in the case of image formation conducted in a focal position. FIG. 19(b) is a graph showing the optical intensity distribution in the case of image formation conducted out of focus, wherein the amount of focus slippage is 0.2 μm. FIG. 19(c) is a graph showing the optical intensity distribution in the case of image formation conducted out of focus, wherein the amount of focus slippage is 0.4 μm;

FIG. 20(a) is a graph showing the optical intensity distribution in the case of image formation conducted out of focus, wherein the amount of focus slippage is 0.6 μm. FIG.20(b) is a graph showing the optical intensity distribution in the case of image formation conducted out of focus, wherein the amount of focus slippage is 0.8 μm. FIG. 20(c) is a graph showing the optical intensity distribution in the case of image formation conducted out of focus, wherein the amount of focus slippage is 1.0 μm. FIG. 20(d) is a graph showing the optical intensity distribution in the case of image formation conducted out of focus, wherein the amount of focus slippage is 1.2 μm;

FIGS. 39(a) and 39(b) are schematic illustrations of the projection exposure method of the embodiment 8;

FIGS. 43(a) to 43(c) are schematic illustrations of the projection exposure method of the embodiment 11;

FIG. 60 is a schematic illustration showing a profile of an experimental pattern of exposure of the embodiment shown in FIG. 59;

FIGS. 63(a)–63(d) are a set of schematic illustrations for explaining an exposure technique in which the phase difference is utilized;

DETAILED DESCRIPTION OF THE PREFERRED EMBODIMENTS

Referring to FIGS. 1 through 22, the first aspect of the present invention will now be explained in detail with embodiments and comparative examples.

Figure 1:
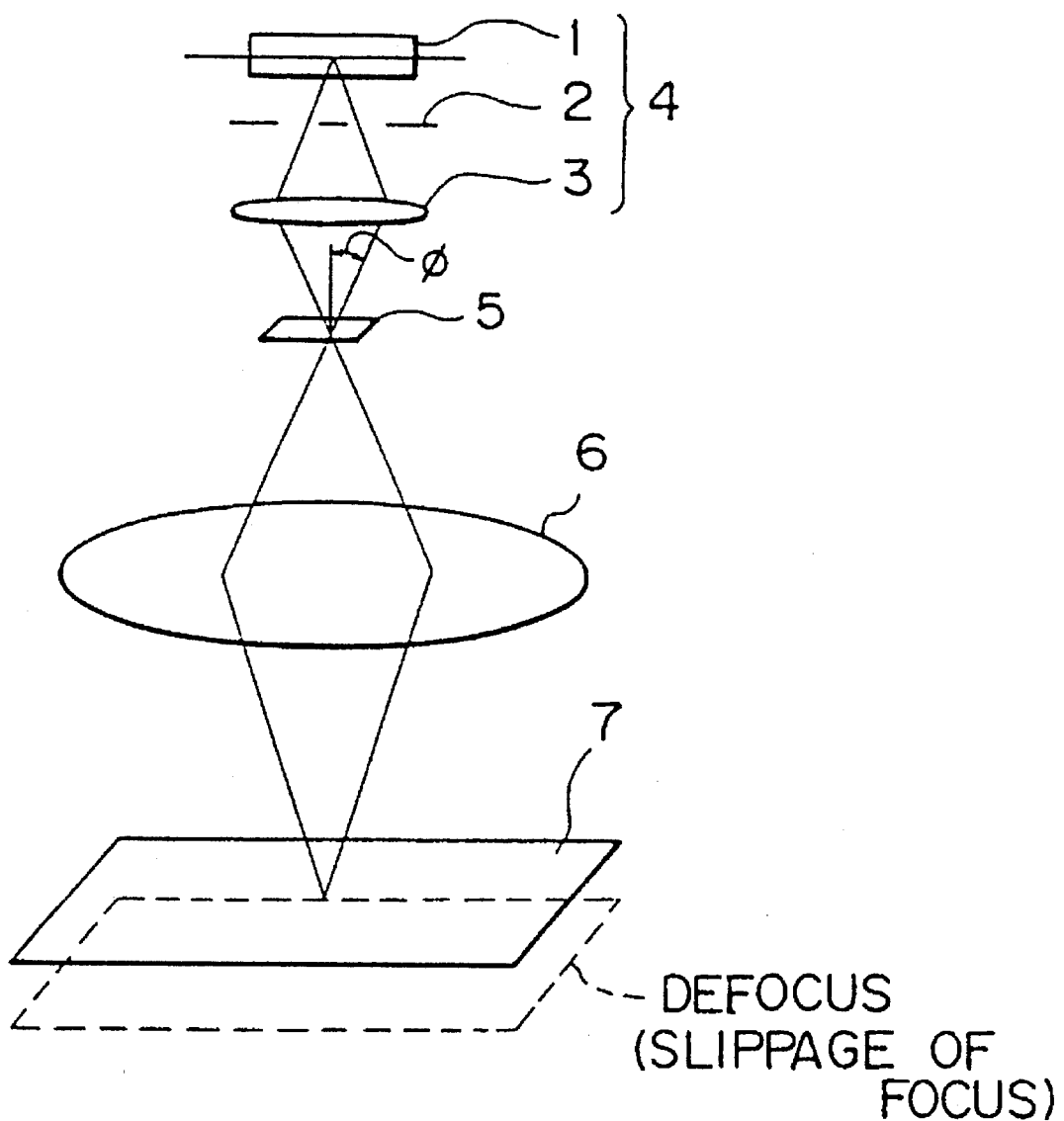
FIG. 1 is a schematic illustration of an exposure device of deformation illumination (oblique incidence illumination)

FIG. 1 is a schematic illustration of an exposure device (stepper). The exposure device comprises: a deformation illumination system 4 including a light source 1 composed of a mercury lamp (excimer laser), a diaphragm 2 provided with a through-hole, and a condenser lens 3; a photomask (reticule) 5 having a predetermined pattern; a projection lens 6; and a register film (projection surface) 7 coated on a base plate. This structure is the same as that of a conventional exposure device, and only a configuration of the through-hole of the diaphragm 2 is different from that of the conventional exposure device. In this connection, a compound eye condenser lens (fly eye lens) may be provided between the light source 1 and the diaphragm 2 in the same manner as the conventional exposure device.

In this embodiment, the configuration of the light source is determined by the configuration of the diaphragm through-hole. However, the individual single eyes may be disposed to be a target configuration of the light source using a fly eye lens. In order to change the light source configuration in accordance with the object of use, in the case where a diaphragm is used, the diaphragm may be replaced with another one having a through-hole of different configuration. Alternatively, the individual single eyes 51a to 51f of the fly eye lens 51 (FIG. 2) may be provided with opening and closing function. For example, a liquid crystal plate 52 is disposed at the exit or entrance of the single eye of the fly eye lens, and voltage is impressed upon an electrode 53 located in a position corresponding to the single eye so that the light can be transmitted or not.

EMBODIMENT 1

Figure 2:
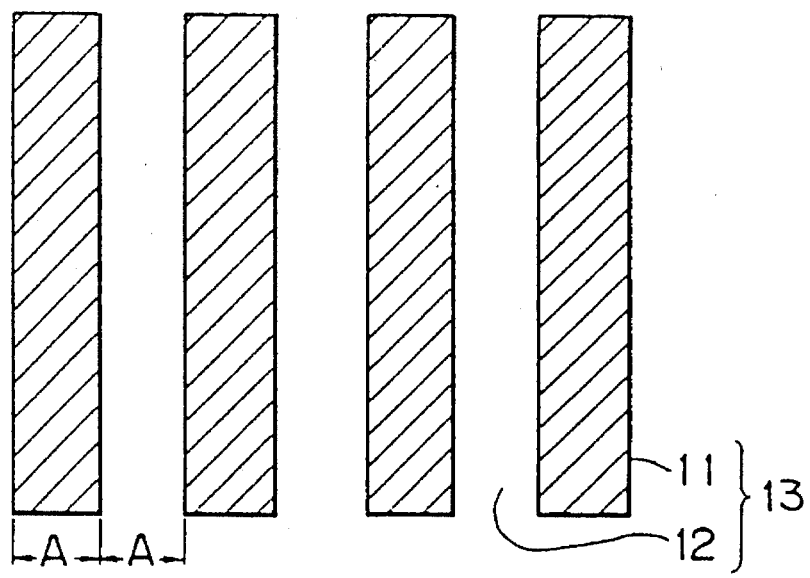
FIG. 2 is a partial plan view of a pattern of line and space.
Figure 3:
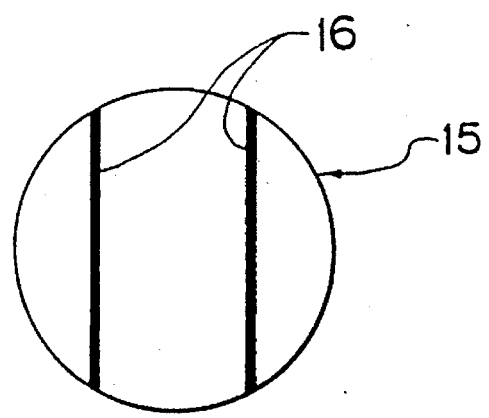
FIG. 3 is a plan view of a diaphragm provided with two linear through-holes.
Figure 6:
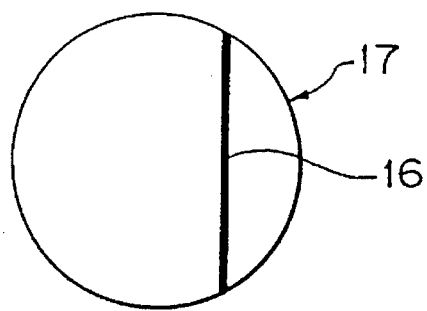
FIG. 6 is a plan view of a diaphragm provided with one linear through-hole.

A line and space pattern 13 composed of opaque stripes 11 and transmitting stripes 12 shown in FIG. 2 is formed on the photomask 5 by a conventional method. The photomask 5 is made when a chrome shading film of this pattern is provided on a quartz glass plate. Pitch A of the line and space corresponds to setting pitch p of the register pattern to be obtained. In order to provide illumination of the present invention, as shown in FIG. 3, two linear through-holes (or light transmission apertures) 16 are formed in the diaphragm 15 in parallel with each other, wherein the two linear through-holes 16 are disposed symmetrically with respect to an optical axis of the exposure device. Consequently, two slits are formed in the shading diaphragm, so that the light emitted from the light source 1 passes through these slits and is incident on the condenser lens 3. In this connection, the diaphragm 15 is disposed so that these linear through-holes 16 can be in parallel with the line and space pattern 13 of the photomask. Then, the photomask 5 is illuminated with light sent from the condenser lens 3, wherein the incident angle of light is $\phi$. In this case, the incident angle is an angle formed between the light and the optical axis of the exposure device in a position on the photomask. Next, the diffraction light of 0 and +1 orders sent from the photomask 5 is projected on the projection lens 6, and the diffraction light is collected by the lens, so that a pattern image is formed on the register film 7 on the projection surface. The pattern 13 of the photomask 5 is projected and exposed on the register film 7 on a base plate of a semiconductor wafer, and then the projected image is developed so as to obtain a register pattern.

In the case where optical exposure was conducted under the following conditions, optical intensity in a direction perpendicular to the line and space pattern is shown in FIGS. 4(a) to 4(d), wherein the projection surface of the register film is located in a focal position of the projection lens or in a position shifted from the focal position (defocus).

| | |
|---|---|
| Wavelength ($\lambda$) of light source | i ray (0.365 μm) |
| Numerical aperture of lens (NA) | 0.5 |
| Coherence factor ($\sigma$) | 0.5 |
| Setting pitch (p) of line and space | 0.35 μm |
| Incident angle ($\phi$) | 31.4° |
| (calculated from $2 \times 0.35 \times \sin \phi = 0.365$) | |

In FIG. 4(a), the optical intensity is shown in the case of image formation conducted in a focal position (in focus). In FIG. 4(b), the optical intensity is shown in the case of image formation conducted out of focus, wherein the amount of defocus is 0.5 μm. In FIG. 4(c), the optical intensity is shown in the case of image formation conducted out of focus, wherein the amount of defocus is 1.0 μm. In FIG. 4(d), the optical intensity is shown in the case of image formation conducted out of focus, wherein the amount of defocus is 1.5 μm. As can be seen in FIGS. 4(a) to 4(d), the profiles of optical intensity are approximately the same, and the focal depth is large.

As a comparative example, optical exposure was conducted with the same optical exposure device using a conventional circular diaphragm ($\sigma$=0.5). The optical intensity on the projection surface on the register film in the focal and non-focal positions are shown in FIGS. 5(a) to (d).

In FIG. 5(a), the optical intensity is shown in the case of image formation conducted in a focal position (in focus). In FIG. 5(b), the optical intensity is shown in the case of image formation conducted out of focus, wherein the amount of focus slippage is 0.5 μm. In FIG. 5(c), the optical intensity is shown in the case of image formation conducted out of focus, wherein the amount of focus slippage is 1.0 μm. In FIG. 5(d), the optical intensity is shown in the case of image formation conducted out of focus, wherein the amount of focus slippage is 1.5 μm. As can be seen in FIGS. 5(a) to 5(d), concerning the profile of optical intensity, the larger the amount of focal slippage is, the smaller the contrast of optical intensity becomes, so that the resolution is deteriorated. Naturally, the focal depth is smaller than that of the device of the present invention.

EMBODIMENT 2

In the above-mentioned embodiment, the optical exposure device and the photomask 5 of embodiment 1 were used. In the embodiment 2, the diaphragm was replaced with a diaphragm 17 shown in FIG. 6, wherein the number of the linear through-holes 16 was one. The diaphragm 17 was disposed so that the linear through-hole 16 could be parallel with the pattern 13 of the line and space of the photomask. In this case, the light emitted from the light source 1 passed through the linear through-hole 16, and was incident on the condenser lens 3, so that the photomask 5 was illuminated with the light, the incident angle of which was 6. Next, the diffraction light of 0 and +1 orders sent from the photomask 5 was projected on the projection lens 6, and the diffraction light was collected by the lens, so that a pattern image was formed on the register film 7 on the projection surface. The pattern 13 of the photomask 5 was projected and exposed on the register film 7, and then the projected image was developed so as to obtain a register pattern. In the case of embodiment 1, the photomask was illuminated with light from both the right and left, however, in the case of embodiment 2, the photomask was illuminated with light in one direction. Therefore, as compared with the results of embodiment 1, the pattern profile was more deteriorated by the slippage of focus. However, as compared with the aforementioned comparative example, the focal depth was large and resolution was high.

EMBODIMENT 3

Figure 7:
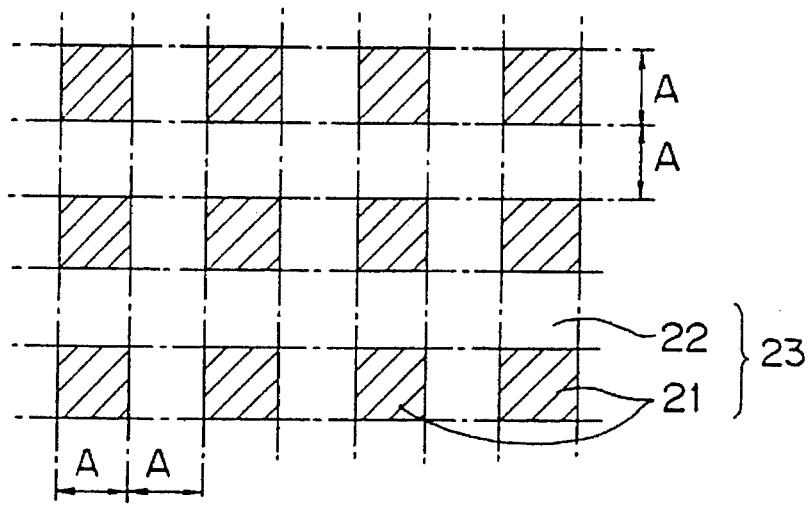
FIG. 7 is a partial plan view of a combination pattern in which a pair of patterns are combined, wherein the patterns make a right angle with each other.
Figure 8:
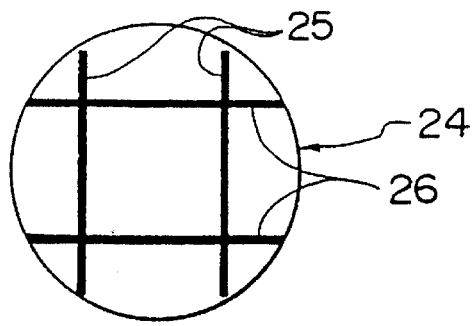
FIG. 8 is a plan view of a diaphragm provided with two pairs of parallel linear through-holes, wherein the pairs of parallel linear through-holes make a right angle with each other.

A pattern 23 was formed on the photomask 5 by a well known method as shown in FIG. 7, wherein the pattern 23 was composed of a square shading region 21 in which squares were cyclically disposed at regular intervals, and a through-hole region 22 surrounding the square shading region 21. In this pattern 23, the line and space pattern shown in FIG. 2 and the same line and space pattern disposed perpendicular to it are combined. Pitch A of the line and space (the interval of the width of the shading region 21) corresponds to setting pitch p of the line and space of the register pattern to be obtained. In order to provide illumination of the present invention, as shown in FIG. 8, two linear through-holes 25, which are the same as those of embodiment 1, are formed in the diaphragm 24 in parallel with each other, wherein the two linear through-holes 25 are disposed symmetrically With respect to an optical axis of the optical exposure device. Moreover, two linear through-holes 26 perpendicular to these linear through-holes 25 are disposed in parallel with each other symmetrically with the optical axis. The two linear through-holes 25 compose the first linear light, and another pair of linear through-holes 26 compose the second linear light, and these two pairs of through-holes 25 and 26 are disposed in the same position when one of them is rotated around the optical axis by angle 90°. Accordingly, four slits are formed in the shading diaphragm, and the light emitted from the light source 1 passes through these slits and is incident on the condenser lens 3. In this connection, the diaphragm 24 is disposed so that these linear through-holes 25 and 26 can be in parallel with the line and space pattern 23 of the photomask. Then, the photomask 5 is illuminated with light sent from the condenser lens 3, wherein the incident angle of light is $\phi$. In this case, the incident angle is an angle formed between the light and the optical axis of the exposure device in a position on the photomask. Next, the diffraction light of 0 and +1 orders sent from the photomask 5 is projected on the projection lens 6, and the diffraction light is collected by the lens, so that a pattern image is formed on the register film 7 on the projections surface. The pattern 23 of the photomask 5 is projected and exposed on the register film 7 on a base plate of a semiconductor wafer, and then the projected image is developed so as to obtain a register pattern.

An exposure simulation was carried out with the exposure device of embodiment 1 under the following conditions, wherein the projection surface of the register film was disposed in a focal position of the projection lens and also disposed in a position out of focus. The three dimensional optical intensity distribution is shown in FIGS. 9(a) to 9(f) illustrated with equal intensity lines.

| | |
|---|---|
| Wavelength ($\lambda$) of light source | i ray (0.365 µm) |
| Numerical aperture of lens (NA) | 0.5 |
| Coherence factor ($\sigma$) | 0.5 |
| Setting pitch (p) of line and space | 0.35 µm |
| Incident angle ($\phi$) | 31.4° |
| (calculated from $2 \times 0.35 \times \sin \phi = 0.365$) | |

Figure 9A:
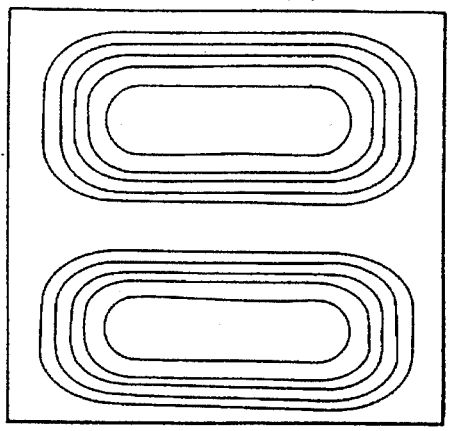
FIGS. 9(a)–9(f) are a set of graphs showing three dimensional optical intensity distributions on the projection surface in accordance with the pattern of FIG. 7 when the diaphragm of FIG. 8 is used.
Figure 9B:
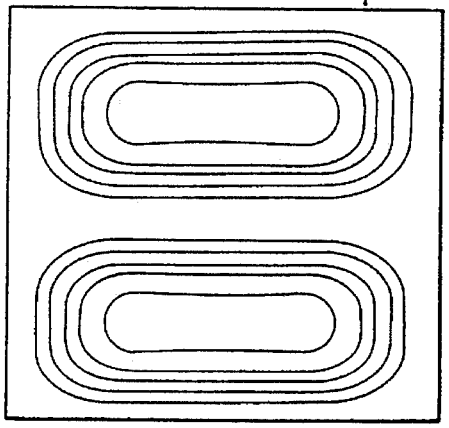
Figure 9C:
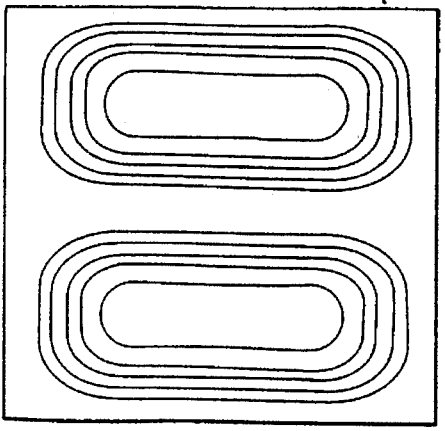
Figure 9D:
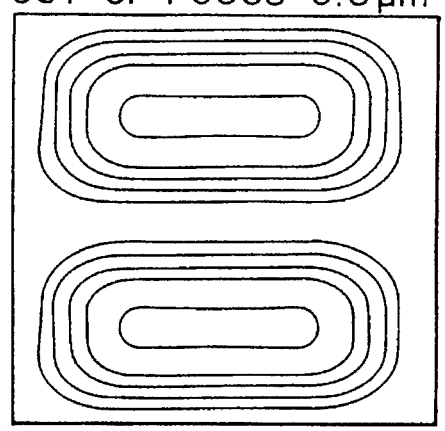
Figure 9E:
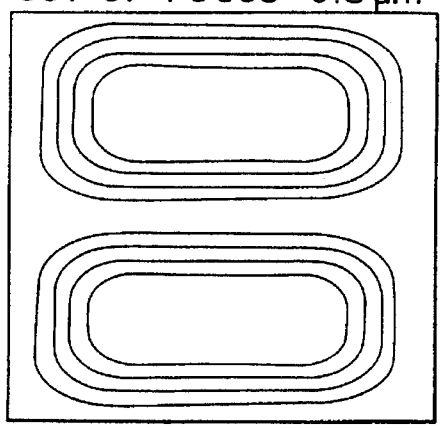
Figure 9F:
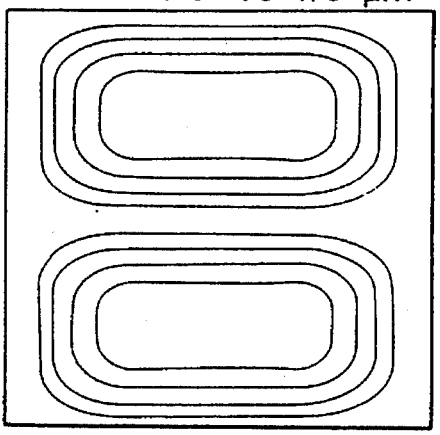

In FIG. 9(a), the optical intensity distribution is shown in the case of image formation conducted in a focal position (in focus). In FIG. 9(b), the optical intensity distribution is shown in the case of image formation conducted out of focus, wherein thee amount of focus slippage is 0.2 µm. In FIG. 9(c), the optical intensity distribution is shown in the case of image formation conducted out of focus, wherein the amount of focus slippage is 0.4 µm. In FIG. 9(d), the optical intensity distribution is shown in the case of image formation conducted out of focus, wherein the amount of focus slippage is 0.6 µm. In FIG. 9(e), the optical intensity distribution is shown in the case of image formation conducted in a position out of focus, wherein an amount of focus slippage is 0.8 µm. In FIG. 9(f), the optical intensity distribution is shown in the case of image formation conducted out of focus, wherein the amount of focus slippage is 1.0 µm. As can be seen in FIGS. 9(a) to (f), the profiles of optical intensity distributions are approximately the same, and the focal depth is large.

As a comparative example, exposure was conducted with the same exposure device using a conventional circular diaphragm ($\sigma=0.5$). The optical intensity distribution on the projection surface on the register film in the focal and non-focal positions are shown in FIGS. 10(a) to (f).

Figure 10A:
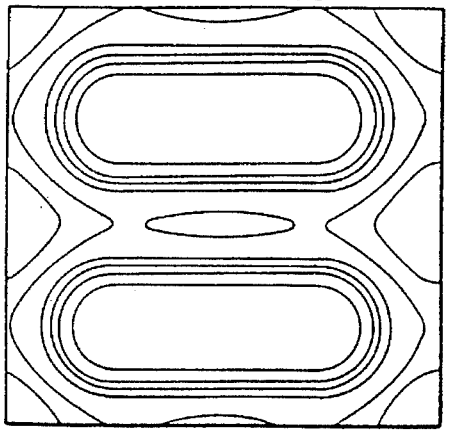
FIGS. 10(a)–10(f) are a set of graphs showing three dimensional optical intensity distributions on the projection surface in accordance with the pattern of FIG. 7 when a conventional circular diaphragm is used.
Figure 10D:
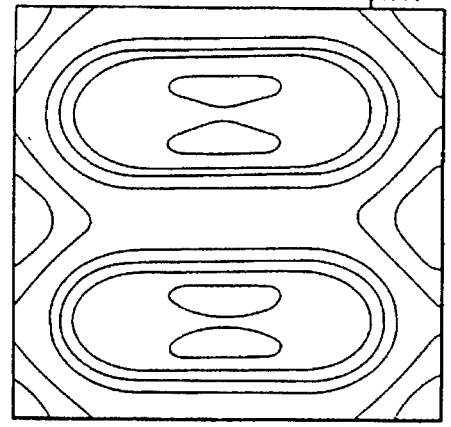
Figure 10B:
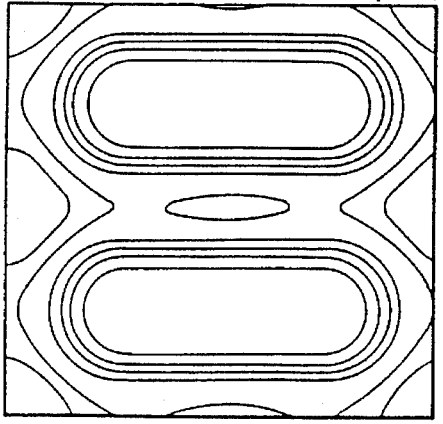
Figure 10E:
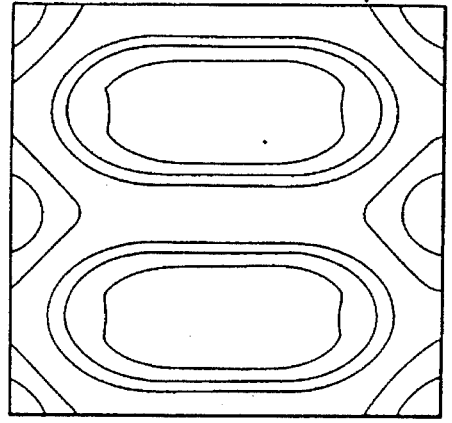
Figure 10C:
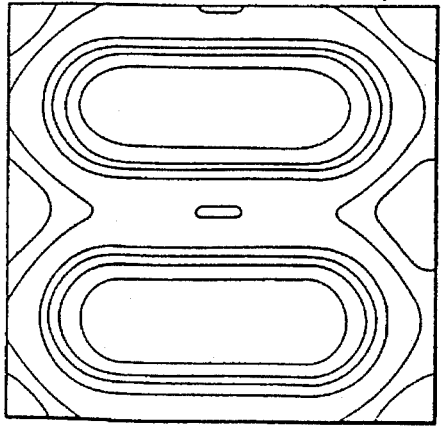
Figure 10F:
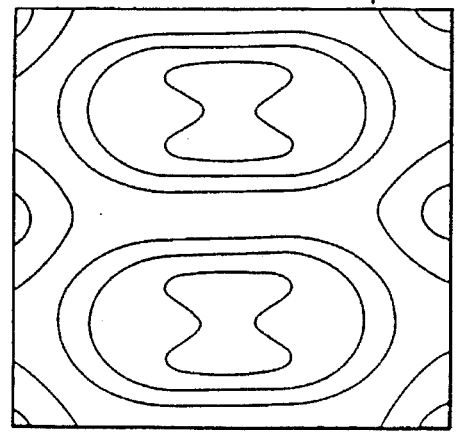

In FIG. 10(a), the optical intensity distribution is shown in the case of image formation conducted in a focal position (in focus). In FIG. 10(b), the optical intensity distribution is shown in the case of image formation conducted out of focus, wherein the amount of focus slippage is 0.2 µm. In FIG. 10(c), the optical intensity distribution is shown in the case of image formation conducted out of focus, wherein the amount of focus slippage is 0.4 µm. In FIG. 10(d), the optical intensity distribution is shown in the case of image formation conducted out of focus, wherein the amount of focus slippage is 0.6 µm. In FIG. 10(e), the optical intensity distribution is shown in the case of image formation conducted out of focus, wherein the amount of focus slippage is 0.8 µm. In FIG. 10(f), the optical intensity distribution is shown an the case of image formation conducted out of focus, wherein the amount of focus slippage is 1.0 µm. As can be seen in FIGS. 10(a) to 10(f), the more the focus slippage is increased, the more gentle the difference of optical intensity distribution becomes, and the distribution spreads to the non-exposure portion, so that the contrast of optical intensity distribution is reduced and the resolution is deteriorated. Naturally, the focal depth is smaller than that of the device of the present invention.

EMBODIMENT 4

Figure 11:
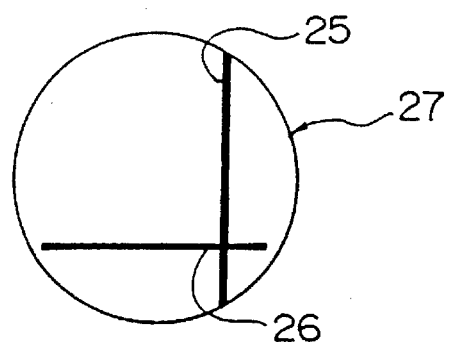
FIG. 11 is a plan view of a diaphragm provided with linear through-holes making a right angle with each other.

In this embodiment, the optical exposure device and the photomask 5 of embodiment 3 were used, but the diaphragm was replaced with a diaphragm 27 shown in FIG. 11, wherein the number of the linear through-holes 25 and 26 was two. The diaphragm 27 was disposed so that the linear through-holes 25 and 26, which made a right angle with each other, could be disposed in parallel with the pattern 23 of the square shading region 21 on the photomask in which squares were cyclically disposed at regular intervals. In this case, the light emitted from the light source 1 passed through the linear through-holes 25 and 26, and was incident on the condenser lens 3, so that the photomask 5 was illuminated with the light, the incident angle of which was $\phi$. Next, the diffraction light of 0 and +1 orders sent from the photomask 5 is projected on the projection lens 6, and the diffraction light is collected by the lens, so that a pattern image is formed on the register film 7 on the projection surface. The pattern 13 of the photomask 5 is projected and exposed on the register film 7, and then the projected image is developed so as to obtain a register pattern. In the case of embodiment 3, the photomask was illuminated with light from both the right and left, however, in the case of embodiment 4, the photomask was illuminated with light in one direction. Therefore, as compared with the results of embodiment 3, the pattern profile was more deteriorated by the slippage of focus. However, as compared with the aforementioned comparative example, the focal depth is large and the resolution is high.

In embodiments 1 to 4, a ray of light passes through a linear through-hole in which the width of the slit is selected from 5 to 10 mm. Therefore, when the slit is too narrow, an amount of light (that is, $\sigma$) is reduced so that the exposure time is extended. When the slit is too wide, noise components pass through the slit, so that sufficient effect cannot be provided. Preferably, the slit is 5 to 10 mm wide.

EMBODIMENT 5

Figure 12:
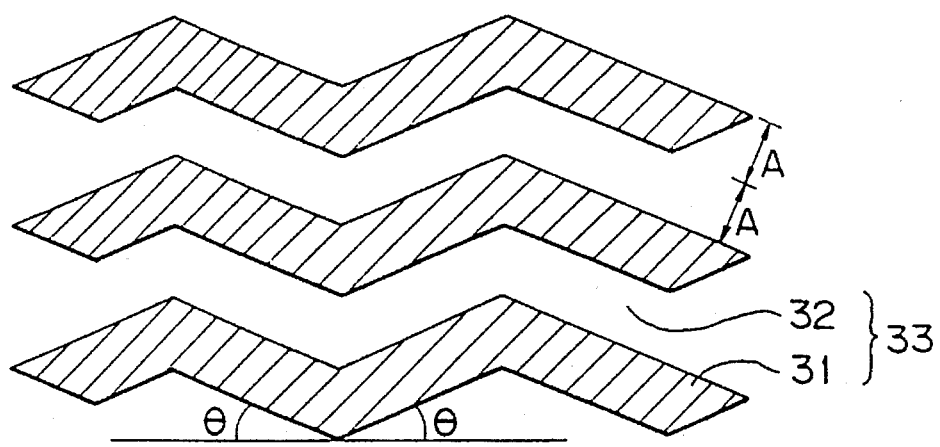
FIG. 12 is a partial plan view of a triangular wave line and space pattern.
Figure 13:
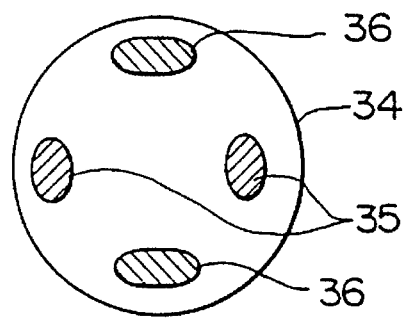
FIG. 13 is a plan view of a diaphragm provided with two pairs block through-holes, wherein each pair includes two block through-holes separate from an optical axis.

A pattern 33 of line and space composed of shading stripes 31, the bottom angle of which is $\theta$ as shown in FIG. 12, and also composed of through-hole stripes 32, is formed on the photomask 5 by a well known method. Pitch A of the line and space corresponds to setting pitch p of the line and space of a register pattern to be obtained. In order to provide illumination of the present invention, as shown in FIG. 13, the first block through-holes 35 of the same configuration as the diaphragm 34, the number of which is two, are formed in a position separate from the optical axis of the exposure device, wherein the first block through-holes 35 are disposed in parallel with the longitudinal direction of the stripe symmetrically with respect to the optical axis. Moreover, the second block through-holes 36 of the same configuration, the number of which is two, are formed in a position separate from the optical axis of the exposure device, wherein the second block through-holes 36 are disposed in parallel with the longitudinal direction of the stripe symmetrically with respect to the optical axis (that is, four through-holes are provided in total). The two block through-holes 35 compose the first block of light, and another pair of block through-holes 36 compose the second block of light. The areas of these through-holes are set so that a ratio of the illumination area of the first block light to that of the second block light can be sin $\theta$:cos $\theta$. The configuration of each block through-hole is either rectangular, circular, oval, lozenge-shaped or triangular, and the necessary through-hole area must be ensured. Accordingly, four through-holes are formed in the shading diaphragm, and a ray of light emitted from the light source 1 passes through these through-holes, and is incident on the condenser lens 3. Illumination is conducted on the photomask 5 by the light passing through the condenser lens 3, wherein the incident angle of the block through-hole 35 is $\phi_x$, and the incident angle of the block through-hole 35 is $\phi_y$. In this case, these incident angles are defined as an angle formed between the ray of light and the optical axis of the optical exposure device. Concerning incident angle $\phi_x$, an equation 2p·sin $\phi_x = \lambda$ sin $\theta$ is satisfied (where p is a setting pitch of the line and space pattern, and $\lambda$ is a wavelength of light.) Concerning incident angle $\phi_y$, an equation 2p·sin $\phi_y = \lambda$ cos $\theta$ is satisfied. Next, the diffraction light of 0 and +1 orders sent from the photomask 5 is projected on the projection lens 6, and the diffraction light is collected by the lens, so that a pattern image is formed on the register film 7 on the projection surface. The pattern 33 of the photomask 5 is projected and exposed on the register film 7 on a base plate of a semiconductor wafer, and then the projected image is developed so as to obtain a register pattern.

Figure 14:
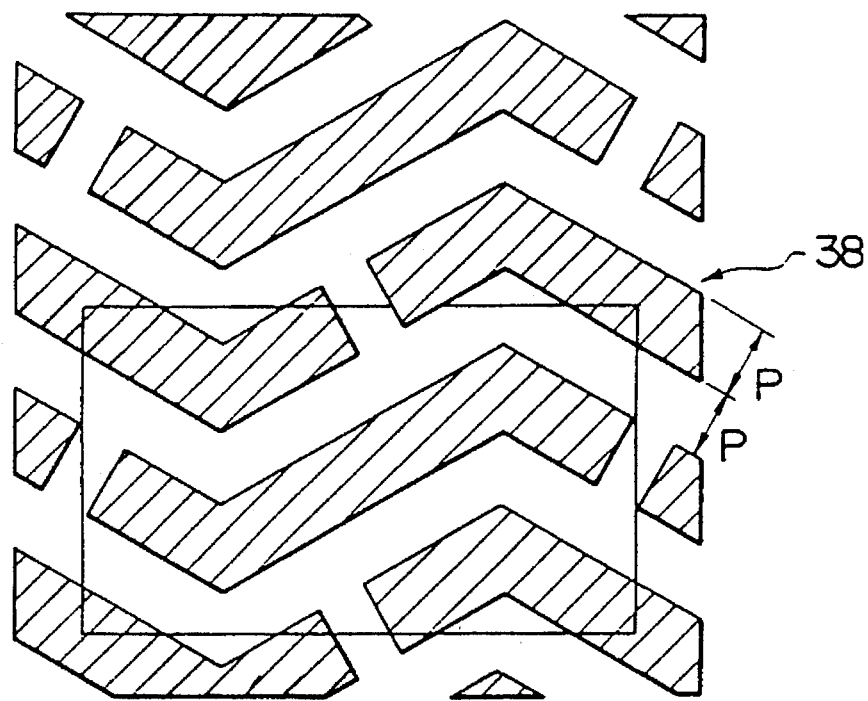
FIG. 14 is a partial plan view of a triangular wave line and space pattern utilized in a DRAM activation region.
Figure 15:
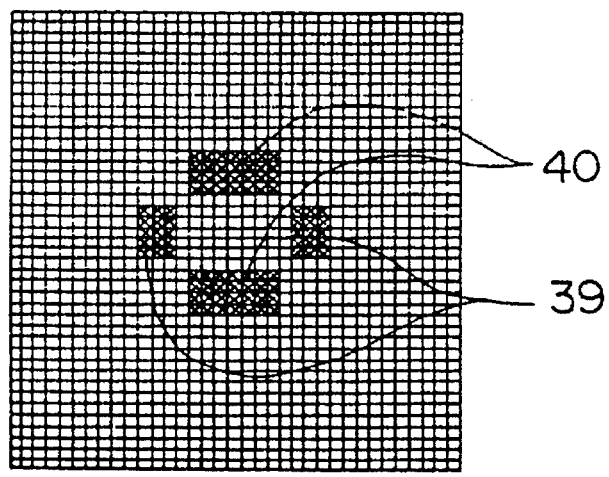
FIG. 15 is a plan view of a diaphragm provided with two pairs rectangular through-holes, wherein each pair includes two rectangular through-holes separate from an optical axis.

In the case of a triangular wave stripe-shaped pattern 38 utilized in a DRAM activation region shown in FIG. 14, the photomask block through-holes 39 and 40 shown in FIG. 15 are adopted, and then optical exposure simulation is carried out under the following conditions. The projection surface is set at e focal position and at a position out of focus. In this way, three dimensional optical intensity distributions expressed by equal intensity lines are provided that are shown in FIGS. 16(a) to 16(c) and FIGS. 17(a) to 17(d).

The conditions of the triangular wave stripe-shaped pattern 38 are as follows.

| | |
|---|---|
| Setting pitch (p) of line and space | 0.35 μm |
| Botom angle (θ) of triangular wave stripe | i ray (0.365 μm) |
| Numerical aperture of lens (NA) | 0.5 |
| Coherence factor (σ) | 0.5 |
| Incident angle ($\phi_x$) of block through-hole 39 | 74.8° |
| Incident angle ($\phi_y$) of block through-hole 40 | 26.8° |
| Ratio of the area of block through-hole 39 and that of block-through hole 39 | 0.5:0.866 |

Figure 16A:
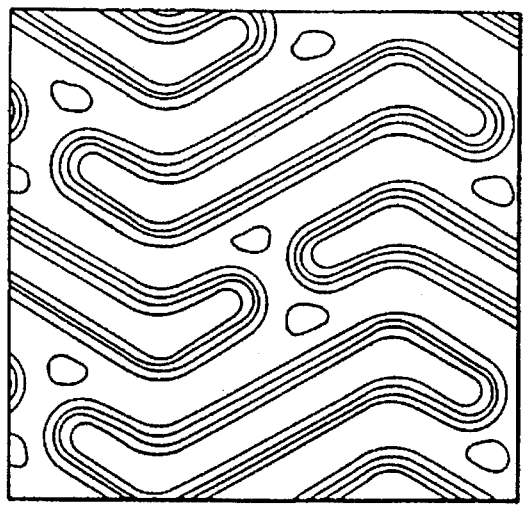
FIGS. 16(a)–16(c) are a set of graphs showing three dimensional optical intensity distributions on a projection surface in accordance with the pattern of FIG. 14 when the diaphragm of FIGS. 15 is utilized.
Figure 16B:
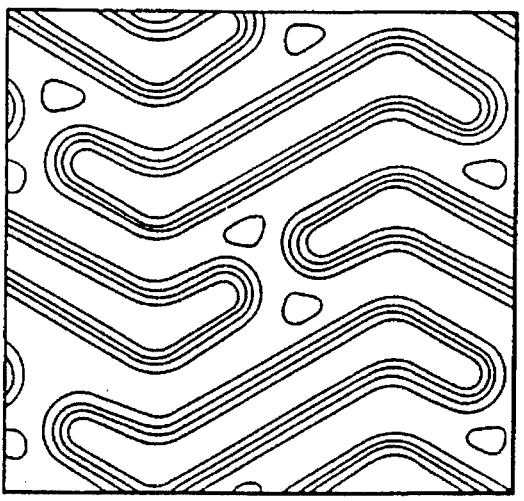
Figure 16C:
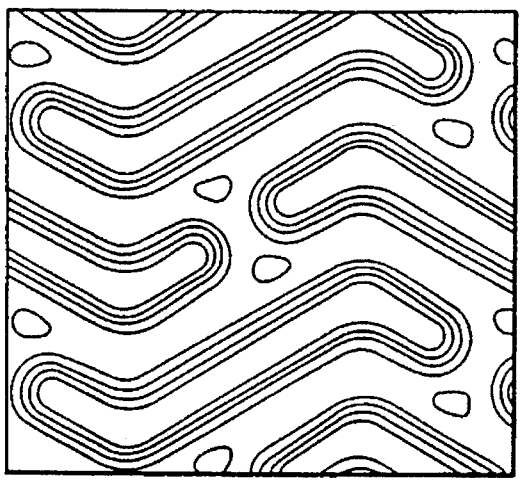
Figure 17A:
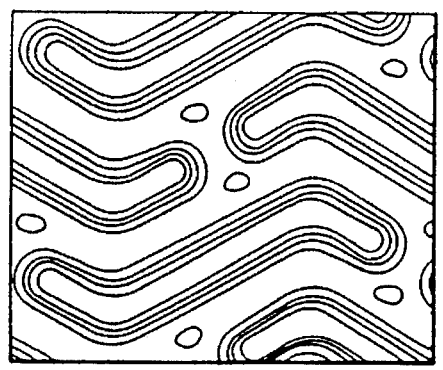
FIGS. 17(a)–17(d) are a set of graphs showing three dimensional optical intensity distributions on a projection surface in accordance with the pattern of FIG. 14 when the diaphragm of FIG. 15 is used.
Figure 17B:
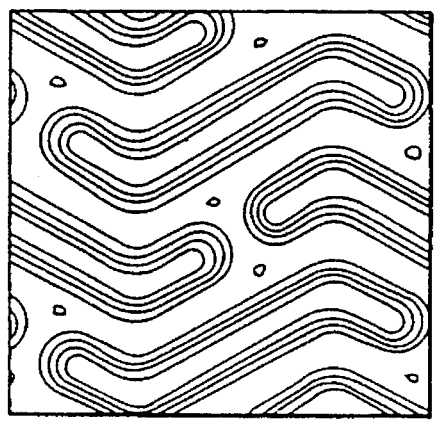
Figure 17C:
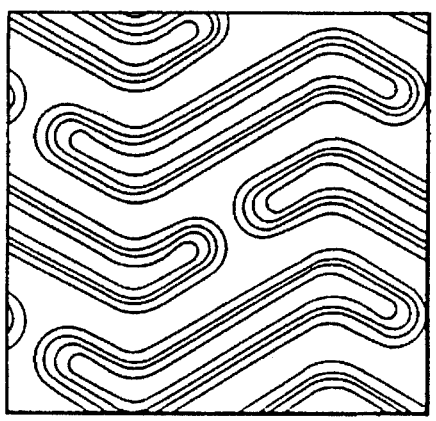
Figure 17D:
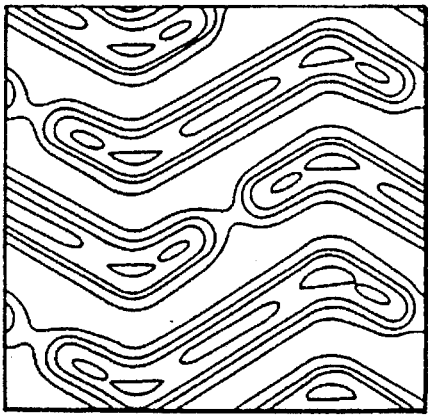

In FIG. 16(a), the optical intensity distribution is shown in the case of image formation conducted in a focal position (in focus). In FIG. 16(b), the optical intensity distribution is shown in the case of image formation conducted out of focus wherein the amount of focus slippage is 0.2 μm. In FIG. 16(c), the optical intensity distribution is shown in the case of image formation conducted out of focus wherein the amount of out of focus is 0.4 μm. In FIG. 17(a), the optical intensity distribution is shown in the case of image formation conducted out of focus, wherein the amount of focus slippage is 0.6 μm. In FIG. 17(b), the optical intensity distribution is shown in the case of image formation conducted in a position out of focus, wherein an amount of focus slippage is 0.8 μm. In FIG. 17(c), the optical intensity distribution is shown in the case of image formation conducted out of focus, wherein the amount of focus slippage is 1.0 μm. In FIG. 17(d), the optical intensity distribution as shown in the case of image formation conducted out of focus, wherein the amount of focus slippage is 1.2 μm. As can be seen in FIGS. 16 and 17, the profiles of optical intensity distributions are approximately the same when the focal slippage is not more than 1.0 μm, and the focal depth is large.

Figure 18:
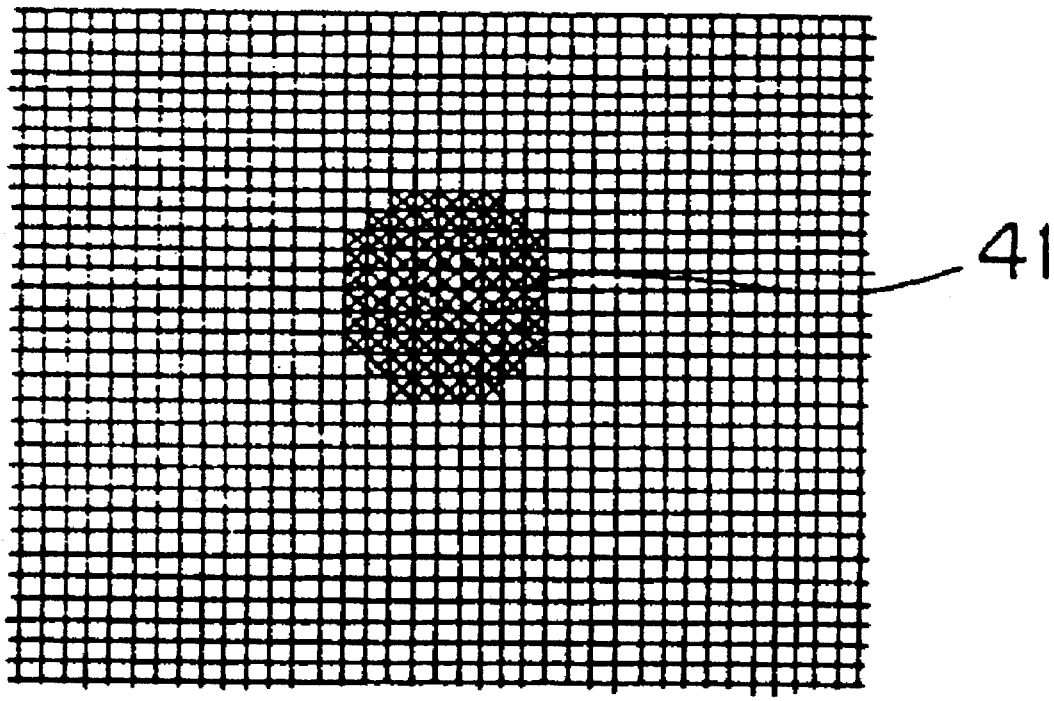
FIG. 18 is a plan view of a diaphragm provided with a through-hole corresponding to a conventional circular hole.

As a comparative example, optical exposure was conducted with the same optical exposure device using a conventional circular diaphragm (σ=0.5) provided with a conventional circular hole 41 shown in FIG. 18. The optical intensity distribution on the projection surface in the focal and non-focal positions are shown in FIGS. 19(a) to 19(c) and in FIGS. 20(a) to 20(d).

Figure 19A:
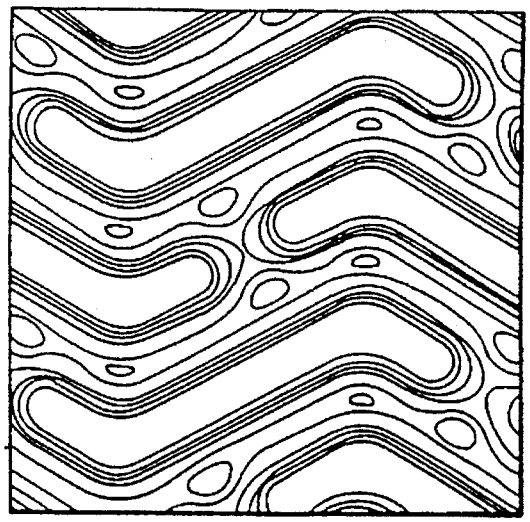
FIGS. 19(a)–19(c) are a set of graphs showing three dimensional optical intensity distributions on a projection surface in accordance with the pattern of FIG. 14 when the conventional diaphragm of FIG. 19 is used.
Figure 19B:
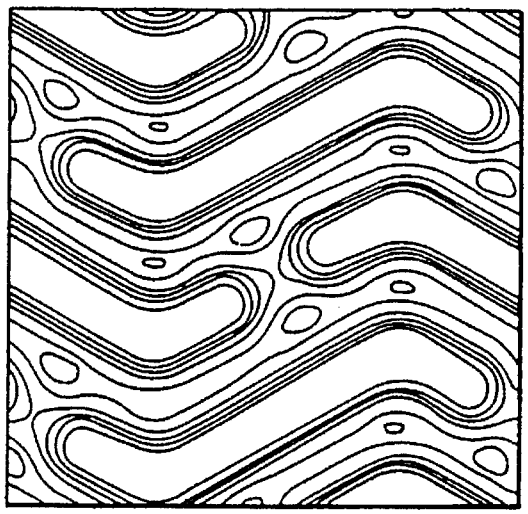
Figure 19C:
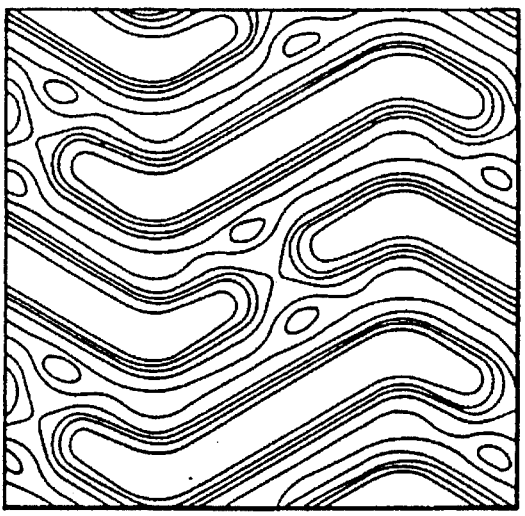
Figure 20A:
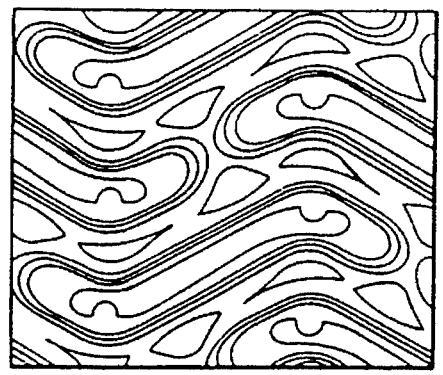
FIGS. 20(a)–20(d) are a set of graphs showing three dimensional optical intensity distributions on a projection surface in accordance with the pattern of FIG. 14 when the conventional diaphragm of FIG. 19 is used.
Figure 20B:
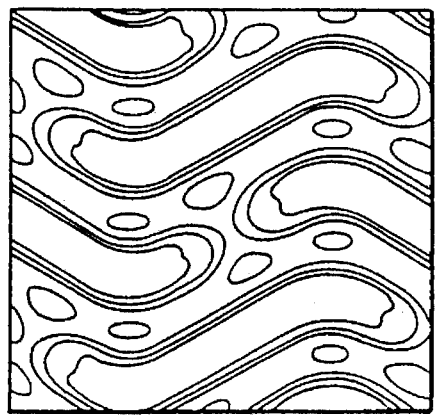
Figure 20C:
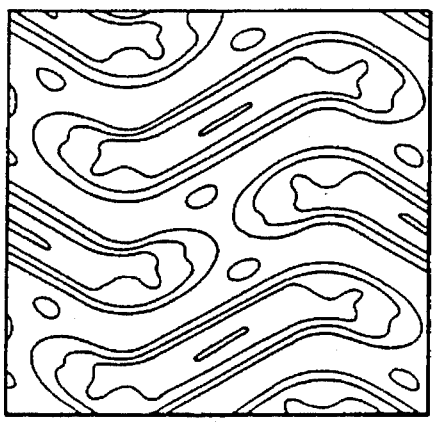
Figure 20D:
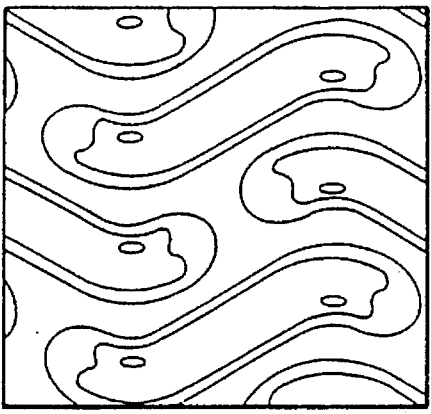
Figure 21:
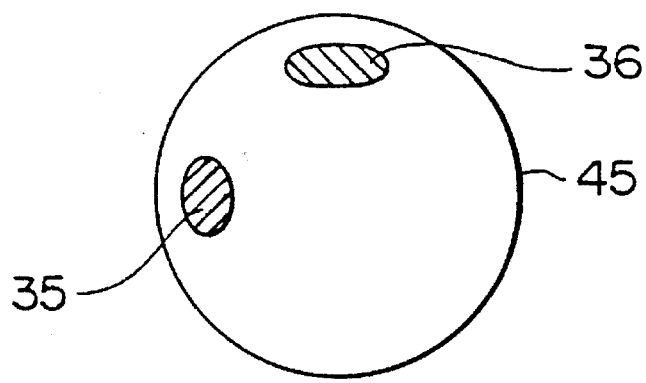
FIG. 21 is a plan view showing a diaphragm provided with two sets of block through-holes separate from an optical axis.
Figure 22:
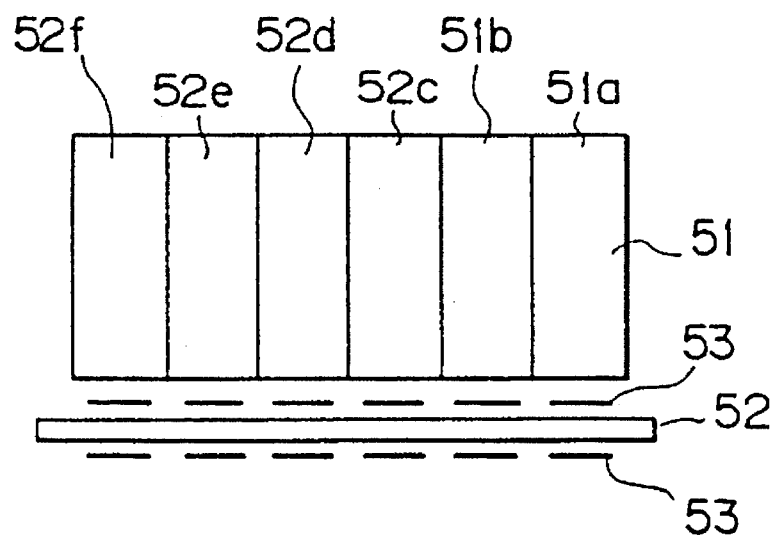
FIG. 22 is a sectional view schematic of a fly-eye lens and a liquid crystal plate diaphragm.

In FIG. 19(a), the optical intensity distribution is shown in the case of image formation conducted in a focal position (in focus). In FIG. 19(b), the optical intensity distribution is shown in the case of image formation conducted out of focus, wherein the amount of focus slippage is 0.2 μm. In FIG. 19(c), the optical intensity distribution is shown in the case of image formation conducted out of focus, wherein the amount of focus slippage is 0.4 μm. In FIG. 20(a), the optical intensity distribution is shown in the case of image formation conducted out of focus, wherein the amount of focus slippage is 0.6 μm. In FIG. 20(b), the optical intensity distribution is shown in the case of image formation conducted out of focus, wherein the amount of focus slippage is 0.8 μm. In FIG. 20(c), the optical intensity distribution is shown in the case of image formation conducted out of focus, wherein the amount of focus slippage is 1.0 μm. In FIG. 20(d), the optical intensity distribution is shown in the case of image formation conducted out of focus, wherein the amount of focus slippage is 1.2 μm. As can be seen in FIGS. 19 and 20, the more the focus slippage is increased, the more gentle the difference of optical intensity distribution becomes, and the distribution spreads to the non-exposure portion, so that the contrast of optical intensity distribution is reduced and the resolution is deteriorated. Naturally, the focal depth is smaller than that of the device of the present invention.

EMBODIMENT 6

In this embodiment, the optical exposure device and photomask 5 of embodiment 5 are used, but the diaphragm is replaced with a diaphragm 45 provided with block through-holes 35 and 36, each number of which is respectively one. The diaphragm 45 is disposed so that the block through-hole 35 can be parallel with the bottom surface of the triangular wave of the triangular wave stripe, and so that the block through-hole 36 can make a right angle with the bottom surface of the triangular wave. In this case, the light emitted from the light source 1 passes through the block through-holes 35 and 36, and is incident on the condenser lens 3, so that the photomask 5 is illuminated with the light, the incident angle of which is $\phi_x$ and $\phi_y$. Next, the diffraction light of 0 and +1 orders sent from the photomask 5 is projected on the projection lens 6 and then the diffraction light is collected by the lens, so that a pattern image is formed on the register film 7 on the projection surface. The pattern 33 of the photomask 5 is projected and exposed on the register film 7 and then the projected image is developed so as to obtain a register pattern. In the case of embodiment 5, the photomask was illuminated with light from both the right and left, however, in the case of embodiment 6, the photomask was illuminated with light in one direction. Therefore, as compared with the results of embodiment 5, the pattern profile was more deteriorated by the slippage of focus. However, as compared with the aforementioned comparative example, the focal depth is large and resolution is high.

As explained above, according to the optical exposure method of the above-mentioned embodiments 1–6, the optimal deformation illumination system (configuration of the light source) is adopted in accordance with a pattern to be obtained, and the advantages of oblique incidence (improvements in focal depth and resolution) can be effectively utilized, so that the present invention contributes to improve precise lithographic technology.

Referring now to FIGS. 23 through 34, the second aspect of the present invention will now be explained in detail with reference to a prior art and the embodiment 7.

EMBODIMENT 7

Figure 23:
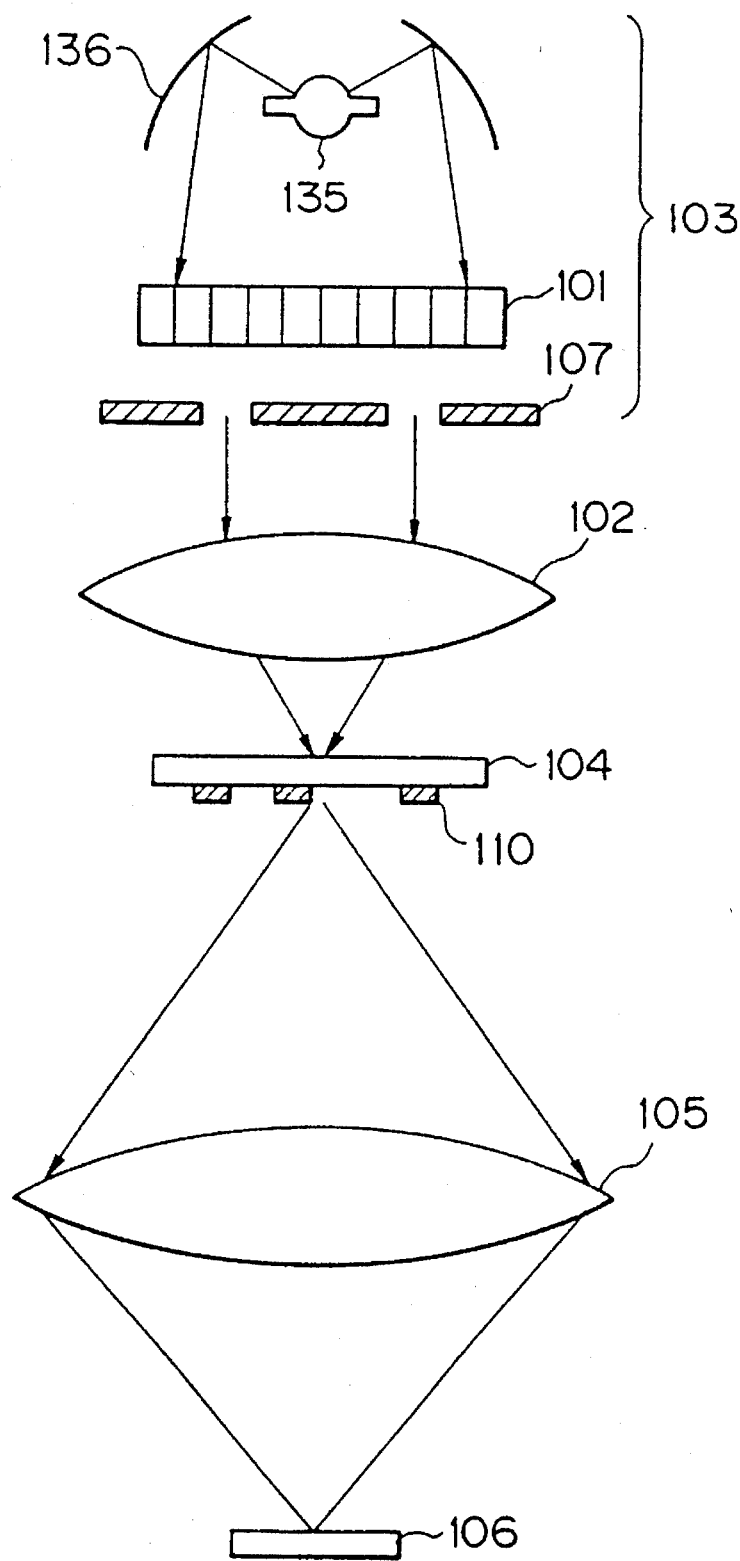
FIG. 23 is a schematic illustration of an optical projection exposure device of deformation illumination system.
Figure 24:
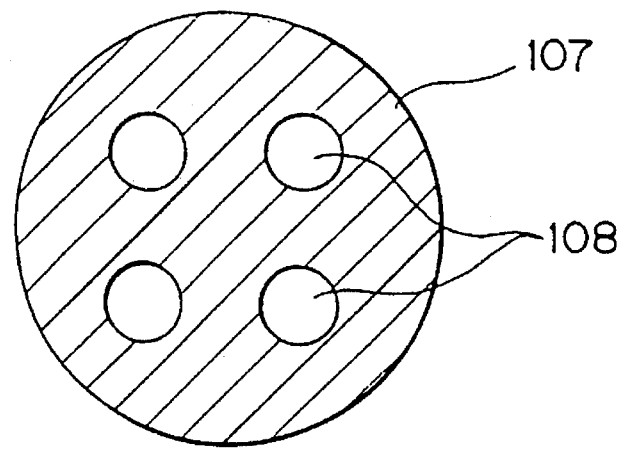
FIG. 24 is a plan view of a deformation illumination diaphragm provided with 4 holes.

In FIG. 23, an optical projection exposure device of deformation illumination known in the prior art comprises: an illumination system 103 including a light source 135, condenser 136, fly eye lens 101 and illumination lens 102; a photomask 104 provided with a predetermined pattern 110; a projection lens 105; and a base plate 106 provided with a register layer, wherein, for example, a diaphragm (referred to as a deformation illumination diaphragm, hereinafter) 107 is disposed between the light source 136 and the photomask 104, and the center of the diaphragm is shaded and through-holes are provided in the positions separate from the optical axis. The deformation illumination diaphragm 107 is disposed between the light source and the lens 102. As a configuration of the hole formed in the deformation illumination diaphragm (aperture) 107, zonal holes or four holes 108 (shown in FIG. 24) symmetrical with respect to a point are conventionally known.

Figure 25:
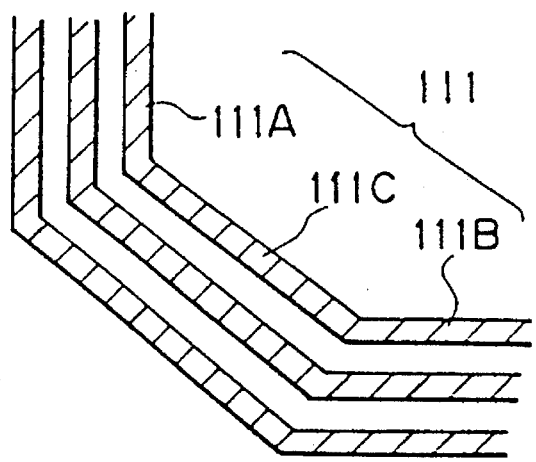
FIG. 25 is a partial plan view of a line pattern of a photomask.
Figure 26:
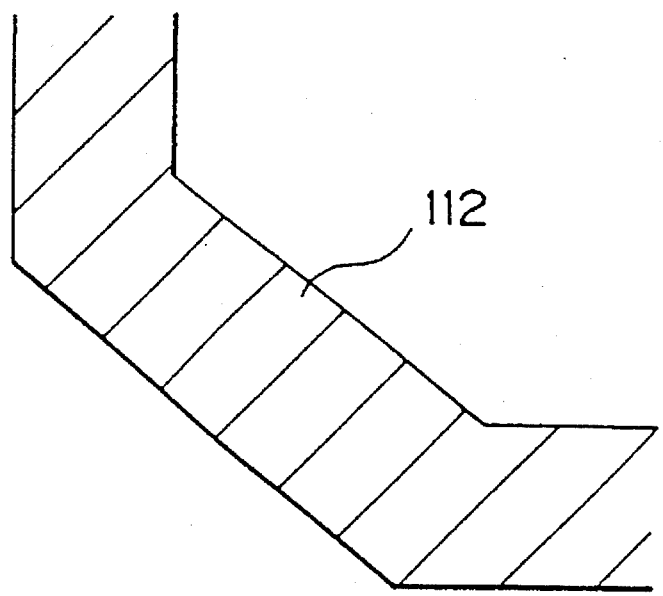
FIG. 26 is a partial plan view of a register line pattern provided by a conventional optical projection exposure device.
Figure 27:
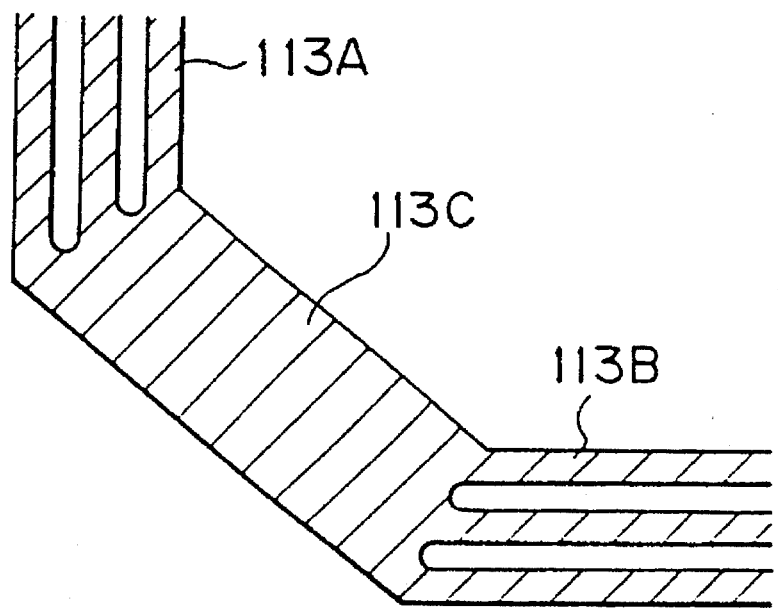
FIG. 27 is a partial plan view of a register line pattern in the deformation illumination system.
Figure 28:
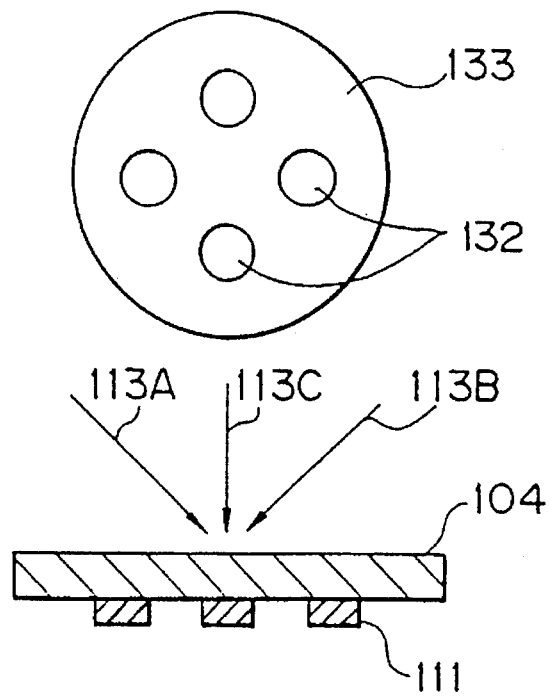
FIG. 28 is a schematic illustration showing a relation between a photomask and a diaphragm in the case of incident light of three directions in the deformation illumination system.
Figure 32:
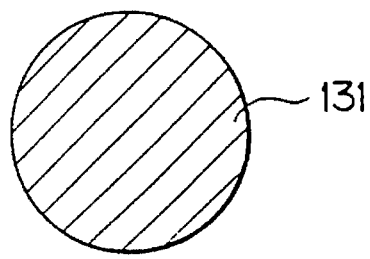
FIG. 32 is a plan view showing a configuration of common illumination.
Figure 33:
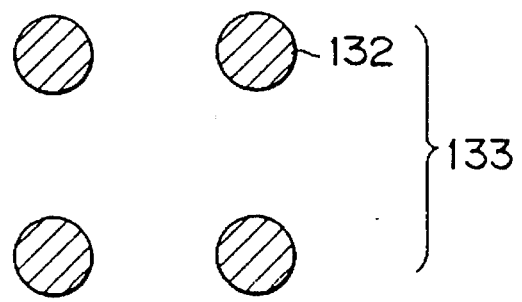
FIG. 33 is a plan view showing a configuration of division illumination.

In the case where a pattern of the photomask 103 is formed, for example, in the case where a pattern shown in FIG. 25 is formed in which a horizontal portion 111A, vertical portion 111B and oblique portion 111C are included and in which the line and space is made minute so as to be a value about 0.3 μm, the resolution can not be improved (the resolution is low) and the aforementioned portions become one heavy register layer line 112 as shown in FIG. 26 when the register layer is exposed and developed by an optical projection exposure method in which a conventional illumination shown in FIG. 32 is used. In the case where a register layer on the base plate is exposed by the optical projection exposure method of deformation illumination method in which the 4 division deformation illumination 133 shown in FIG. 33 is used, and in this time the deformation illumination elements 132 are disposed and developed so that a line connecting two illumination elements, the distance of which is the shortest, can be parallel or vertical to a direction of the pattern line in the drawing. Then, the parallel and vertical pattern line portions 113A and 113B in the drawing are formed to be a thin register layer line as shown in FIG. 27, however, the oblique pattern line portion 113C is integrated and formed to be a thick register layer line.

Figure 29:
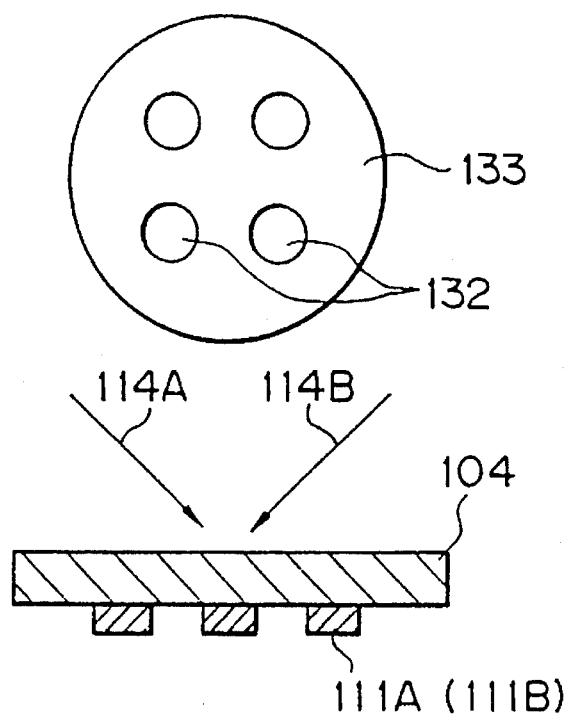
FIG. 29 is a schematic illustration showing a relation between a photomask and a diaphragm in the case of incident light of two directions (in the case of excellent resolution) in the deformation illumination system.

The reason why resolution failure is caused in a portion of the register pattern as described above is as follows: as shown in FIG. 28, the illumination light (113A, 113B and 113C) incident on the oblique portion 111C of the photomask 104 is essentially sent from the elements 132 of the deformation illumination 133 in three directions. The reason why minute resolution can be provided is as follows: as shown in FIG. 29, the illumination light (114A and 114B) incident on the horizontal portion 111A (or the vertical portion 111B) of the photomask 104 is essentially sent from the elements 132 of the deformation illumination 133 in two directions.

Consequently, as long as the deformation illumination diaphragm including 4 holes is fixed, the illumination system is not adapted to each pattern configuration. Therefore, the effect of oblique incidence of the deformation illumination method can not be sufficiently exerted.

It is an object of the present invention to provide a projection exposure method by which exposure is conducted with a deformation illumination system and division illumination system optimal for a device pattern (photomask pattern) in the case where four division deformation illumination is utilized.

The aforementioned object can be accomplished by an optical projection exposure method by which a pattern on a photomask is projected and exposed on a register on a base plate with an exposure device including a deformation illumination system, a photomask and a projection lens, wherein a deformation illumination having four components disposed symmetrically with respect to an optical axis is used for the deformation illumination system, and the deformation illumination is rotated so as to conduct exposure in accordance with a direction is rotated so as to conduct exposure in accordance with a direction of a line of the pattern of the photomask.

For each photomask, the deformation illumination is rotated and disposed so that a line to connect two elements located in the shortest distance among four elements in the deformation illumination can be parallel or vertical to the line direction of the pattern.

In the present invention, for each pattern, the resolution of which is to be improved, the 4 division deformation illumination is rotatably disposed so that oblique incident light of two directions can be provided with respect to the longitudinal direction of the line of the pattern.

Referring to the attached drawings, the present embodiment will be explained in detail with reference to an embodiment of the present invention.

Figure 30:
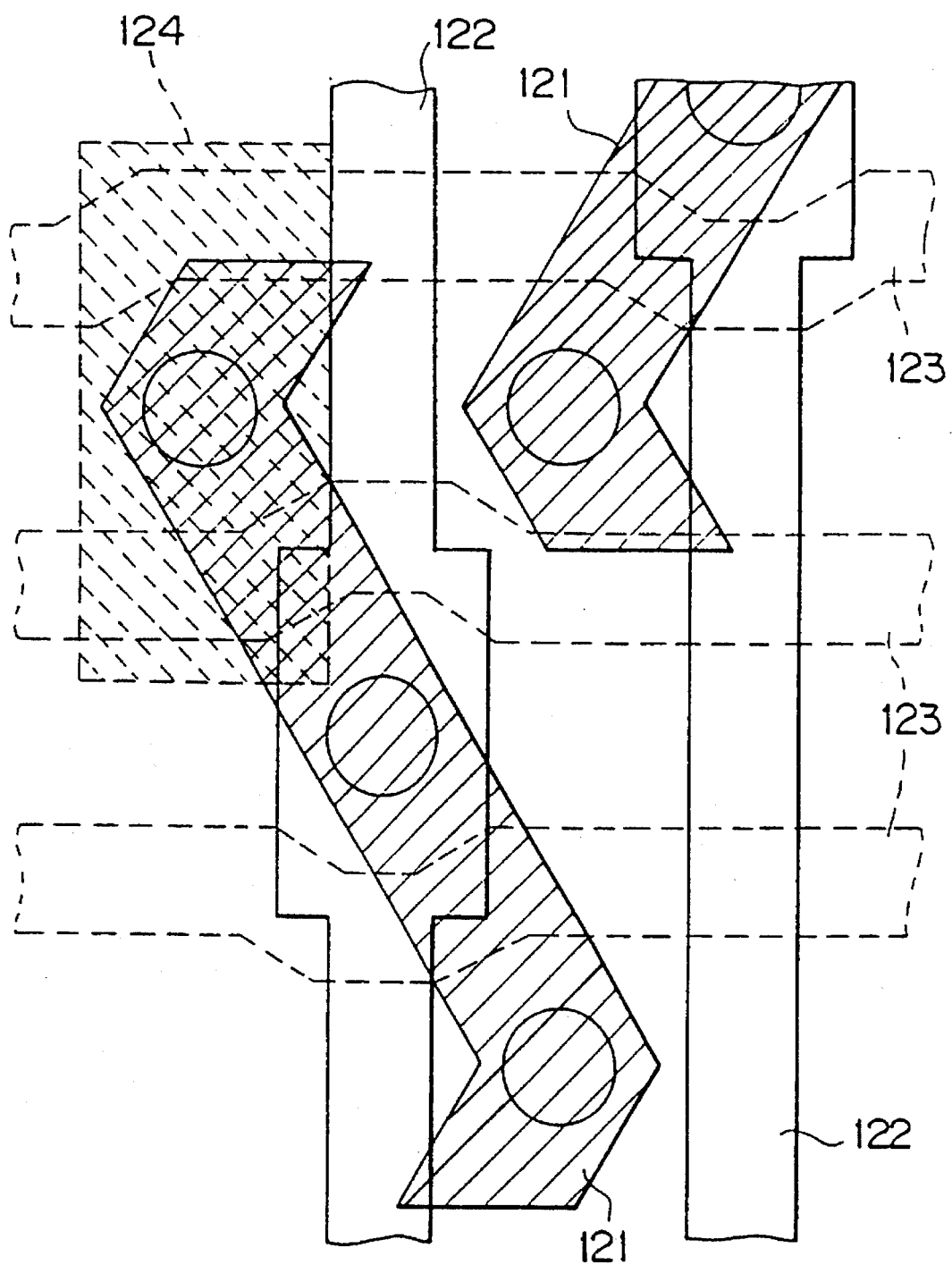
FIG. 30 is a partial plan view schematic of a pattern in a DRAM (dynamic random access memory)
Figure 31:
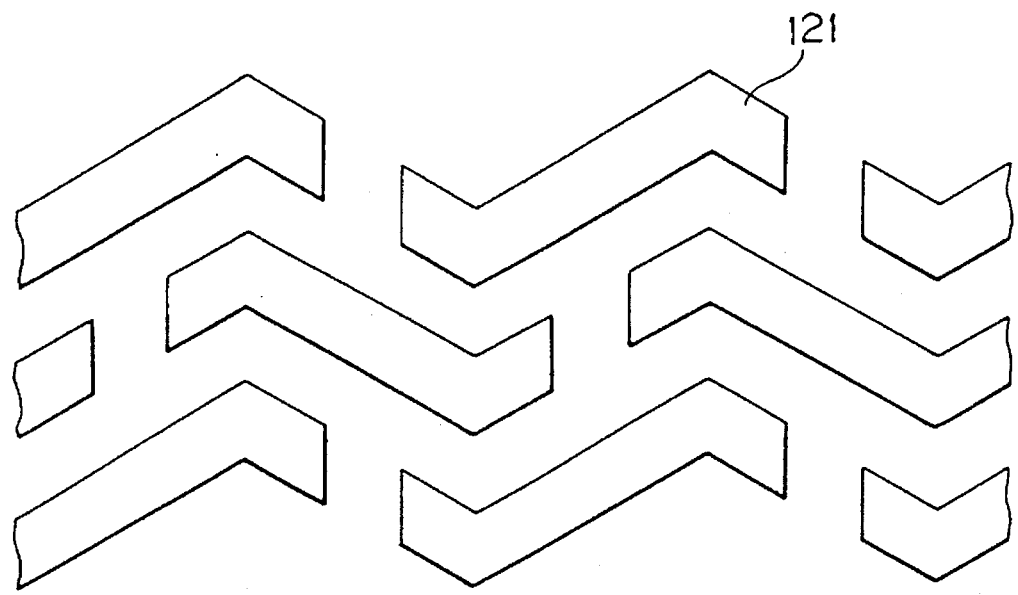
FIG. 31 is partial plan view schematic of a pattern in an activation region of a DRAM.

For example, as shown in FIG. 30, a pattern arrangement in a DRAM (dynamic random access memory) includes an activation region 121, bit line 122, word line 123, and accumulation capacitor 124. A register pattern corresponding to each pattern is exposed by the optical projection exposure device (stepper) shown in FIG. 23. For the deformation illumination of the exposure device, the 4 division light source shown in FIG. 33 is used. The deformation light source can be provided, for example, in the following manner: a diaphragm 107 shown in FIG. 24 in which 4 holes are formed is disposed behind the fly eye lens 101.

Figure 34A:
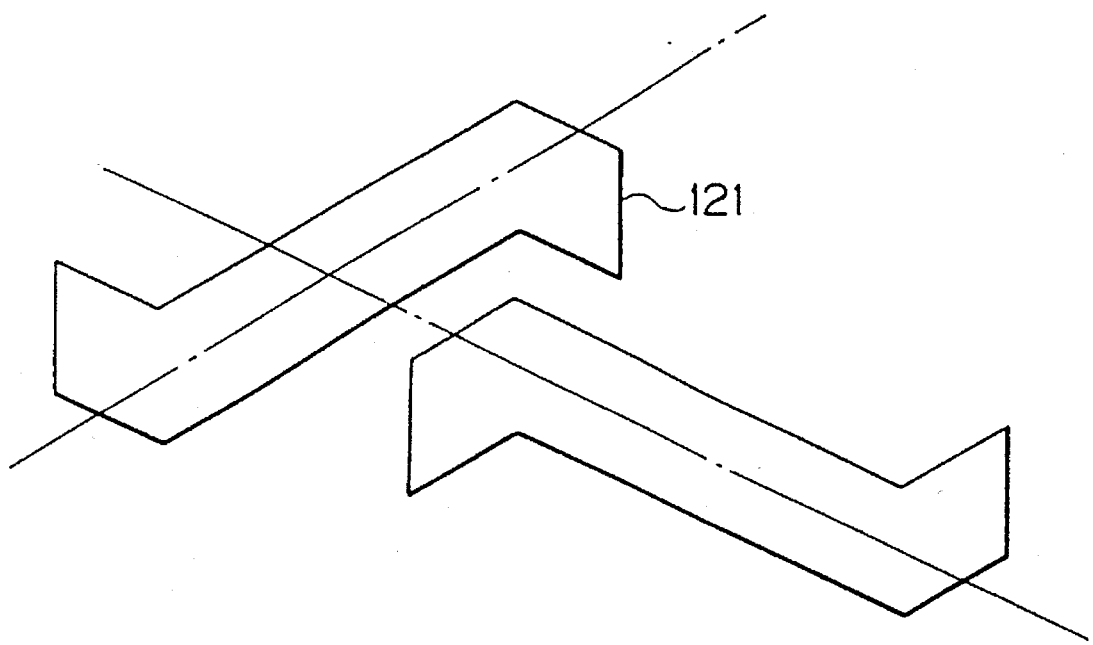
FIGS. 34(a) and 34(b) are plan views showing the rotation of division illumination in the case where they do not make a right angle with each other.
Figure 34B:
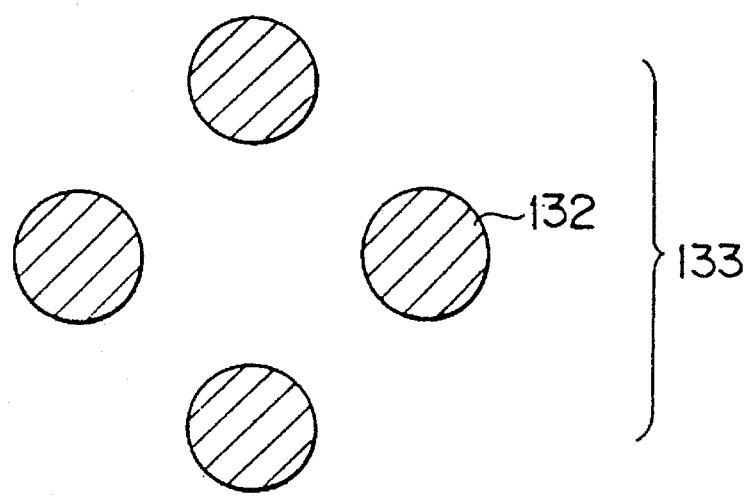

Only the pattern of the activation region 121 is a repeated pattern, and this is also a chrome pattern of the photomask. This pattern 121 is obliquely extended on the drawing, and the deformation illumination 133 is rotated and disposed so that a line to connect two elements located in the shortest distance among four elements 132 in the deformation illumination 133 can be parallel or vertical to the line direction of the pattern. In the case where the diaphragm 107 is used, only the diaphragm may be rotated. This is accomplished by adopting a case of the arrangement of the deformation illumination 132 shown in FIG. 28. This method can be also applied to a case in which oblique patterns do not make a right angle with each other as shown in FIG. 34. In this case, the deformation illumination 133 is rotated so that a line to connect two elements located in the shortest distance among four elements 132 in the deformation illumination 133 can coincide with the center line of the direction in which two oblique patterns are extended. When the deformation illumination is rotated, resolution improvement effect for the patterns extending horizontally and vertically is decreased, however, in the activation region of DRAM shown in FIG. 30, the horizontal and vertical patterns are disposed in a region except for a cell. The pattern provided in a region except for the cell is designed to be larger than that provided in a mole portion. Therefore, even when the resolution improvement effect is decreased, no problems are caused.

The patterns of the bit line 122, word line 123 and accumulation capacitor 124 are extended horizontally or vertically on the drawing. The bit line 122 is an approximately horizontal line pattern, the word line 123 is a vertical line pattern, and the accumulation capacitor 124 is a rectangular pattern, the longitudinal direction of which is vertical. In this case, the deformation illumination 133 show in FIG. 29 is disposed so that a line to connect two elements located in the shortest distance among four elements 132 in the deformation illumination 133 can be parallel or vertical to the direction of the line. When the disposition of the deformation illumination is hanged, it can be rotated around the optical axis by angle 45°.

In any cases, a pattern can be obtained under the following conditions: i rays (wavelength $\lambda$=0.365 μm) are used; a projection lens, the numerical aperture (NA) of which is 0.5, is used; and the resolution of line and space is 0.3 μm.

As explained above, according to the embodiment of the optical projection exposure method of deformation illumination system of the present invention, the optimal exposure is carried out in accordance with the pattern profile so that a register pattern (a predetermined device pattern) of improved resolution can be provided.

Figure 35:
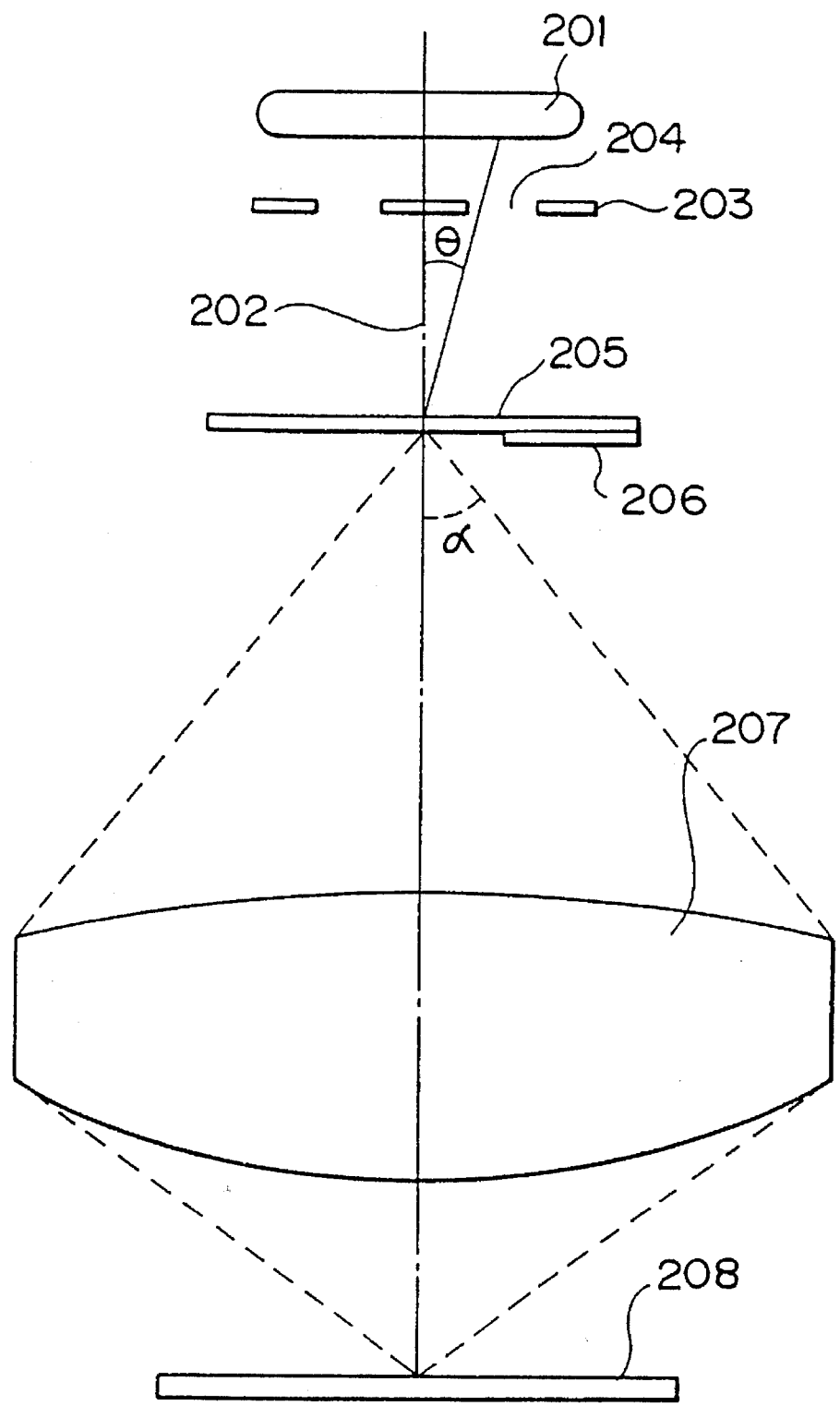
FIG. 35 is a schematic illustration showing the structure of a projection exposure device used for the projection exposure method.

FIG. 35 is a schematic illustration showing the structure of a projection exposure device used for the projection exposure method of the present invention. In this drawing, numeral 201 is a disk-shaped light source, numeral 202 is an optical axis, numeral 203 is a diaphragm, numeral 204 is an aperture, numeral 205 is a phase shift mask, numeral 206 is a phase shifter, numeral 207 is a projection lens system, and numeral 208 is a surface to be exposed. In this projection exposure device, exposure light having antoptical intensity distribution of a primary direction is formed by using the diaphragm 203 having a plurality of apertures disposed below the disk-shaped light source 1 being separated from the optical axis 202.

Exposure light transmitted through the aperture 204 of the diaphragm 203 is irradiated on the shift mask (exposure mask) 205, and the exposure light transmitted through the phase shift mask 205 is converged by the projection lens system 207 and projected on the surface 208 to be exposed.

The projection exposure method of this embodiment is characterized in the configurating of the optical intensity distribution on a section of the exposure light.

Figure 36A:
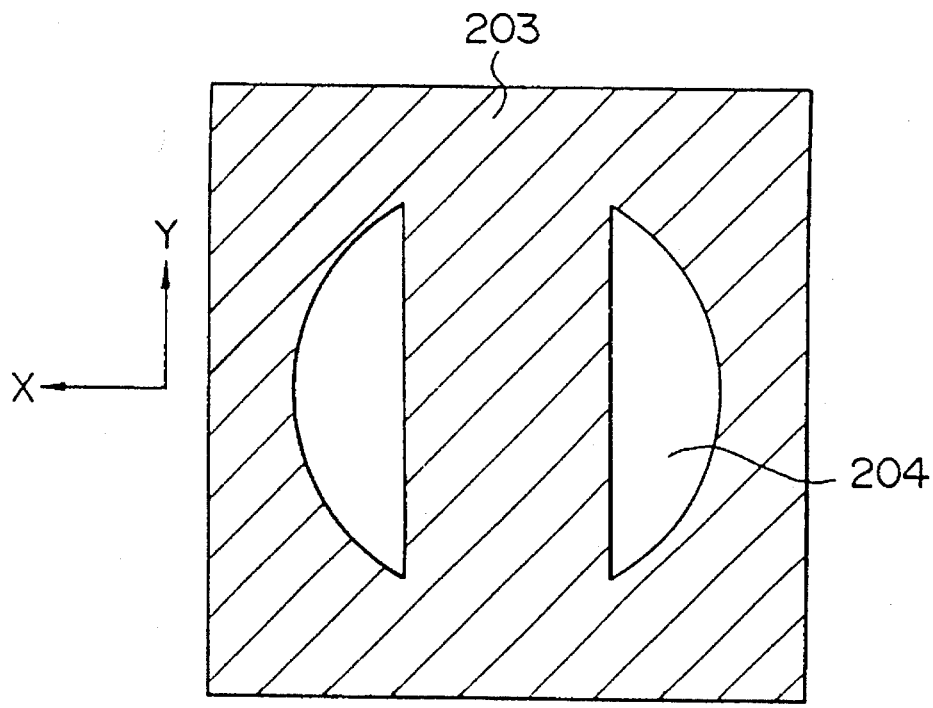
FIGS. 36(a) and 36(b) are schematic illustrations of the diaphragm of the projection exposure device used for the projection exposure method.
Figure 36B:
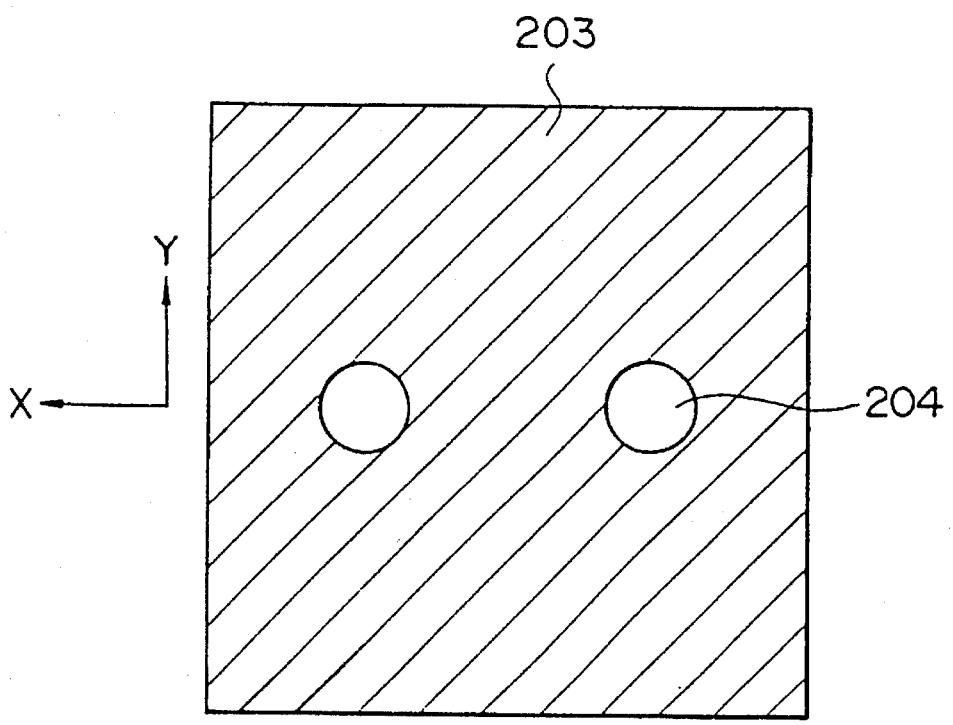

FIGS. 36(a) and 36(b) are schematic illustrations showing the structure of the diaphragm of the projection exposure device used for the projection exposure method of the present invention.

Like parts are identified by the same reference character in each of FIGS. 35, 36(a) and 36(b).

The diaphragm 203 shown in FIG. 36(a) is an example provided with the aperture 204 formed by the chords and arcs of one circle. The diaphragm 203 shown in FIG. 36(b) is an example in which circular apertures 204 are symmetrically formed on both sides of the optical axis.

A configuration of the optical intensity distribution on a section of light transmitted through the diaphragm 203 having these apertures 204 has a pattern that is wide in the direction of X (the primary direction) and narrow in the direction of Y (the direction perpendicular to the primary direction).

As an example of the diaphragm of the projection exposure device of the present invention, FIGS. 36(a) and 36(b) are shown here. When the Optical intensity distribution of X direction (the primary direction) and that of Y direction are different on the section of exposure light transmitted through the apertures, the object of the present invention can be accomplished. Therefore, the aforementioned apertures may be replaced with slit-shaped apertures, or a plurality of apertures may be provided. Moreover, a plurality of oblique apertures forming an appropriate angle with respect to the aforementioned primary direction may be provided.

When the exposure light, in,which the optical intensity distribution of X direction (the primary direction) on a section and that of Y direction are different from each other, is irradiated on a phase shift mask having a phase shift of 180°, the exposure light is transmitted through a portion close to the step portions of X and Y directions of the phase shifter, and then converged by the projection lens system, so that the exposure light characteristics of the pattern projected on the surface to be exposed become non-symmetrical.

Figure 37:
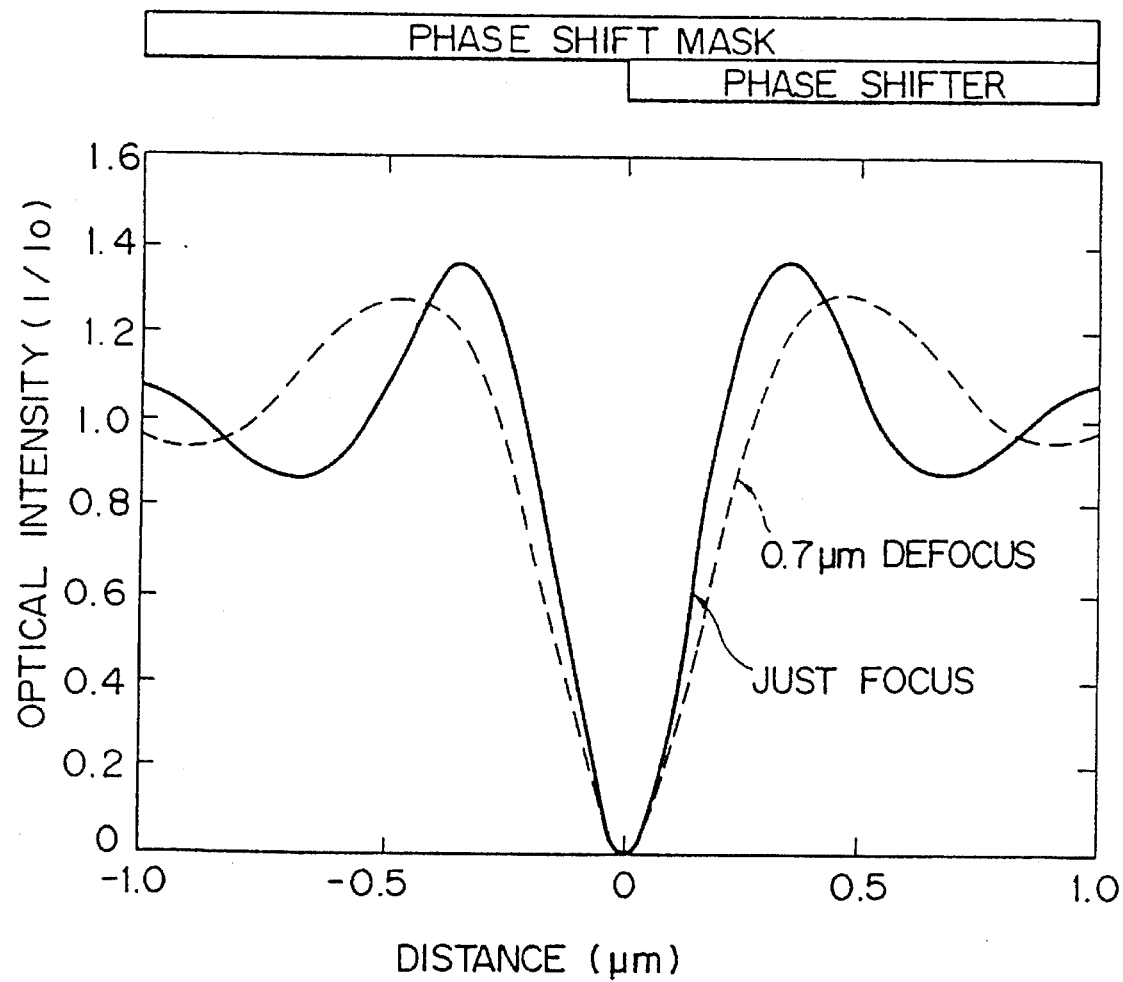
FIG. 37 is an optical intensity distribution diagram of exposure light transmitted through the phase shifter step portion parallel with the primary direction of the exposure light.

FIG. 37 is an optical intensity distribution diagram showing the intensity distribution of light transmitted through a phase shifter step portion parallel with the primary direction The horizontal axis of this diagram shows a distance from the step portion of the phase shifter of the phase shift mask, and the horizontal axis shows the optical intensity of exposure light transmitted through the phase shift mask.

This diagram shows a result of calculation provided by a simulation conducted under the condition that the wavelength of exposure light is 365 nm and the numerical aperture (NA) is 0.54. In the diagram, a solid line represents a case of just focus, and a broken line represents a case of 0.75 μm defocus.

In this case, incident angle θ of the light, which is sent from the disk-shaped light source and incident on the phase shift mask through the diaphragm aperture, is determined by the following equation $$\theta=\sin^{-1}(0.6 \text{ to } 1.0)\times(NA)\times 1/m$$

where NA: numerical aperture of the projection lens, and 1/m: magnification of reduction projection.

According to this diagram, in the case of just focus, and also in the case of 0.75 μm defocus, the optical intensity of the exposure light transmitted through a portion close to a step portion of the phase shifter of the phase shift mask is sharply lowered, so that a sharp linear unexposed portion having a very narrow width is formed all over the thickness of a commonly used photoregister film, the thickness of which is approximately 1 μm.

Consequently, when a positive type photoregister film is used, a minute linear register pattern can be formed, and when this linear register pattern is masked so that the film below the mask is etched and removed, a minute linear film can be formed.

On the contrary, when a negative type photoregister film is used, a register pattern having a linear space can be formed. When this register pattern having a linear space is masked so that the film below the mask is etched and removed, a film having a very minute linear space can be formed.

Figure 38:
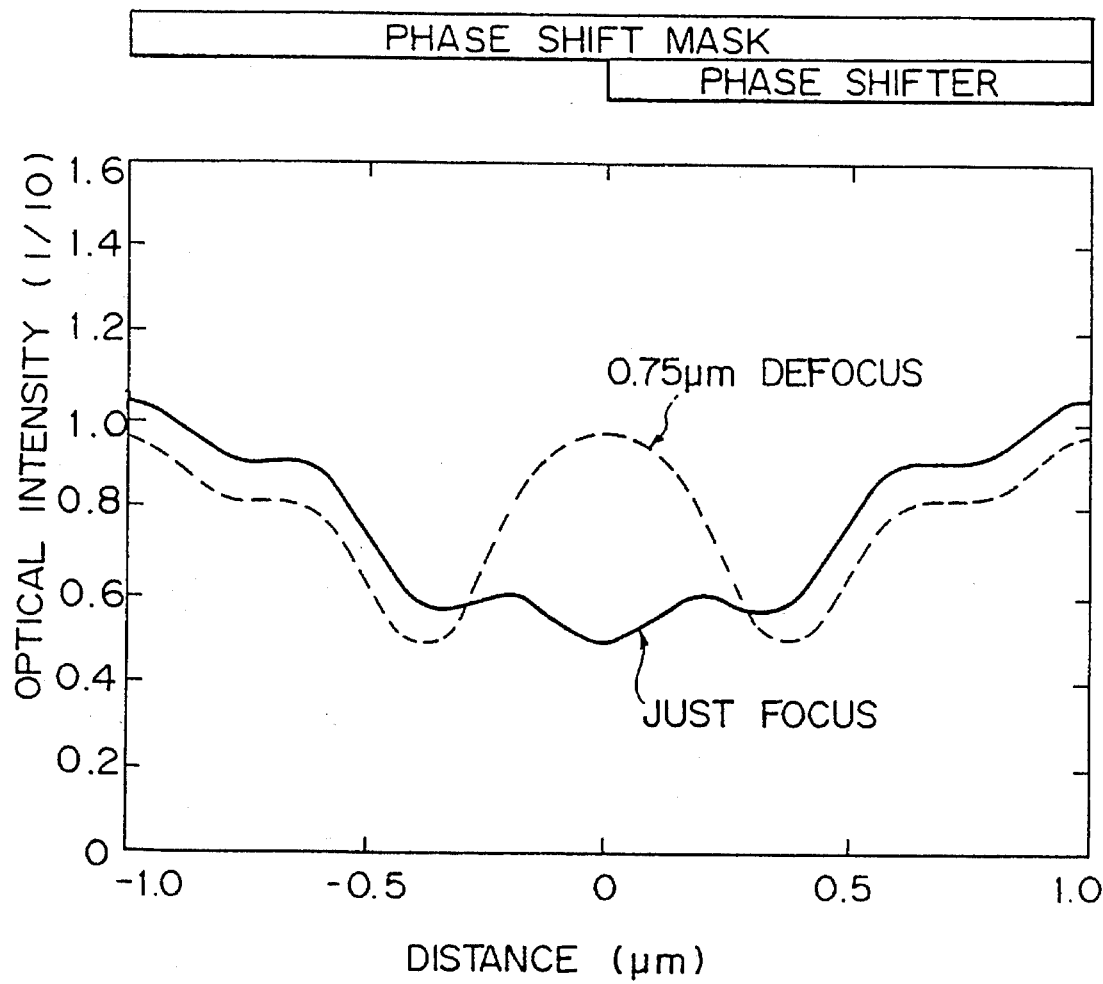
FIG. 38 is an optical intensity distribution diagram of exposure light transmitted through the phase shifter step portion perpendicular to the primary direction of the exposure light.

FIG. 38 is an optical intensity distribution diagram showing the intensity distribution of light transmitted through a phase shifter step portion perpendicular to the primary direction.

The horizontal and vertical axes are the same as those shown in FIG. 37, and the exposure conditions are the same as those shown in FIG. 37.

According to this drawing, in the case of just focus, a sharp decrease of optical intensity shown in FIG. 37 does not exist in a position close to the step portion of the phase shifter of the phase shift mask. In the case of 0.75 μm defocus, the optical intensity is increased to about 1.0, however, an approximately flat optical intensity distribution can be provided, and a linear unexposed portion is not formed.

When a positive type photoregister film is used, a register pattern is not left after development. Therefore, when etching is conducted in the manner explained in FIG. 37, the film below the etched portion is removed.

On the contrary, when a negative type photoregister film is used, a register pattern having no openings can be formed, so that the lower film can be prevented from being etched.

As can be seen in FIGS. 37 and 38, according to the present invention, the just focus characteristics and the defocus characteristics expressing the optical intensity distribution in the thickness direction of the register film are close to an ideal condition in which the effect of the present invention is clearly provided, and after the exposure light has been transmitted through the phase shifter step portion perpendicular to the primary direction of the exposure light, interference of the exposure light is prevented.

As explained above, only when the sectional configuration of exposure light is changed, an unnecessary unexposed portion generated in the phase shifter step portion can be removed by one exposure operation using a sheet of phase, shift mask having no special structure such as a multi-step portion.

EMBODIMENT 8

FIGS. 39(a) and 39(b) are schematic illustrations showing the projection exposure method of the first embodiment.

FIG. 39(a) shows an exposure phase shift mask (reticule) used for the projection exposure method of the first embodiment, and FIG. 39(b) shows a pattern formed by the projection exposure method of the embodiment 8.

In these drawings, numeral 211 is a shading film, numeral 212 is a 180° phase shifter, numeral 213 is a step portion of X direction, numeral 214 is a step portion of Y direction, numeral 215 is exposure light, numeral 216 is a linear pattern, i and numeral 217 is a pad.

As explained in FIGS. 35 and 36, when the diaphragm 203 having the aperture 204 is provided to the disk-shaped light source 201, the exposure light having an optical intensity distribution extending in the primary direction (X direction) in a section is irradiated on the phase shift mask 205, and the exposure light transmitted through this phase shift mask 205 is converged by the projection lens system 207 on the surface 208 to be exposed, so that a photoregister film coated on this surface is exposed.

The phase shift mask (FIG. 39(a)) used for the projection exposure method of the first embodiment includes: a shading film 211 corresponding to a pad, wherein the shading film 211 is provided on a transparent base plate; a step portion 213 of X direction parallel with the primary direction (X direction) of the exposure light 215; and a rectangular phase shifter 212 formed by a step portion 214 of Y direction perpendicular to the step portion 213.

In the pattern (FIG. 39(b)) formed by the projection exposure method of the first embodiment shown in FIG. 39(a) in which the exposure light 215 and the phase shift mask are utilized, a very narrow linear pattern 216 is formed by the step portion 213 of X direction of the phase shifter 212, and the exposure light transmitted through the step portion 214 of Y direction of the phase shifter 212 is directly sent to the primary direction of the exposure light 215, so that the phases of exposure light transmitted through this point do not coincide with each other and the phase shift of 180° is not generated. Therefore, an unexposed portion is not formed, so that a linear pattern is not generated.

When the linear pattern 216 is formed from a conductive coat and a positive process is adopted, this embodiment can be applied to a case in which an isolated line portion is formed to be used as a minute gate electrode in an integrated circuit using MOSFET is formed. Also, when a negative process is adopted, this embodiment can be applied to a case in which an opening portion such as a contact hole, is to be formed.

Figure 40A:
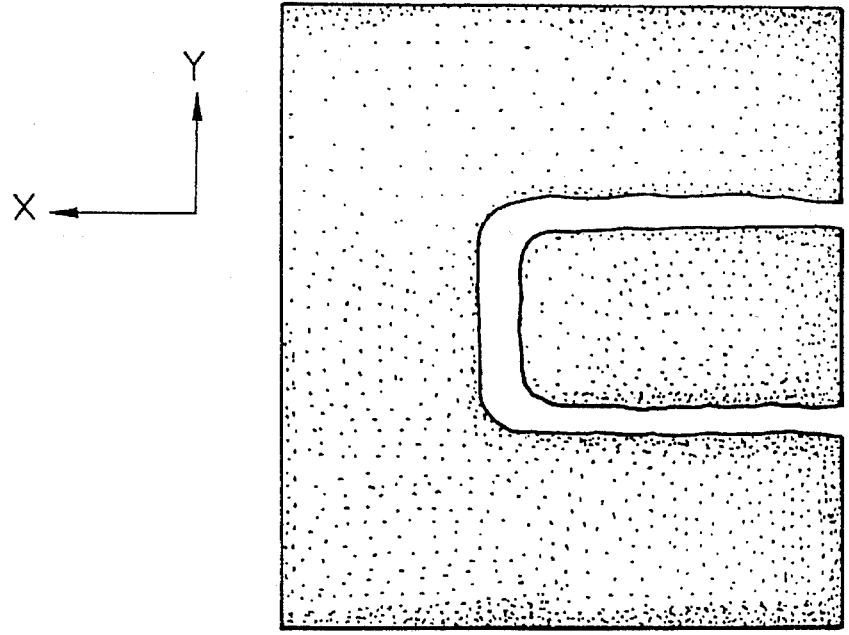
FIGS. 40(a) and 40(b) are schematic views of a pattern showing the effect of the embodiment 8.
Figure 40B:
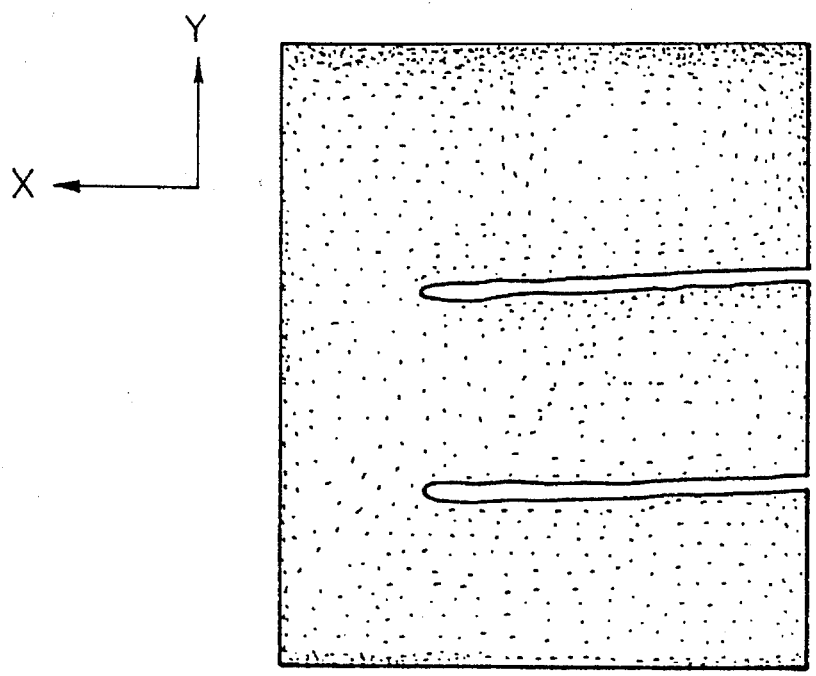

FIGS. 40(a) and 40(b) are schematic views for explaining the effect provided by the first embodiment.

FIG. 40(a) is a schematic view of the tip portion (the left edge portion of FIG. 39(a)) of a pattern formed by a conventional disk-shaped light source, and FIG. 40(b) is a schematic view of the tip portion of a pattern formed according to this embodiment.

The thickness of an etching register used for the formation of the pattern shown in the photograph was about 1 μm, and the width of the pattern register was about 0.15 μm. It can be seen that a minute pattern was formed all over the step portions of the phase shifter (X and Y directions).

FIG. 40(b) shows a case in which exposure was carried out by exposure light of which the primary direction was X. It can be seen that a pattern including a sharp unexposed portion was formed in the X direction, however, the pattern was not formed in the Y direction.

These photographs show an example of the positive process (process to provide a line pattern of the register). Of course, when the negative process is adopted, a space pattern can be provided.

In this embodiment, a rectangular phase shift has been explained that was formed from the step portion 213 of the X direction and the step portion 214 of the Y direction perpendicular to the X direction on the basis of the primary direction (X direction) of the exposure light 215. However, it is not always necessary that the step portions of the phase shifter make a right angle with each other. For example, in the step portions of a phase shifter that are crossed by an angle 45°, an unexposed portion can be effectively removed.

EMBODIMENT 9

Figure 41A:
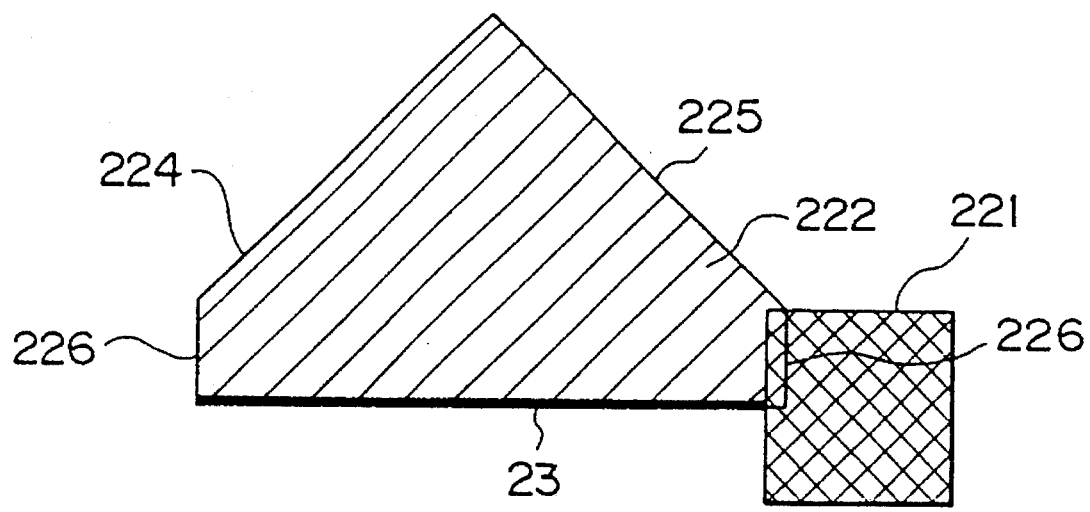
FIGS. 41(a) and 41(b) are schematic illustrations of the projection exposure method of the embodiment 9.
Figure 41B:
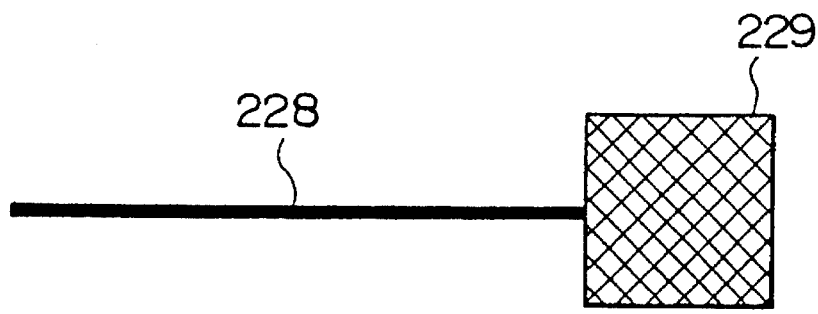

FIGS. 41(a) and 41(b) are schematic illustrations of the projection exposure method of the embodiment.

FIG. 41(a) is a schematic illustration of a phase shift mask used for the projection exposure method of the second embodiment, and FIG. 41(b) is a schematic illustration of a pattern formed by the projection exposure method of the second embodiment.

In these drawings, numeral 221 is a shading film, numeral 222 is a 180° phase shifter, numeral 223 is a step portion of the X direction, numerals 224 and 225 are step portions oblique with respect to the X direction by an angle 45°, numeral 226 is a step portion of the Y direction, numeral 227 is exposure light, numeral 228 is a linear pattern, and numeral 22 is a pad.

In this embodiment, a photoregister film is exposed with the exposure device explained in FIGS. 35 and 36 using the phase-shift mask.

FIG. 41(a) shows a portion of the phase-shift mask (reticule) used for the projection exposure method of the second embodiment. On a transparent base plate, there are provided a shading film 221 corresponding to a pad, step portion 223 of the X direction that is a primary direction of exposure light 227, step portion 226 of the Y direction, and a pentagonal phase shifter 222 formed by the two step portions 224, 225 oblique to the upper edge of the step portion 226 of the Y direction by an angle 45°.

FIG. 41(b) shows a pattern formed by the projection exposure method of the second embodiment in which the exposure light 227 and the phase-shift mask shown in FIG. 41(a) are used. A minute linear pattern 228 is formed by the step portion 223 of the X direction of the phase shifter 222. Rays of light corresponding to the two step portions 224 and 225 oblique to the step portion 223 of the X direction of the phase shifter 222 cross the primary direction (the X direction) of the exposure light by an angle 45°, and a ray of light corresponding to the step portion 226 of the Y direction crosses the primary direction of the exposure light by an angle 90°, so that a phase shift is not caused and the linear pattern is not generated.

This embodiment can be applied to a case in which a gate electrode is formed in MOSFET by the positive process in the same manner as the first embodiment.

Also, according to this embodiment, an aperture to come into contact with source and drain regions can be formed by the negative process in which the phase shifter applied to the formation of gate electrodes is used.

An angle formed between a ray of exposure light incident on the exposure mask and the optical axis will be investigated here in each embodiment described above.

When the angle θ formed between the exposure light incident on the exposure mask and the optical axis is small, it is natural in principle that the effect to erase an unexposed portion generated by the unnecessary step portion of the shifter is reduced, and when the angle θ is large, the effect to erase the exposure pattern of the unnecessary step portion is large.

However, when θ is increased, the resolution of the exposure pattern is deteriorated.

According to the experiments made by the inventors, the following effects have been observed:

When exposure light is used having an optical intensity distribution extending in a primary direction included in a range of θ with respect to the optical axis, even when the photoregister film is thick and the exposure amount is small, an unnecessary unexposed portion can be effectively erased while the resolution is maintained high, wherein θ is determined by the following equation.

$$\theta = \sin^{-1}(0.4 \text{ to } 1.0) \times (NA) \times 1/m$$

NA: numerical aperture of the projection lens
1/m: magnification of reduction projection On the assumption that the numerical aperture (NA) of the projection lens is 0.54 and the magnification "m" of reduction projection is 5, this angle θ is expressed as follows: $\theta = \sin^{-1} 0.43$ to $\sin^{-1} 0.11$, that is, θ is about 2° to 6°.

EMBODIMENT 10

In each embodiment described above, a case is explained in which a minute linear pattern, for example, a gate electrode is formed by the step portion of the phase shifter.

However, in the case where a phase shift mask (reticule) is formed by forming the phase shifter after the shading pattern corresponding to the pad has been formed from a shading film made of chrome on the transparent base plate, there is a possibility that a positional slippage is caused between a shading pattern formed before and a phase shifter formed after.

Therefore, the following method can be considered:

A minute linear pattern is formed concurrently with other shading patterns, and a phase shifter is formed so that the step portion can be disposed on this minute linear pattern. In this way, and unexposed pattern is formed by the minute linear pattern in an accurate position although the unexposed pattern is not sharp. A sharp unexposed portion is formed by the step portion of the phase shifter. An accurate unexposed portion is formed at an accurate position by the unexposed portions of the two.

Figure 42:
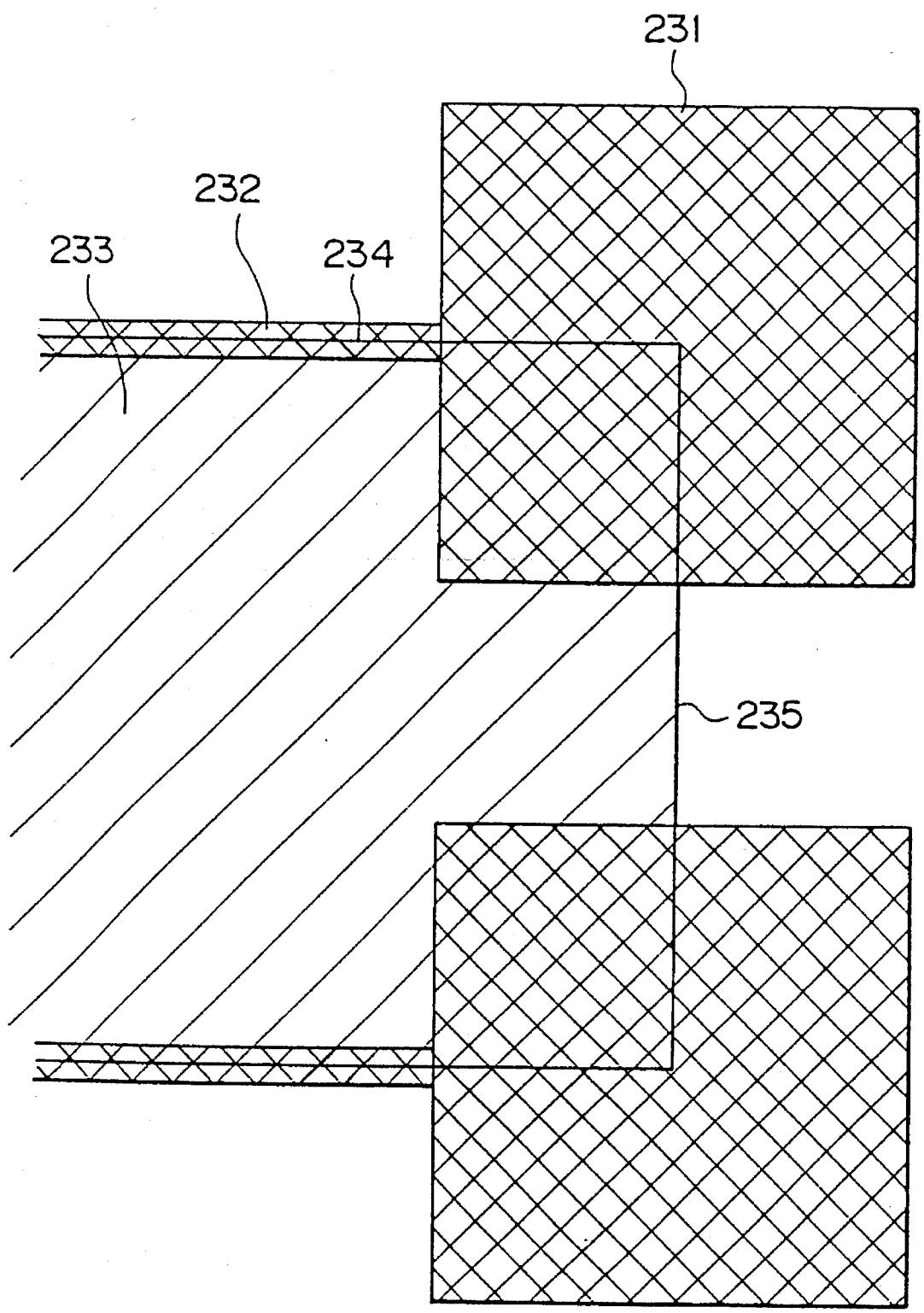
FIG. 42 is a, schematic illustration of the projection exposure method of the embodiment 10.

FIG. 42 is a schematic illustration of the projection exposure method of the embodiment 10.

This drawings shows a portion of the exposure mask (reticule). Numeral 231 is a shading pattern corresponding to a pad, numeral 232 is a minute linear shading pattern, numeral 233 is a phase shifter, numeral 234 is a step portion of the X direction, and numeral 235 is a step portion of the Y direction.

In this embodiment, the shading pattern 231 corresponding to a pad and the minute linear shading pattern 232 are provided by a vapor-deposition film made of chrome and the like. On the shading pattern 231 and the linear shading pattern 232, the phase shifter 233 is formed so that the step portion 234 of the X direction can be disposed on the linear shading pattern 232.

According to this embodiment, even when the linear pattern 232, the dimensions of which are $0.2 \times (\lambda/NA) \times m$ (the dimensions on the mask, λ: wavelength of exposure light) exists on the step portion 234 of the X direction of the phase shifter, no problems are caused in the generation of a sharp unexposed portion generated by the step portion 234 of he phase shifter 233. Accordingly, a positional slippage caused when the phase shifter 233 is formed can be allowed in the aforementioned allowable range.

EMBODIMENT 11

When the diaphragm having an aperture disposed below the disk-shaped light source is appropriately rotated so that the primary direction of exposure light is changed in the projection exposure method of the present invention, another embodiment can be considered.

FIGS. 43(a) to 43(c) are schematic illustrations of the projection exposure method of the embodiment 11.

FIG. 43(a) shows a phase shift mask provided with a rectangular phase shifter. FIG. 43(b) shows a linear exposure pattern in the case where the primary direction of exposure light is in the X direction (the lateral direction in the drawing). FIG. 43(c) shows linear exposure pattern in the case where the primary direction of exposure light is perpendicular to the X direction.

In this drawing, numeral 241 is a phase shifter, numeral 242 is an exposure pattern of the X direction, and numeral 243 is an exposure pattern of the Y direction.

In this embodiment, first, the exposure light, the primary direction of which is X, is irradiated on the phase shift mask having a plurality of rectangular phase shifters, so that a large number of linear patterns of the X direction composed of a sharp unexposed portion are formed by the step portion of the X direction of the phase shifter on the surface to be exposed.

After that, the primary direction of exposure light is rotated by an angle 90°, and another surface to be exposed is exposed with this phase shift mask, so that a plurality of linear unexposed patterns of the Y direction are formed by the step portion of the Y direction of the phase shifter.

According to this embodiment, when a sheet of phase shift mask having a phase shifter is used, an unexposed portion pattern can be formed correspondingly to the configurations of the step portions of the phase shifter of each direction that are perpendicular to each other.

In this embodiment, a rectangular phase shifter having the step portions perpendicular to each other is explained. However, the same effect as that of this embodiment can be provided when the phase shifter is formed into an arbitrary polygon or a phase shifter surrounded by a curve having a gentle radius of curvature is formed and the exposure light is rotated by an angle in accordance with the configuration of the step portion of the phase shifter.

The explanation of each embodiment described above is limited to a case in which a phase shift mask is used, however, the principle of the present invention can be applied to an exposure mask formed of a shading film not having a phase shifter.

EMBODIMENT 12

Figure 44:
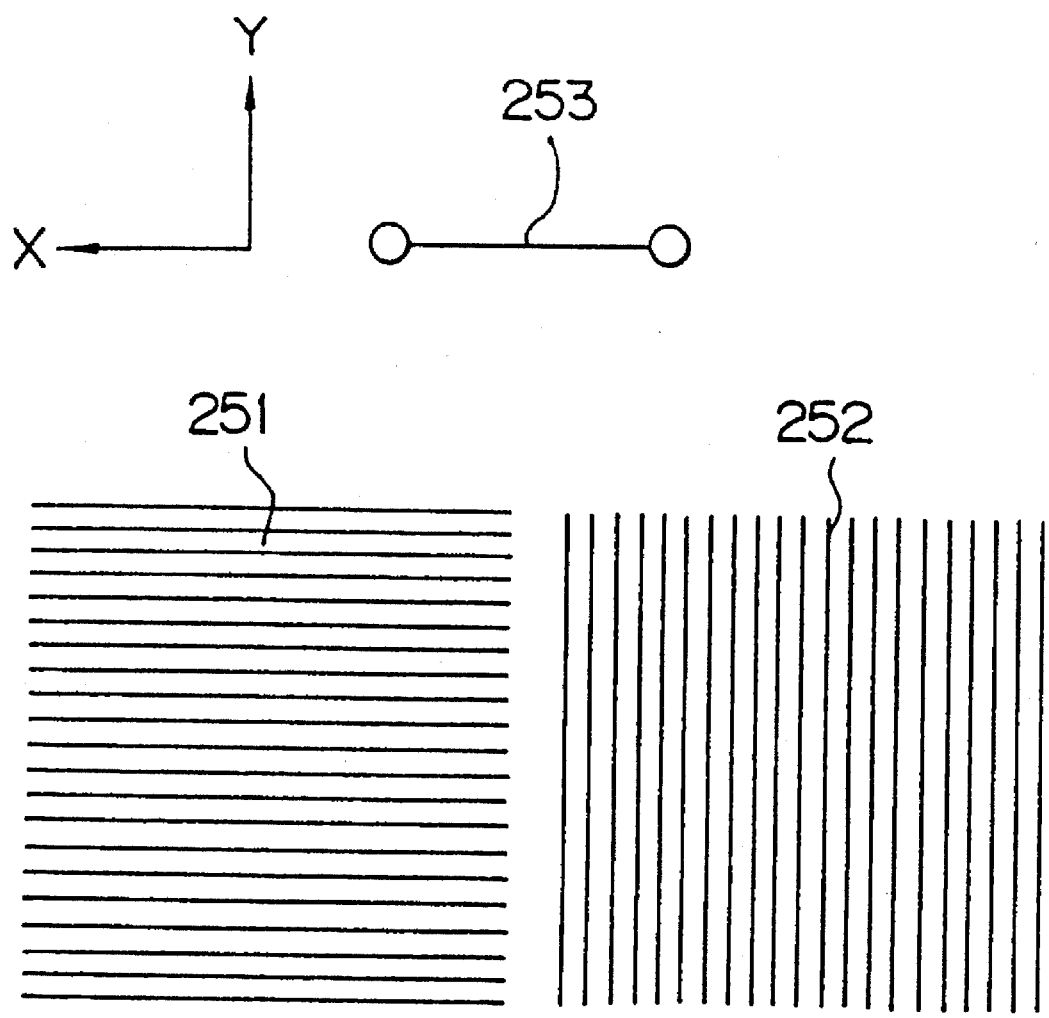
FIG. 44 is schematic illustration of the projection exposure method of the embodiment 12.

FIG. 44 is a schematic illustration of an exposure mask used for the projection exposure method of the embodiment 12.

In this drawing, numeral 251 is a line and space shading pattern of the X direction, numeral 252 is a line and space pattern of the Y direction, and numeral 253 is exposure light.

In this embodiment, a photoregister film is exposed with the exposure device explained in FIGS. 35 and 36 using an exposure mask.

FIG. 44 shows a portion of the exposure mask (reticule) used for the projection exposure method of the fifth embodiment. When the primary direction of the exposure light 253 is defined as X, the line and space shading pattern 251 of the X direction and the line and space shading pattern 252 of the Y direction perpendicular to the X direction are formed on a transparent base plate.

According to the projection exposure method of this embodiment, a line and space exposure pattern of high resolution is formed on a surface to be exposed by the line and space shading pattern 251 of the X direction. However, the resolution of a pattern formed by the line and space shading pattern 252 of the Y direction perpendicular to the X direction is not good, so that a pattern is generated by which half of the exposure light is shaded in total.

Consequently, when the amount of exposure and the progress of development are adjusted, only the line and space photoregister pattern of the X direction can be formed.

On the contrary to the above explanation, when the primary direction of exposure light is Y, only the line and space photoregister pattern of the Y direction can be formed.

That is, when the diaphragm 203 having the aperture 204 disposed below the light source 201 shown in FIGS. 35 and 36 is rotated by 90° two kinds of exposure patterns can be selectively formed using one sheet of exposure mask.

As explained above, an exposure pattern generated by the edge portion of an unnecessary direction of the phase shifter can be removed without using a plurality of masks or a multi-stage shifter, so that a highly integrated semiconductor device having a minute pattern can be easily manufactured.

EMBODIMENT 13

In order to meet the demand of forming minute patterns, in the conventional exposure technique of photolithography, a large convergence lens to converge a ray of light sent from a light source has been used for the purpose of improving the resolution.

However, when the lens size is increased, the focal depth is decreased, so that the accuracy of focal position necessarily becomes severe. Therefore, unless a focusing operation is properly conducted, resolving power is deteriorated even when the lens size is increased for improving the resolution.

In order to avoid these problems, for example, attention is given to an oblique incidence illumination method disclosed in official gazette of Japanese Unexamined Patent Publication No. 2-142111 (1990).

According to the aforementioned method, a ray of light that is vertically incident on a lens is incident being oblique at a predetermined angle, so that focusing is conducted using interference of light.

However, in the aforementioned conventional method, the same light source is used for any device patterns without giving attention to the profile of the light source. Accordingly, the following problems are caused.

Figure 53A:
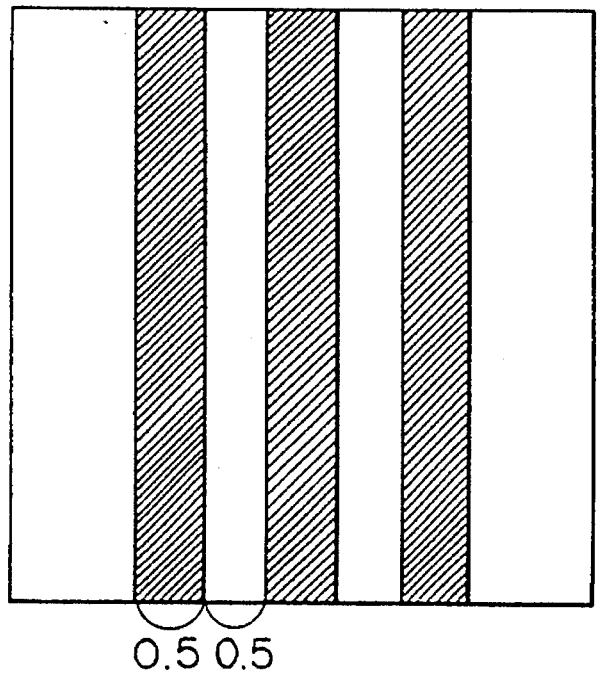
FIGS. 53(a) and 53(b) are views showing examples of mask patterns.
Figure 53B:
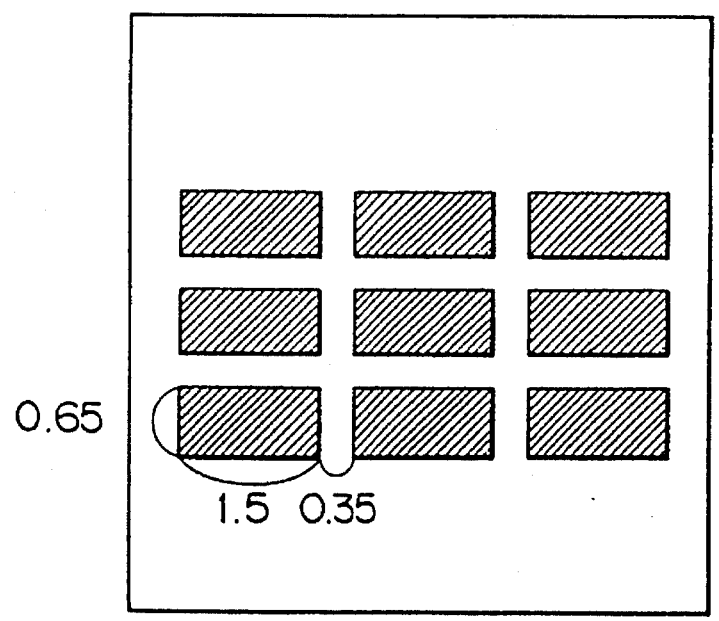
Figure 54A:
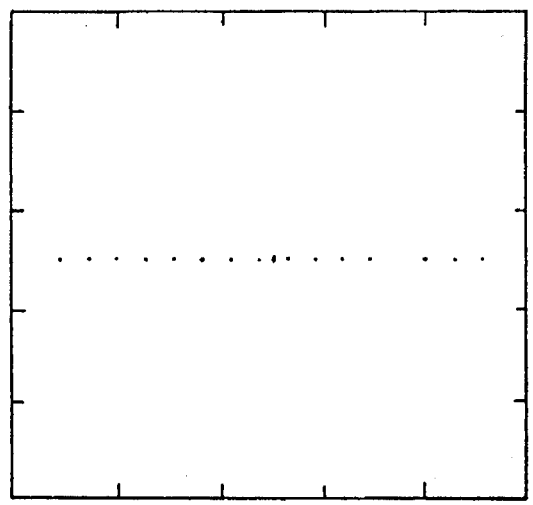
FIG. 54(a)–54(c) are a set of views showing spectral distributions of the pattern shown in FIG. 53(a)
Figure 54B:
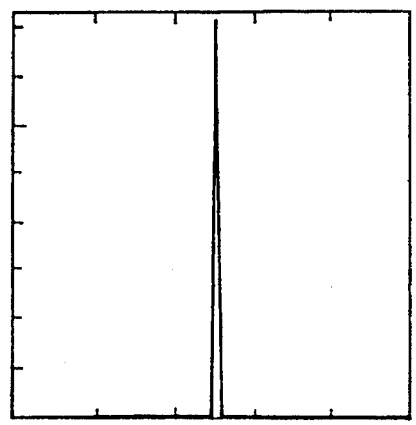
Figure 54C:
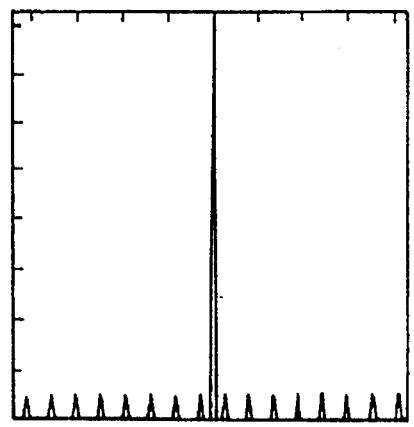
Figure 55A:
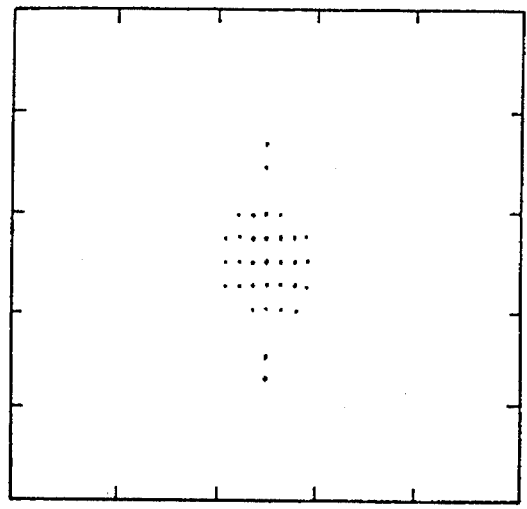
FIG. 55(a) –55(c) are a set of views showing spectral distributions of the pattern shown in FIG. 53(b)
Figure 55B:
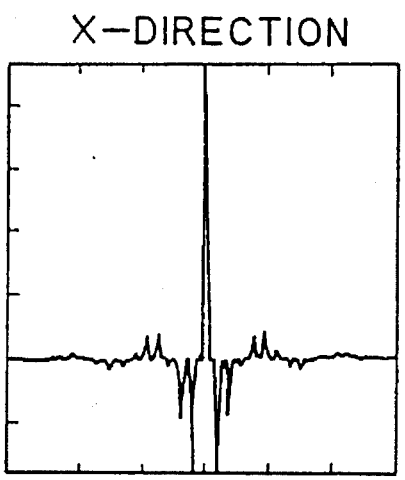
Figure 55C:
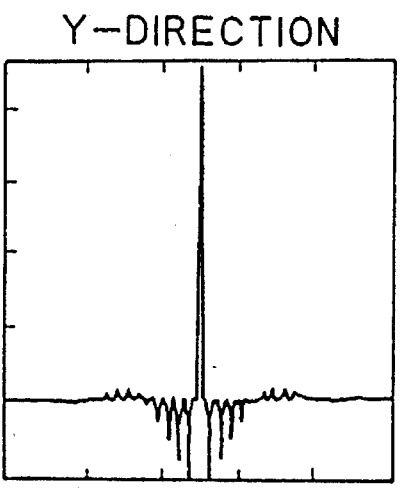

Conventionally, in order to accurately conduct a focusing operation in oblique incidence illumination, the optical intensity distribution must be uniform. However, the spectral distributions of masks differ with the profiles of the masks. For example, the spectral distribution of a pattern shown in FIG. 53(a) is illustrated in FIG. 54(a), and the spectral distribution of a pattern shown in FIG. 53(b) is illustrated in FIG. 55(a). In this connection, in FIGS. 54 and 55, F represents a space coordinate of X-axis direction, and G represents a space coordinate of Y-axis direction. FIGS. 54(b) and 54(c) respectively represent the sections of the X and Y directions in FIG. 54(a), and also FIGS. 55(b) and 55(c) represent the sections of the X and Y directions in FIG.

55(a).

Figure 56:
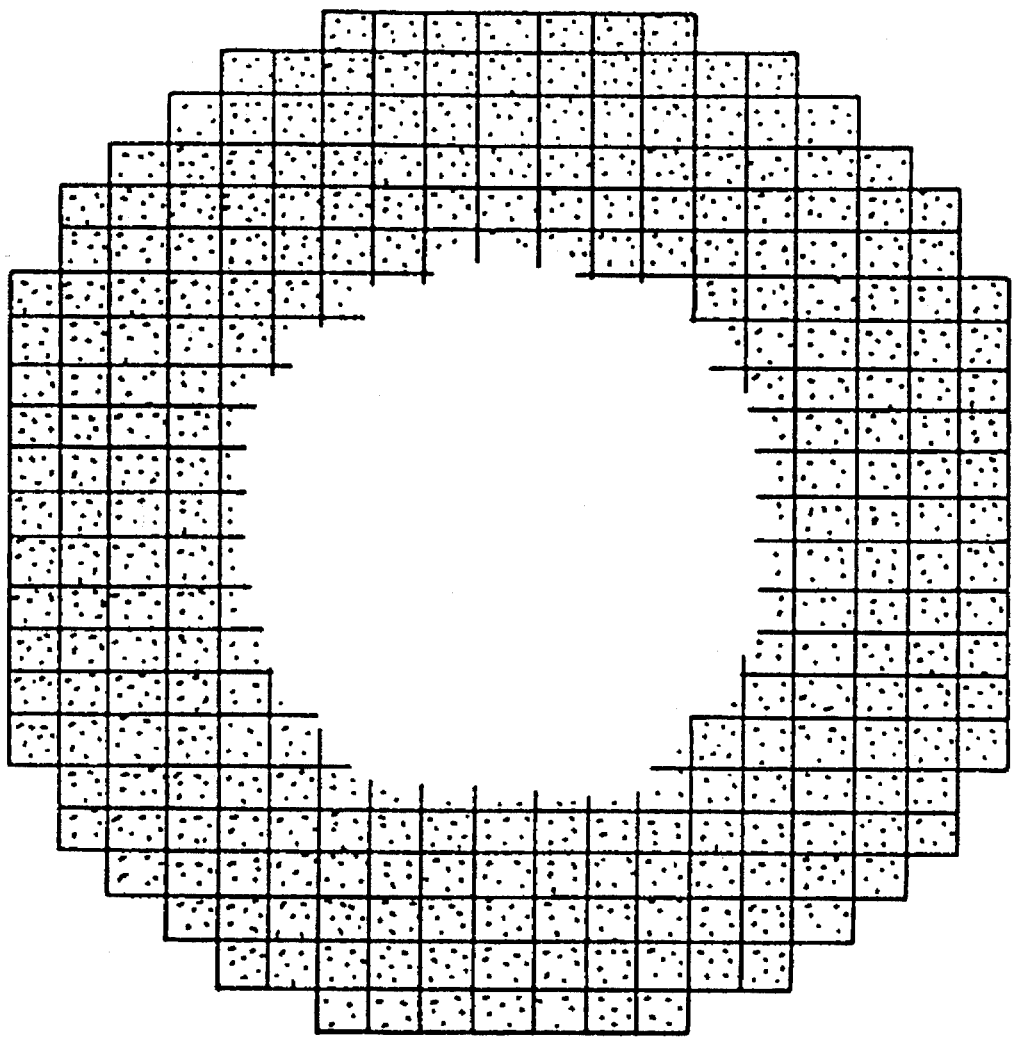
FIG. 56 is a view showing examples of a conventional light source profile.
Figure 57A:
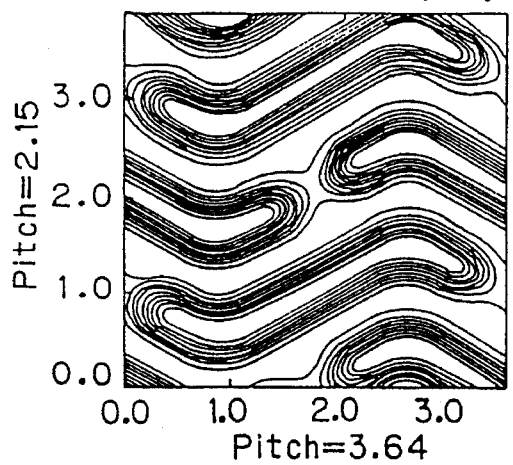
FIG. 57(a–57(f) are a set of views showing pattern images for each focal position obtained by the light source shown in FIG. 56.
Figure 57D:
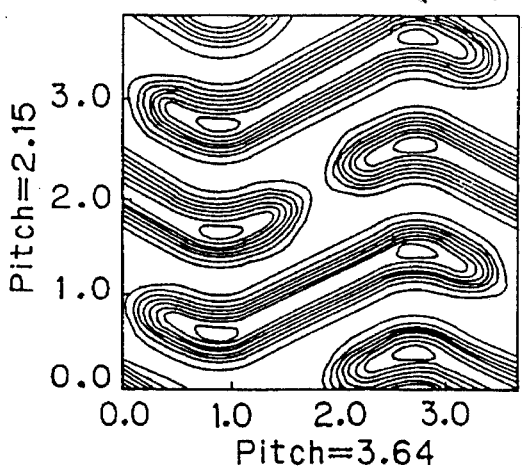
Figure 57B:
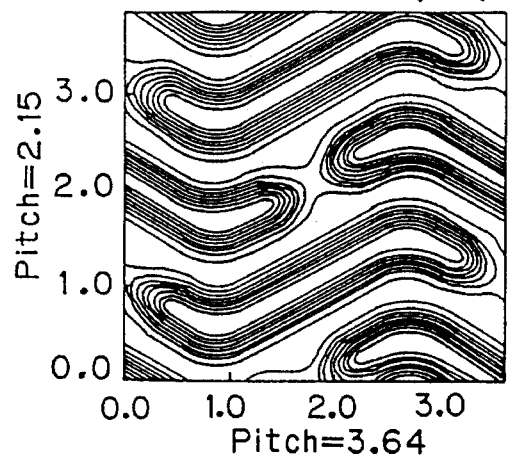
Figure 57E:
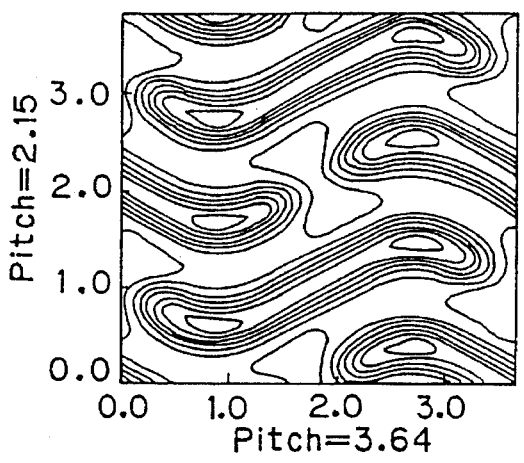
Figure 57C:
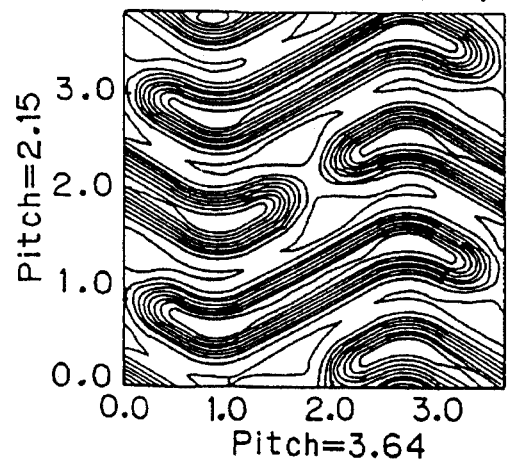
Figure 57F:
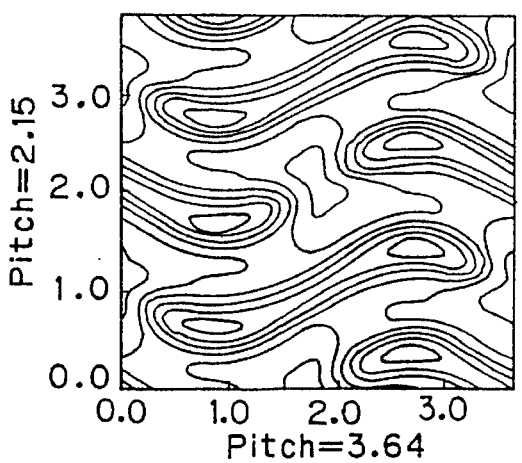
Figure 58A:
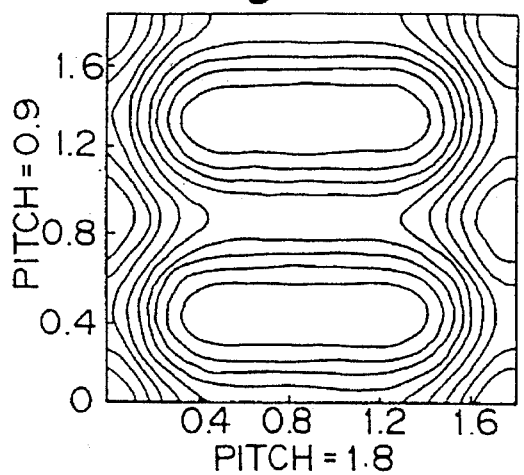
FIGS. 58(a)–58(f) are a set of views showing pattern images for each focal position obtained by the light source shown in FIG. 56.
Figure 58D:
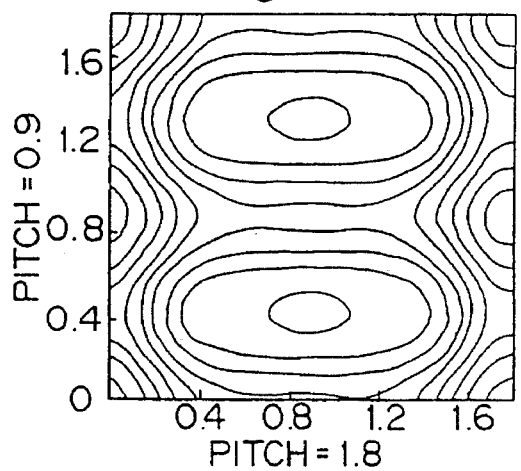
Figure 58B:
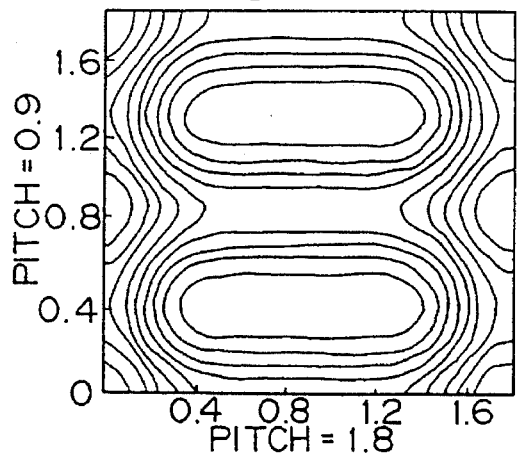
Figure 58E:
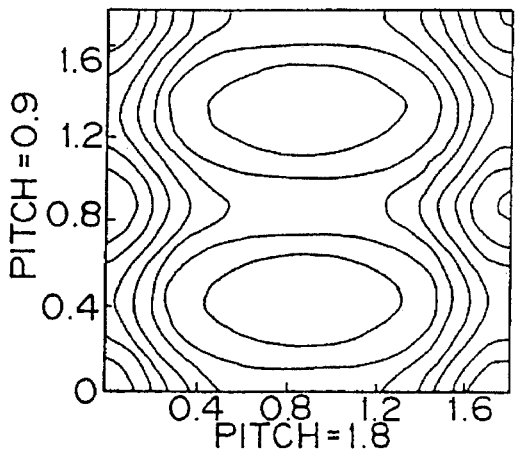
Figure 58C:
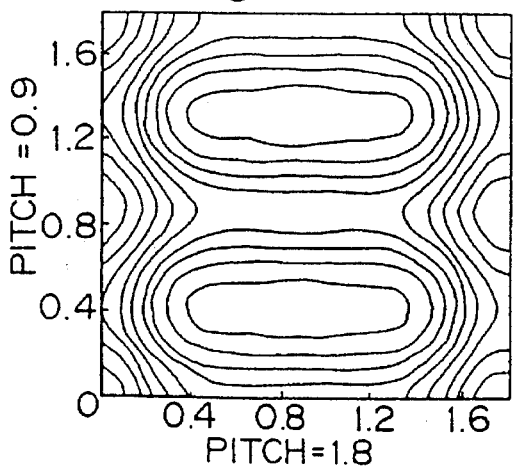
Figure 58F:
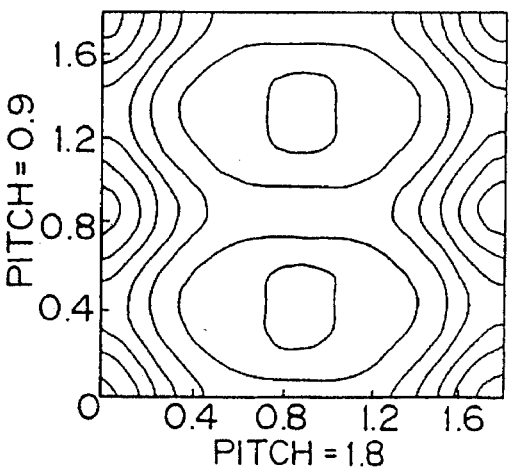

In order to sufficiently obtain the effect of oblique incidence illumination, it is necessary to provide a light source profile capable of most excellently reproducing a device pattern. However, the optimization method for a light source profile has not been conventionally provided. For example, it is common to conduct illumination with a light source, the profile of which is shown in FIG. 56.

The reason why the aforementioned light source has been conventionally used will be described as follows:

Existence of a light source profile that can most excellently reproduce a device pattern has been known. However, the profiles of actual patterns are complicated so that it is difficult to theoretically find the optimal light source profile such as a simple pattern (referred to as line and space, hereinafter) composed of simple lines disposed at regular internals. Therefore, it has been actually impossible to find the optimal light source profile for an actual pattern.

In FIGS. 57 and 58, pattern images are shown that can be obtained when two different types of patterns are irradiated by the light source shown in FIGS. 56(a)–56(f) while the focusing position is being changed. In the drawing, FIG. 56(a) shows a pattern image in the case of DF=0, FIG. 56(b) shows a pattern image in the case of DF=0.25, FIG. 56(c) shows a pattern image in the case of DF=0.5, FIG. 56(d) shows a pattern image in the case of DF=0.75, FIG. 56(e) shows a pattern image in the case of DF=1.0, FIG. 56(f) shows a pattern image in the case of DF=1.25.

As can be seen in FIGS. 57 and 58, in the case of the conventional light source profile, when the DF value exceeds DF=0.5, the obtained pattern images are far different from the original image (DF=0). Therefore, the effect of oblique incidence can not be sufficiently exerted under this condition.

Figure 45:
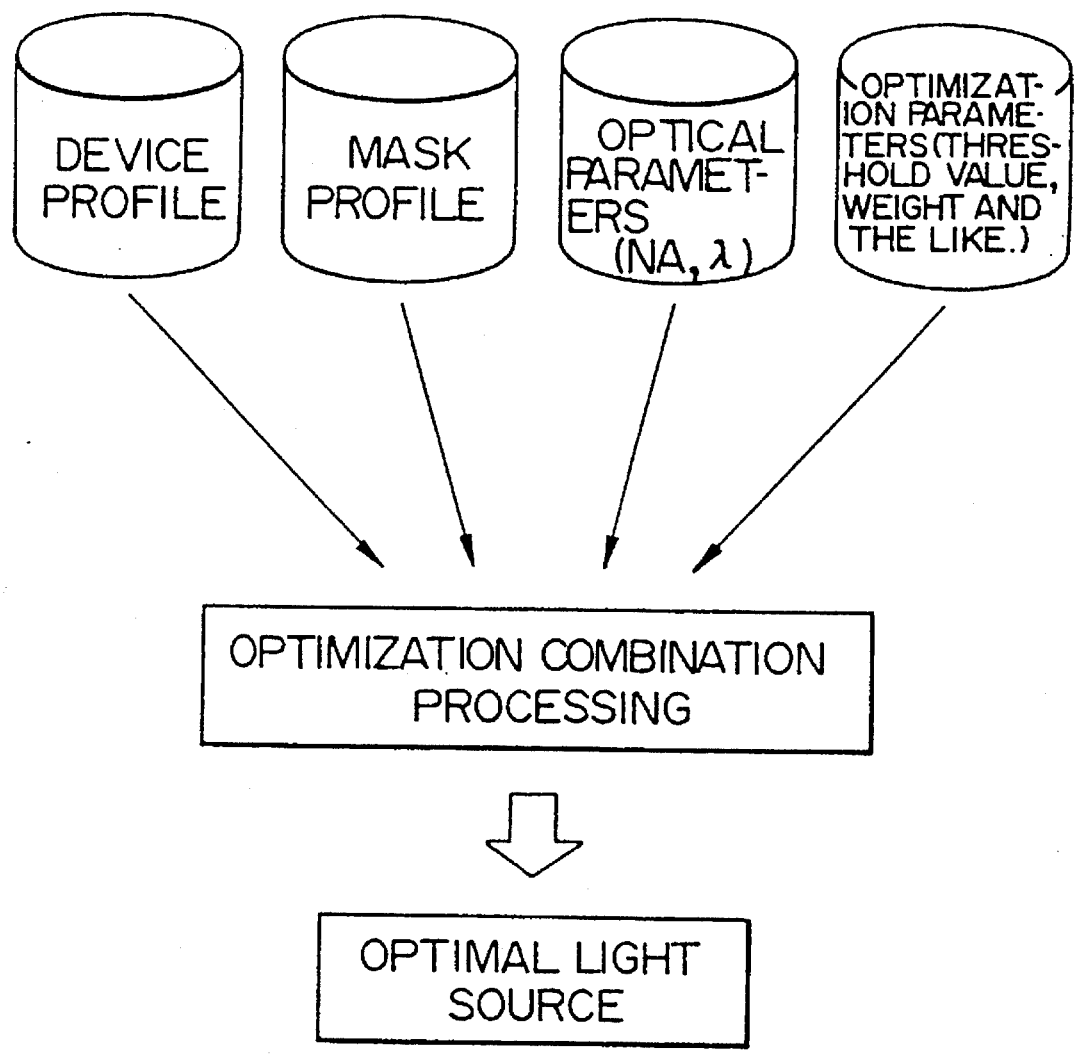
FIG. 45 is a view showing the principle of the optimization method for a light source profile of the embodiment 13.

In order to accomplish the optimization method for a light source profile of the present invention, as shown in FIG. 45 in which the principle of the present invention is illustrated, the present invention is to provide an optimization method for a light source profile in which optimization combination processing is conducted so as to calculate the light source profile in the following manner: a light source surface having a predetermined irradiation area is divided into predetermined blocks; a point light source corresponding to each divided block is assumed to be a processing element of optimization processing; the processing element is made to be binary information; and a value of the processing element is varied by the number of the blocks in accordance with the conditions of a device profile, mask profile, optical parameter and optimization parameter until a predetermined evaluation judgement condition can be satisfied.

In this case, the following methods are effectively used for the optimization combination processing: a simulated annealing method; and a method in which the optimization combination processing is carried out in such a manner that: optical intensity is calculated for each pair of point light source symmetrical with respect to the optical axis; the pair of point light sources are successively adopted from the one, the focal depth of which is largest, until a predetermined illumination can be provided.

According to the present embodiment the optimization processing for a light source profile is conducted in an actual pattern by the optimization combination processing until a predetermined evaluation judgement condition is satisfied, so that the optimal light source profile can be obtained in accordance with a device pattern.

That is, when the light source profile is optimized, the effect of oblique incidence illumination can be fully exerted.

With reference to the drawings, the present embodiment will be explained as follows.

Figure 46:
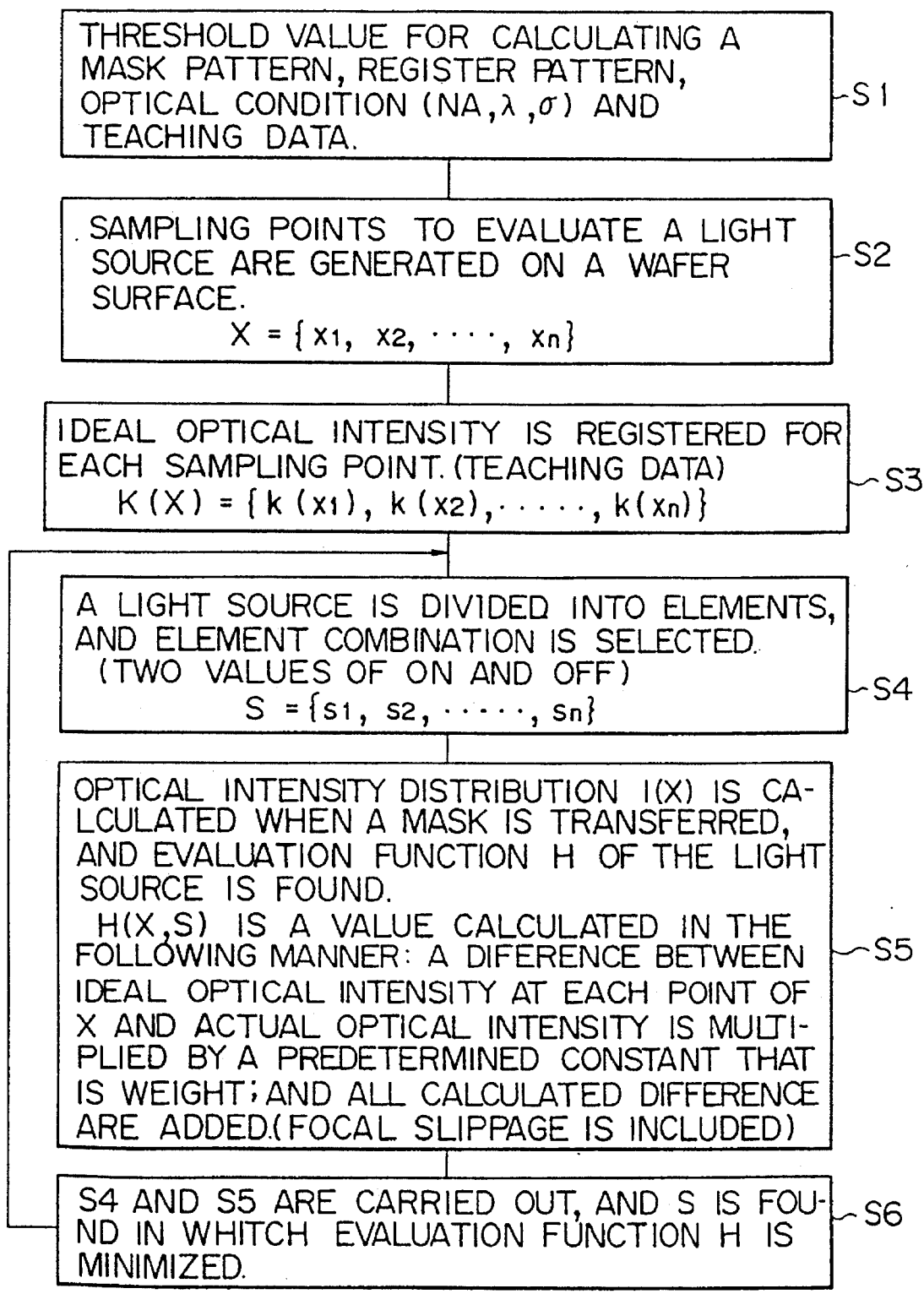
FIG. 46 a flow chart showing an outline of processing of the embodiment 13.

FIG. 46 is a view showing an embodiment of the optimization method of a light source profile according to the present invention, and it is a flow chart showing an outline of the processing.

First, with reference to FIG. 46, an outline of the entire processing will be explained.

First, in the present embodiment, a mask pattern profile to be transferred, a register pattern profile to be formed, conditions (NA, λ, and σ) of the optical system such as a stepper, and a threshold value to calculate teaching data, are inputted (S1), and a sampling point (refer to "equation 1") to evaluate a light source is generated on the wafer surface (S2).

$$X=\{x1, x2, \ldots, x_n\}$$

Next, ideal optical intensity data is registered as teaching data (refer to "equation 2") for each sampling point (S3).

$$K(X)=\{k(x1), k(x2), \ldots, k(x_n)\}$$

Then, the light source surface having a predetermined illumination area is divided into elements for each predetermined block as a fly-eye lens, and a combination (refer to "equation 3") is selected as a binary element of on and off (S4).

$$S=|s1, s2, \ldots, s_n|$$

After the combination has been selected by means of element division, optical intensity distribution I(X) in the case of transfer of the mask is calculated, and evaluation function H of the light source is found (S5). In this connection, H(X, S) is calculated in the following manner: a differences between ideal optical intensity at each point of X and actual optical intensity is multiplied by a predetermined constant that is a weight; and all calculated differences are added.

After processing S4 and processing S5 have been carried out, a combination S in which evaluation function becomes minimum is found, and processing is completed (S6).

In this embodiment, the simulated annealing method (referred to as an SA method, heireinafter), which is one of the combination optimization methods, is applied to the optimization processing for a light source profile.

The SA method is defined as a method to which the Monte Carlo Method (Metropolis Method) is applied for solving the optimization problems. It is not an algorithm to solve a specific problem, but it is a system to effectively find an optimal solution.

In an optimization problem in which a solution is improved on the basis of an evaluation function, the conventional algorithm only conducts processing in a direction in which the evaluation function is improved. Therefore, once the solution has reached a local minimum value, another better solution can not be found even when it exists. However, in the case of the SA method, under a certain condition, even when the evaluation function is deteriorated, the processing advances under the same condition. Accordingly, there is a high possibility to find a better solution that can not be obtained by the conventional algorithm.

That is, in the case of the SA method, a stochastic approach is adopted for the exchange of conditions. For that reason, relatively, the obtained solution is less susceptible to a local solution, and a stable solution can be found irrespective of the initial condition.

Specifically, in the SA method, a cost function of the system is given, and a vector variable X is found so that the cost function can be minimum. In this case, X is assumed to be an arrange menthol fly eyes, and cost function H(X) is determined by the grade of difference between an actual optical intensity distribution when X is in a certain condition, and an ideal optical intensity distribution, and then the calculation is conducted by the SA method so that cost function H(X) can be reduced. In this manner, a fly eye arrangement closest to the ideal optical intensity distribution can be found.

The processing conducted by this SA method will be explained by reference to FIG. 47.

Figure 47:
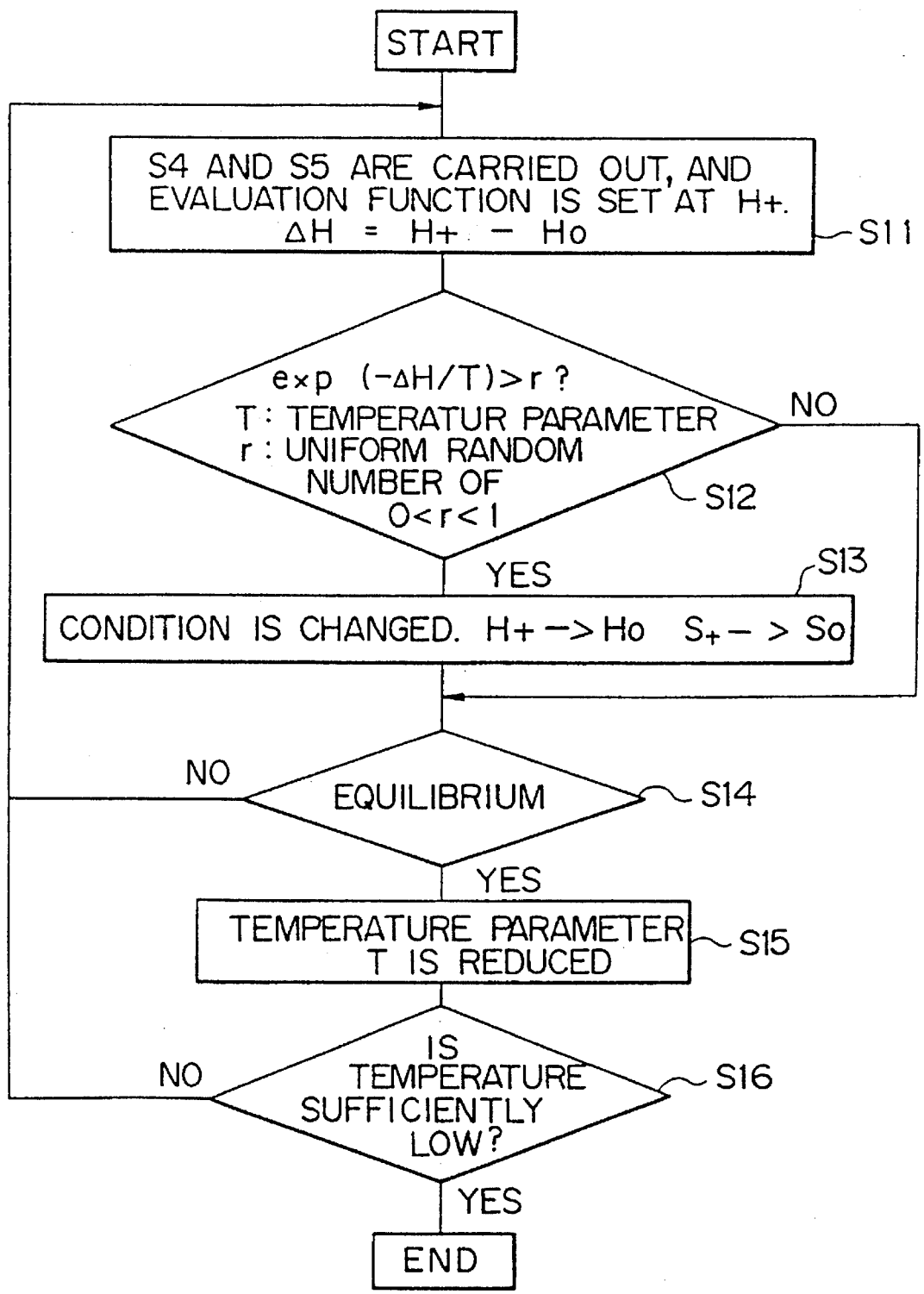
FIG. 47 is a flow chart showing primary processing of the embodiment 13.

In FIG. 47, the SA method is shown by an algorithm in which annealing of metal is adopted as a model. When temperature parameter T is given to the system and annealing is gently conducted from a high temperature, the minimum energy condition is found.

That is, a property is given in which energy is either decreased or increased when the temperature is high, and energy is only decreased when the temperature is low. Then, the temperature is gently lowered from a high temperature condition. Under the aforementioned condition, when an equilibrium is found at each temperature, a condition in which the energy of the system can be minimized is given when the temperature is sufficiently low.

In this case, energy is an evaluation function, and the evaluation function is obtained when a difference between actual and ideal values is multiplied by a weight. Therefore, in this case, high energy represents a bad condition, and the condition represents a combination of light source profiles.

Accordingly, in this embodiment, when the present light source profile is $S_0$, the evaluation function is $H_0$, and the next light source profile is $S_+$, and the evaluation function is $H_+$. In accordance with a relation between evaluation functions $H_0$ and $H_+$, evaluation is conducted, so that a light source profile is found in which the minimum evaluation is provided.

In FIG. 47, primary processing of this embodiment is shown.

First, evaluation function $H_+$ is found by the aforementioned processing S4 and processing S5, and a difference (refer to "equation 4") between evaluation functions $H_0$ and $H_+$ is found (S11).

$$\Delta H = H_{30} - H_0$$

Next, temperature parameter T and uniform random numbers of $0 < r < 1$ are defined, and it is judged whether they satisfy "equation 5" or not (S12). In this case where they satisfy "equation 5", evaluation function $H_+$ is made to be $H_0$, and light source profile $S_+$ is made to be $S_0$, so that the condition transits (S13).

$$\exp\left(-\frac{\Delta H}{T}\right) > r$$

When an equilibrium is attained in this condition, temperature parameter T is reduced (S 14, S 15), and then it is judged whether the temperature is sufficiently low or not. When it has been judged that the temperature is low, the processing is completed (S 16).

On the other hand, in the case where the equilibrium is not attained or the temperature is still high, the program returns to the aforementioned S 11 and repeated.

The light source profile obtained by the aforementioned processing is most effective for the mask profile. For example, for the pattern shown in FIG. 57, which shows a conventional example, the light source profile shown in FIG. 48 is obtained, and for the pattern shown in FIG. 58, which shows a conventional example, the light source profile shown in FIG. 49 is obtained.

Figure 48:
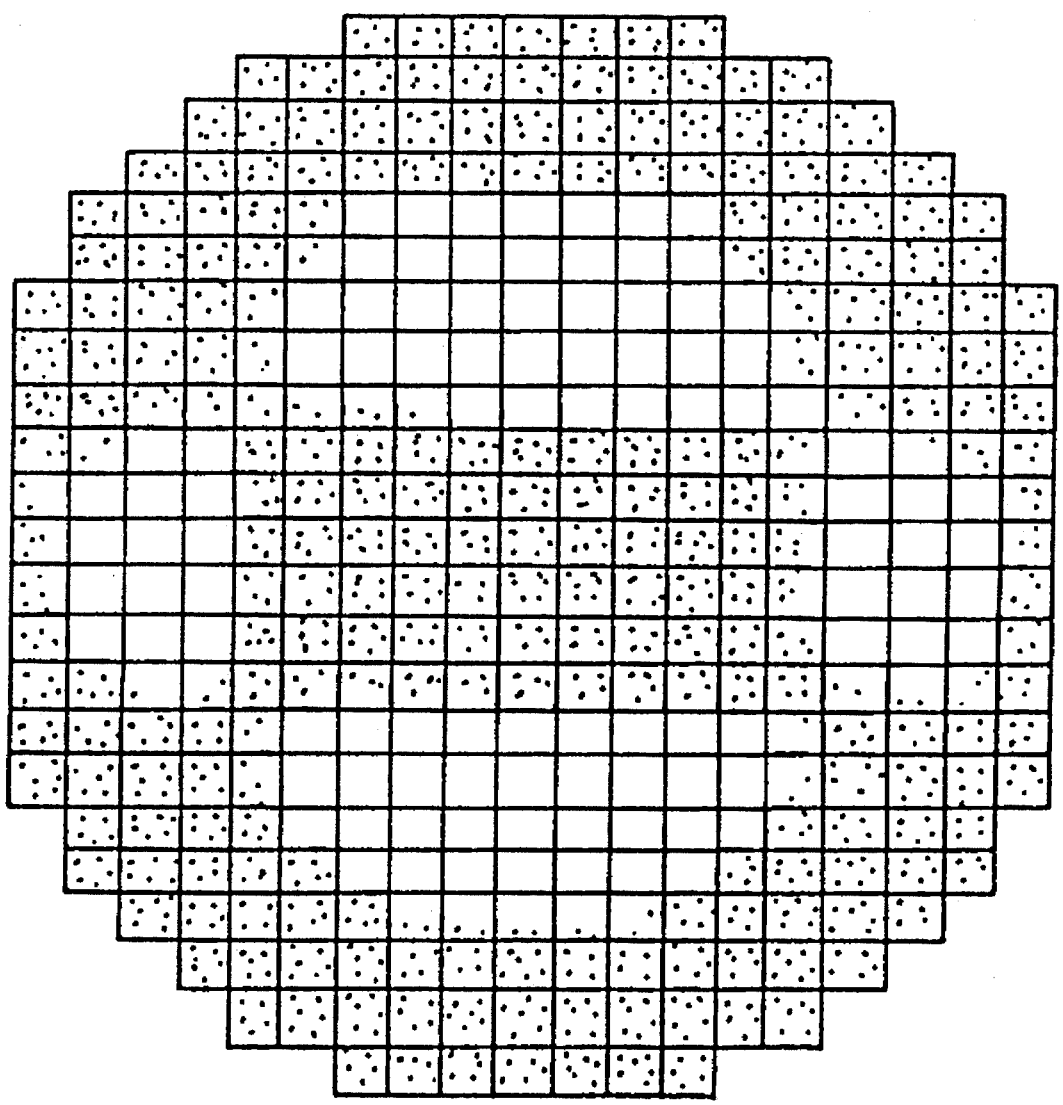
FIG. 48 is a view showing an example of the optimized light source profile of the embodiment 13.
Figure 49:
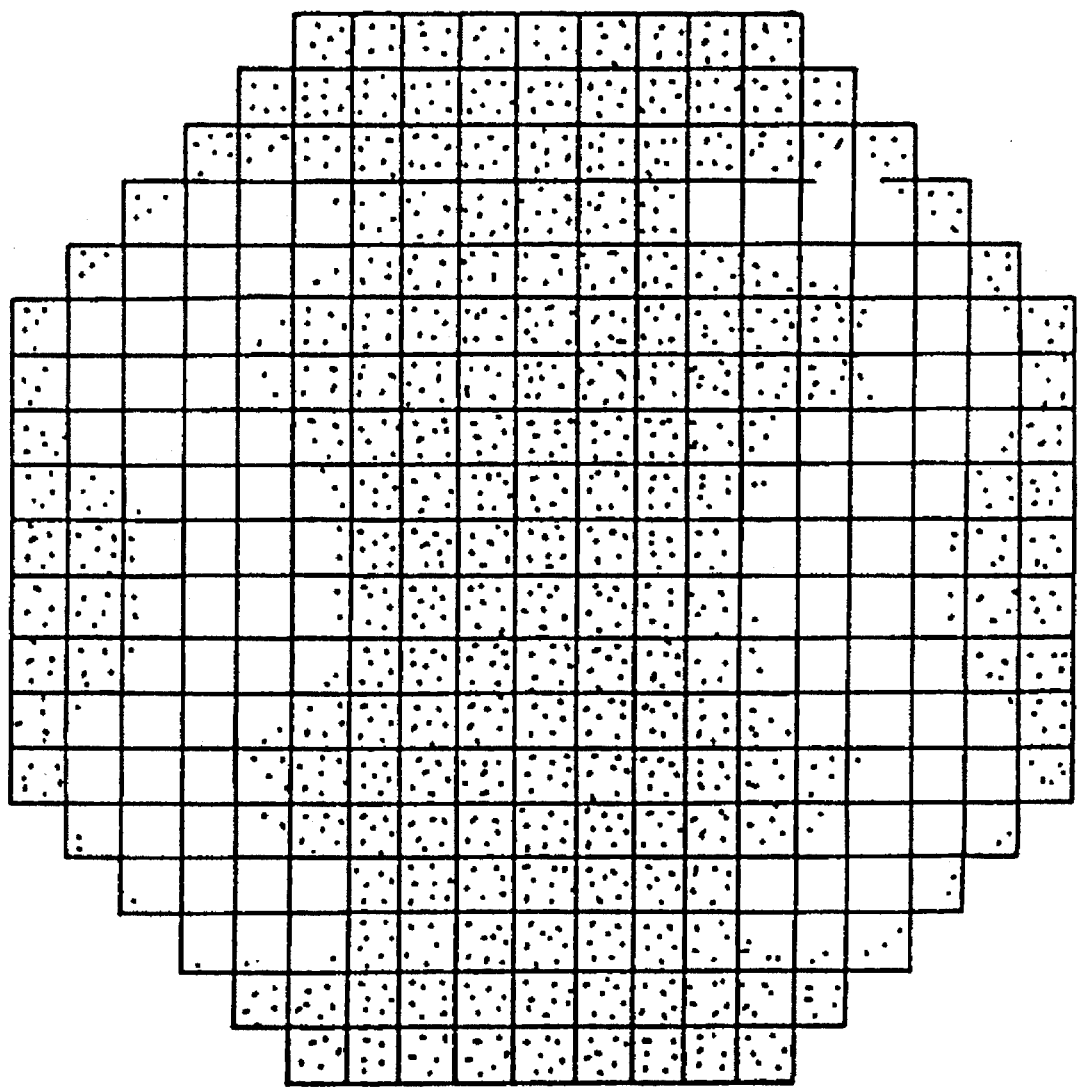
FIG. 49 is a view showing an example of the optimized light source profile of the embodiment 13.
Figure 50A:
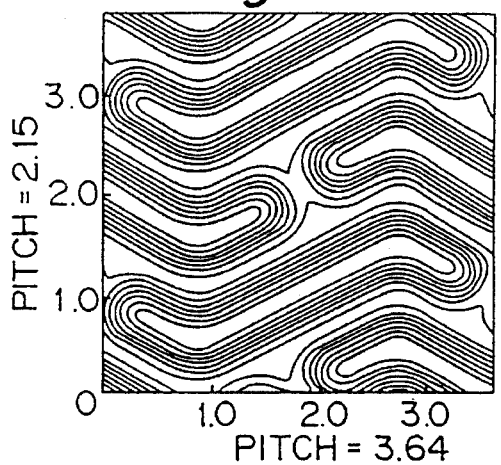
FIG. 50(a–50(f) are a set of views showing pattern images for each focal position obtained by the light source shown in FIG. 48.
Figure 50D:
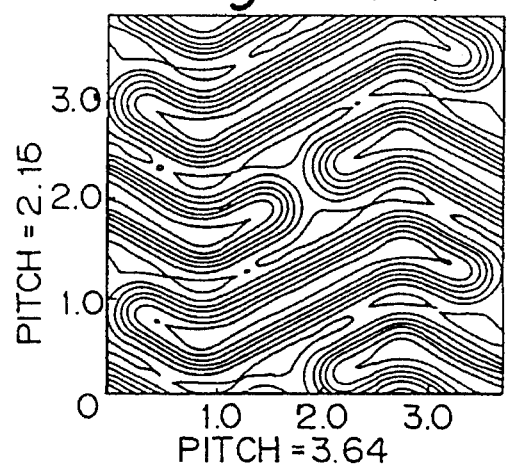
Figure 50B:
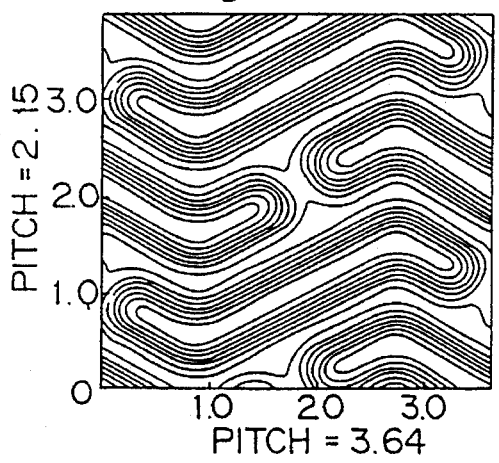
Figure 50E:
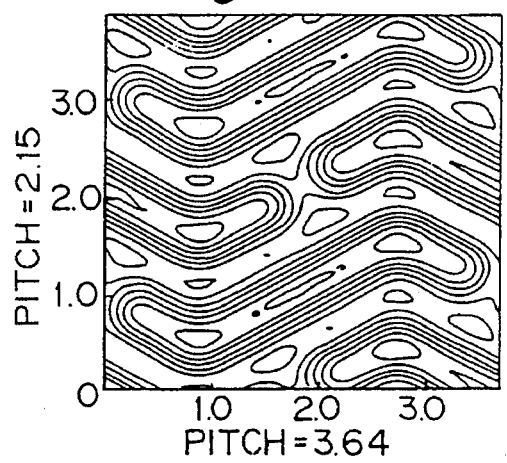
Figure 50C:
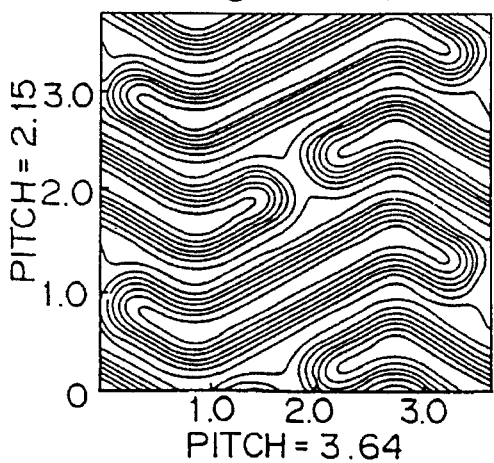
Figure 50F:
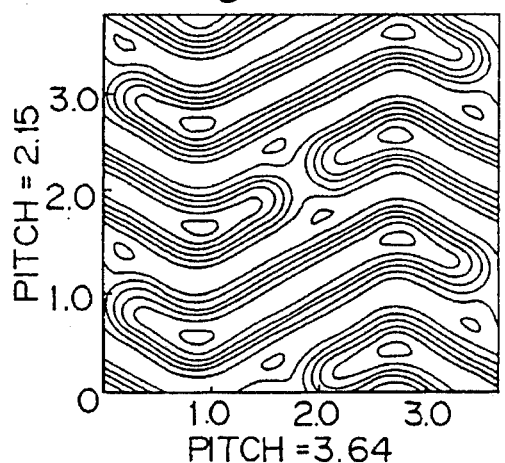
Figure 51A:
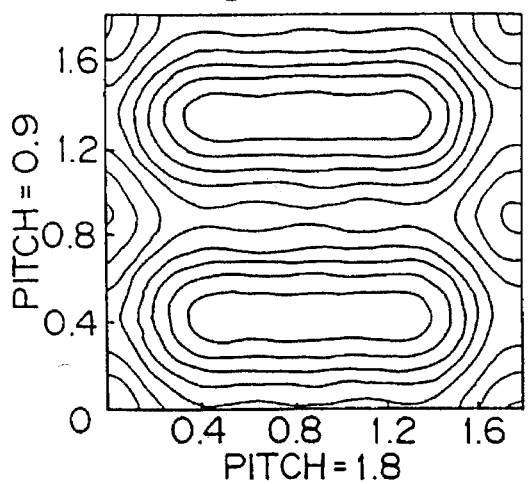
FIG. 51(a)–51(f) are a set of views showing pattern images for each focal position obtained by the light source shown in FIG. 49.
Figure 51D:
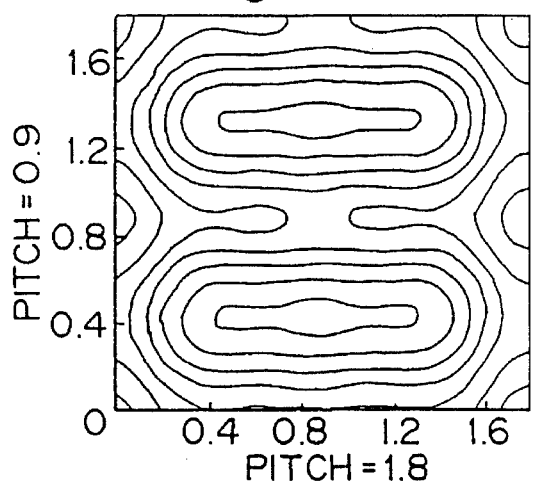
Figure 51B:
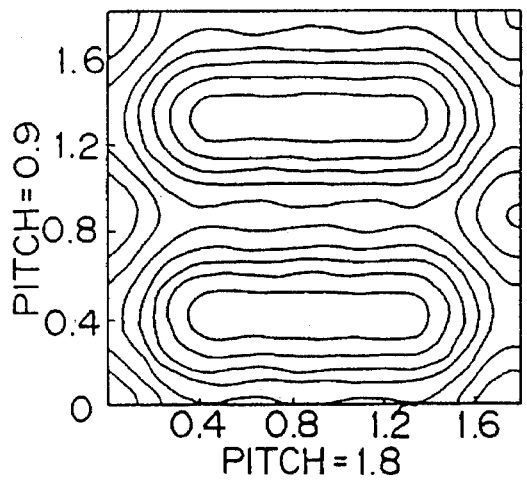
Figure 51E:
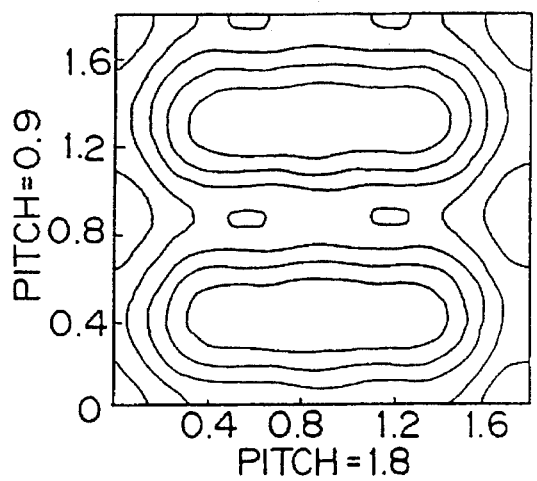
Figure 51C:
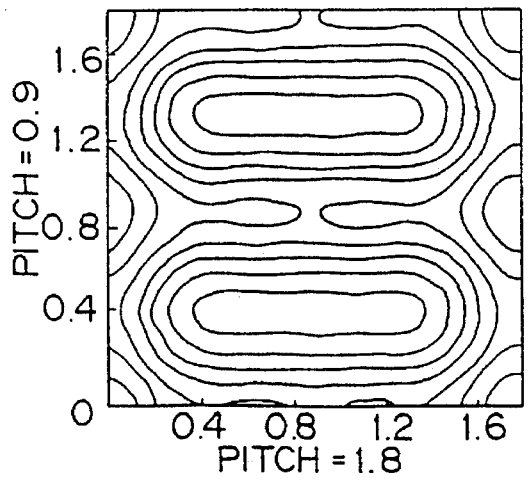
Figure 51F:
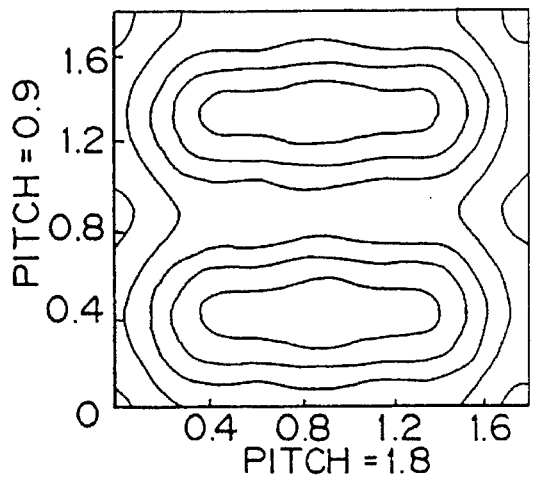

FIG. 50 shows a pattern image obtained when the same pattern as that shown in FIG. 57 is irradiated with the light source shown in FIG. 48. FIG. 51 shows a pattern image obtained when the same pattern as that shown in FIG. 58 is irradiated with the light source shown in FIG. 49.

As shown in FIGS. 50 and 51, a pattern image irradiated with the light source profile optimized by this embodiment is strong for faithful defocus with respect to an original image (DF=0) in a wide focal position as compared with the conventional examples shown in FIGS. 57 and 58.

Figure 52:
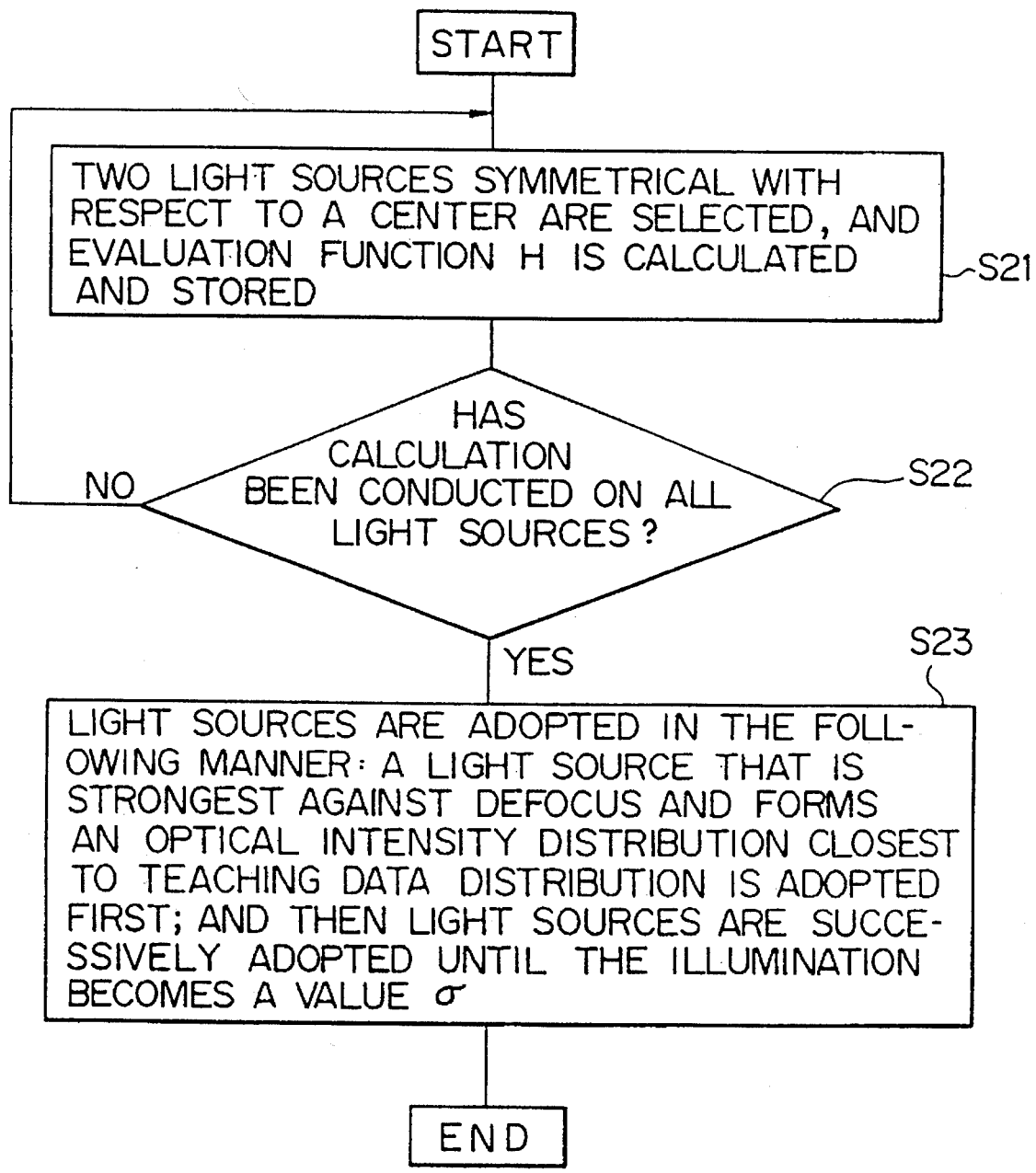
FIG. 52 is a flow chart showing primary processing of the embodiment 14.

FIG. 52 is a view showing another embodiment (Embodiment 14) of the optimization method for a light source profile according to the present invention. It is a flow chart showing the primary processing.

In this embodiment, the following problems of the SA method shown in FIG. 47 are solved:

(1) It takes time to calculate.

(2) It is complicated and difficult to designate the parameters.

In the SA method, the profile of a light source is expressed in the form of combination of light source pixels, and the optimal combination is found. In the case of a usual optical exposure device, image formation is attained by partial coherent light. Therefore, it can be considered that the images formed by light source pixels of each light source do not interfere with each other.

Accordingly, an approximate solution of the optimal light source can be found when the divided elements of the light source are selected spectrically with respect to the optical axis, each pair of light sources are evaluated, and light sources, the number of which is appropriate for providing illumination necessary for exposure, are adopted.

That is, in this embodiment, a pair of light sources symmetrical with respect to the optical axis are defined as a unit, and each optical intensity distribution is found, and then pairs of light sources are adopted until a predetermined illumination can be provided, wherein the adoption is made in the order of strength against defocus such that a pair of light sources stronger against defocus are adopted first.

In this case, whether or not a pair of light sources are strong against defocus is judged by collapse of a pattern in simulation.

In accordance with FIG. 52, the procedure will be explained as follows.

First, evaluation function H is found by processes S4 and S5 described above. Processing (S 21) to store this evaluation function H is conducted on all the light sources (S 22).

In accordance with stored data for each light source, light sources are adopted in the following manner: a light source that is strongest against defocus and forms an optical intensity distribution closest to teaching data distribution is adopted first; and then light sources are successively adopted until the illumination becomes a value σ (S 23).

According to the above processing, the optimal light source profile can be effectively found, so that the calculation time can be greatly reduced as compared with the example according to the aforementioned SA method.

As a result, a profile that can be easily realized is obtained. When a light source suitable for a pattern profile is used, the resolution and focal depth can be improved. As explained above, according to this embodiment, the optimization of a light source profile for an actual pattern, which has been conventionally assumed to be difficult, can be realized by means of the optimization combination processing, so that the optimal light source pattern can be provided in accordance with a device pattern.

Consequently, the effect of oblique incidence illumination can be effectively exerted, and the invention can contribute to improvement in photolithographic technology.

According to the present embodiment, the optimization of a light source profile for an actual pattern, which has been conventionally assumed to be difficult, can be realized by means of the optimization combination processing in which the optimization is conducted until a predetermined evaluation judgement condition is satisfied. Therefore, the optical light source pattern can be provided in accordance with a device pattern.

Accordingly, the effect of oblique incidence illumination can be sufficiently exerted, and the accuracy of precise processing of photolithography can be improved.

EMBODIMENT 15

Before the embodiment 14 of the present invention is explained, exposure technique such as phase shift mask and oblique incidence illumination will be explained in which the phase difference is used.

FIG. 63(a) is schematic of a phase shift mask. A shading metallic film 323 made of chrome is selectively provided on the surface of a transparent base plate 322 made of quartz, so that apertures are determined. In one of the adjoining apertures, a phase shifter 324 made of a $SiO_2$ film is formed.

Thickness of the phase shifter 324 is selected so that the phase of light passing through the phase shifter can be delayed with respect to the phase of light passing through an aperture having no phase shifter. For example, the thickness of the phase shifter 324 is selected so that a phase difference of half wavelength can be generated.

Consequently, concerning rays of light 321a and 321b that have passed through the adjoining aperture, a phase of the ray of light 321a that has passed through the aperture having no phase shifter advances by a half wavelength as compared with a phase of the ray of light 321b that has passed through the aperture having a phase shifter. The aforementioned waves of reverse phase are canceled with each other when interference is caused, so that the optical intensity is reduced.

FIG. 63(b) is a schematic illustration for explaining oblique incidence illumination. The shading metallic film 323 made of chrome is selectively provided on the surface of the transparent base plate 322 made of quartz so that adjoining apertures are determined.

Rays of light 321a and 321b are irradiated to the adjoining apertures in an oblique direction. Study is made at a point of time when the rays of light have passed through the mask. Since the ray of light 321b has passed through a longer optical path than that of the ray of light 321a, the phase of the ray of light 321b is delayed as compared with that of the ray of light 321a. In the case where the phase difference is selected to be a half wavelength, the optical intensity is reduced when interference is caused between these two rays of light in the centers of the two apertures and on the normal line of the base plate.

FIG. 63(c) is a schematic illustration showing a change of the amplitude of light in the case where the two rays of light of reverse phase interfere with each other. When a ray of light having an amplitude shown by curve "a" interferes with a ray of light of reverse phase shown by curve "b", an amplitude of light shown by curve "c" can be obtained. In this case, in a region where the two rays of light are superimposed, the amplitude is reduced because the phases of the rays of light are reverse to each other.

FIG. 63(d) shows an optical intensity distribution in the case where the aforementioned interference has occurred. Rays of light of reverse phase that have been spread by diffraction, are superimposed in the end portions between the rays, so that the amplitude is reduced. Accordingly, the optical intensity is also reduced. As described above, when two rays of light having a phase difference interfere with each other, the width of distribution of light that has been spread by diffraction can be restricted.

Figure 64A:
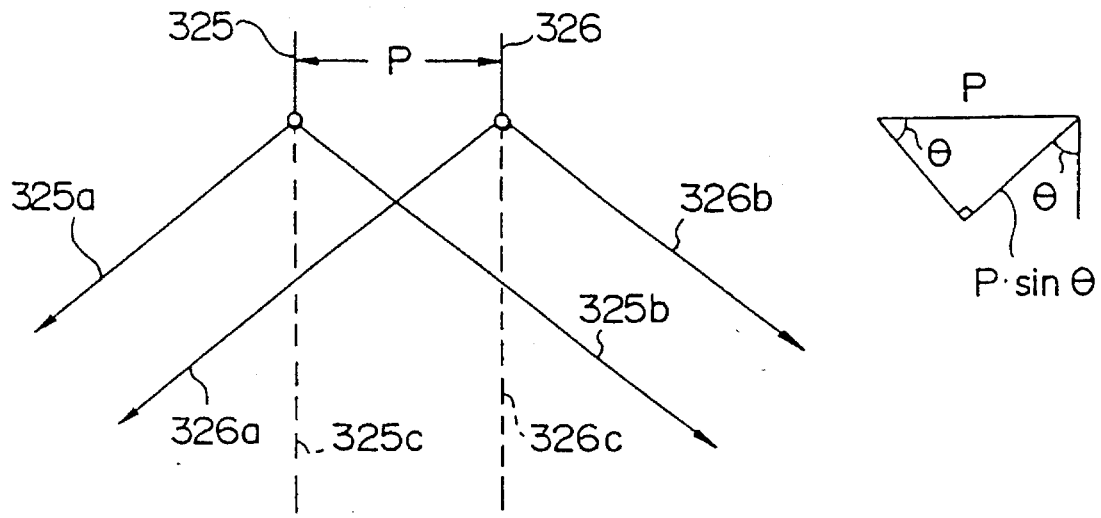
FIGS. 64(a) and 64(b) are a pair of diagrams showing an outline of a phase shift mask.

FIG. 64 is a schematic illustration for explaining the function of a phase shift mask. Rays of light 325 and 326 are incident on the mask and emergent from the phase shifter. A phase difference corresponding to a half wavelength is caused between the emergent rays of light 325c and 326c, for example, the ray of light 326c has a phase difference corresponding to a half wavelength with respect to another ray of light 325c. The intensity of light of reverse phase is reduced in accordance with the amplitude when interference is caused.

In order to form an image on a projection surface, it is necessary that at least two rays of diffraction light 325a and 326a of the −1 order generated from two rays of light 325 and 326, interfere with two rays of diffraction light of the first order on the projection surface.

A direction in which diffraction light of the −1 order is generated with respect to pitch "p" of two rays of light 325 and 326 is studied here. An optical path difference between the rays of light 326a and 325a is p·sin θ as shown on the right of FIG. 64(a). With respect to diffraction light of the −1 order, the optical path difference is the same.

When pitch "p" is large, diffraction light of multi-order is incident on the projection lens, however, as pitch "p" is decreased, the number of the order of the light incident on the projection lens is lowered. Consequently, in the case where a high resolution is required, behaviors of rays of light of the 0 and first orders are important.

In the phase shift mask, a phase shifter is formed in one of the adjoining apertures, so that the phase of emergent light is different by angle π. Consequently, diffraction light of the ±1 order is generated in a direction in which p.sin θ becomes equal to π. Angle θ in which diffraction light of the first order is generated becomes larger as pitch "p" is reduced.

Figure 64B:
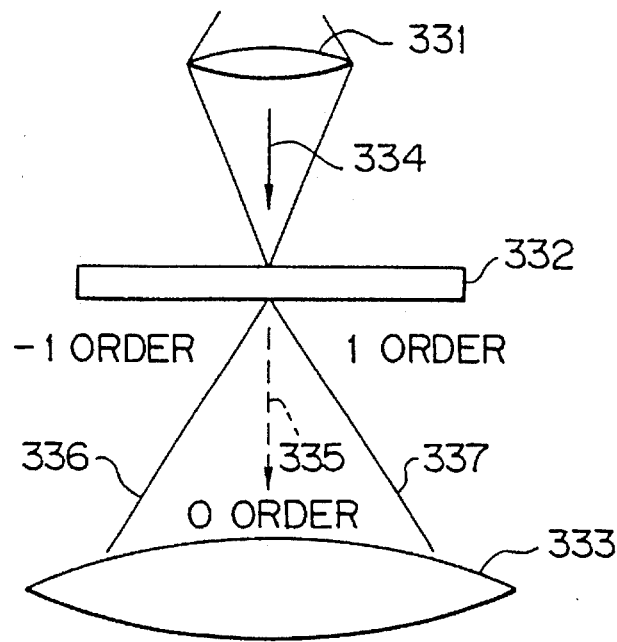

FIG. 64(b) is schematic of an image formation system in the case where the aforementioned phase shift mask is used.

A ray of light sent from a light source is projected onto a phase shift mask 332 through a condenser lens 331. At this time, a central ray of light 334 of the luminous flux is irradiated vertically to the phase shift mask 332.

The ray of light that has passed through the phase shift mask 332 becomes two luminous fluxes of opposite phase, and the ray of light 335 of the 0 order that advances straight is canceled by interference. When the optical intensities of both luminous fluxes are approximately the same, the entire optical intensity is approximately extinguished, so that the ray of light is mainly composed of the ray of light 336 of the −1 order and the ray of light 337 of the first order. When the two rays of light 336 and 337 are irradiated on the projection surface with the projection lens 333, an image is formed.

Figure 65A:
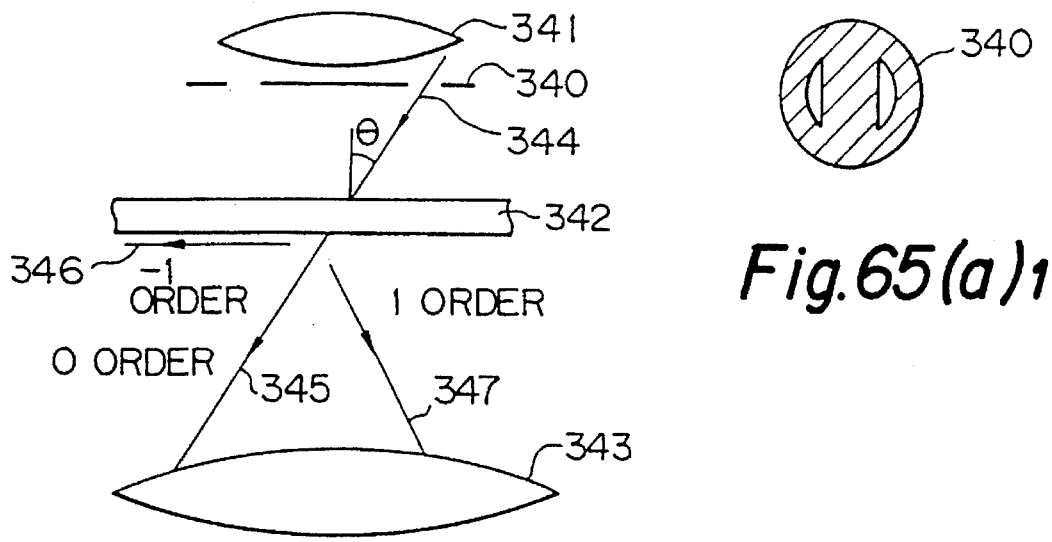
FIGS. 65(a) and 65(b) are a pair of diagrams showing an outline of oblique incidence illumination exposure.
Figure 65B:
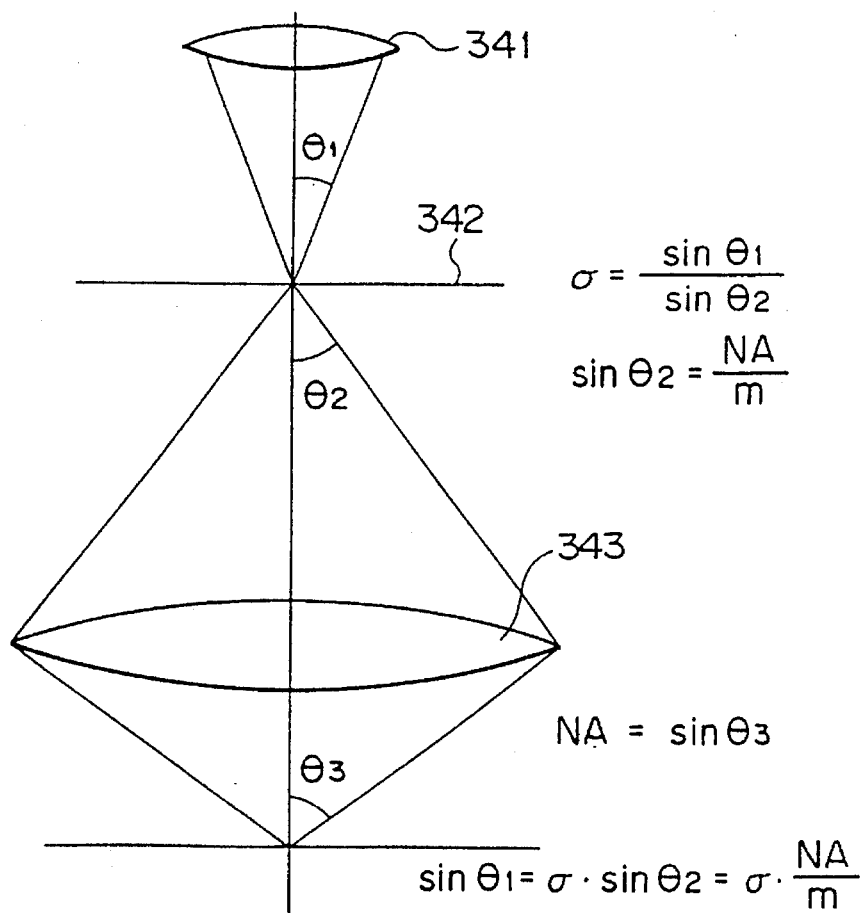

FIGS. 65(a) and 65(b) are schematic illustrations for explaining oblique incidence illumination exposure. FIG. 65(a) is schematic of a behavior of light in oblique incidence illumination exposure. A diaphragm plate 340 having an aperture portion divided into two is disposed below the condenser lens 341.

A ray of light incident on the condenser lens 341 passes through the aperture of the diaphragm plate 340, and only the light that has passed through the aperture is projected onto the mask 342. Therefore, the ray of light 344 incident on the mask 342 is oblique to the mask 342 by angle θ.

When the ray of light oblique to a normal line is incident on the adjoining apertures as described above, a phase difference is caused between the adjoining apertures as explained in relation to FIG. 63(*b*). A ray of light advancing in a direction of the normal line of the base plate is canceled by interference, and as diffraction light, a ray light 345 of the 0 order that advances straight, a ray of light 346 of the −1 order and a ray of light 347 of the first order are generated. Under the condition shown in the drawing, the ray of light 345 of the 0 order and the ray of light 347 of the first order are collected by the projection lens 343 and irradiated onto the projection surface.

As pitch "p" between the adjoining apertures on the mask 342 is reduced, an angle formed between the ray of light 45 of the 0 order and the ray of light 347 of the first order is increased. Therefore, in order to collect these rays of light, it is necessary to use a projection lens 343 having a large numerical aperture.

FIG. 65(*b*) is a schematic illustration for explaining an optical system of oblique incidence illumination exposure.

A condenser lens 341, mask 342 and production lens 343 are disposed on the optical axis. An angle formed between a ray of light obliquely incident on the mask 342 from the condenser lens 341 and the optical axis is represented by angle $\theta_1$. An angle formed between a ray of light emitted from the mask 342 that passes through the outermost portion of the projection lens 343 and the optical axis, is represented by angle $\theta_2$.

An angle formed between the optical axis and a ray of light that has passed through the outermost portion of the projection lens 343 and advances on the projection surface, is represented by angle $\theta_3$.

where $$\sigma = \sin\theta_1 / \sin\theta_2$$

$$\sin\theta_2 = NA/m$$

$$NA = \sin\theta_3$$

In this case, NA is a numerical aperture, and 1/m is a reduction ratio.

At this time, the following equation is satisfied.

$$\sin\theta_1 = \sigma \cdot \sin\theta_2 = \sigma \cdot (NA/m)$$

The above equation can be rewritten as follows.

$$\theta_1 = \sin^{-1}\{\sigma \cdot (NA/m)\}$$

The maximum angle of angle $\theta_1$ formed by a ray of light incident on the mask 342 is expressed as follows.

$$\theta_1 = \theta_2$$

In this case, σ=1.

In the case of oblique incidence illumination exposure, a ray of light advancing along the optical axis is the cause of deterioration of the resolution. Therefore, it is desired to increase angle $\theta_1$ of incident light to a certain extent.

For example, it is desirable that the following inequality is satisfied.

$$0.4 \leq \sigma \leq 1$$

Figure 66A:
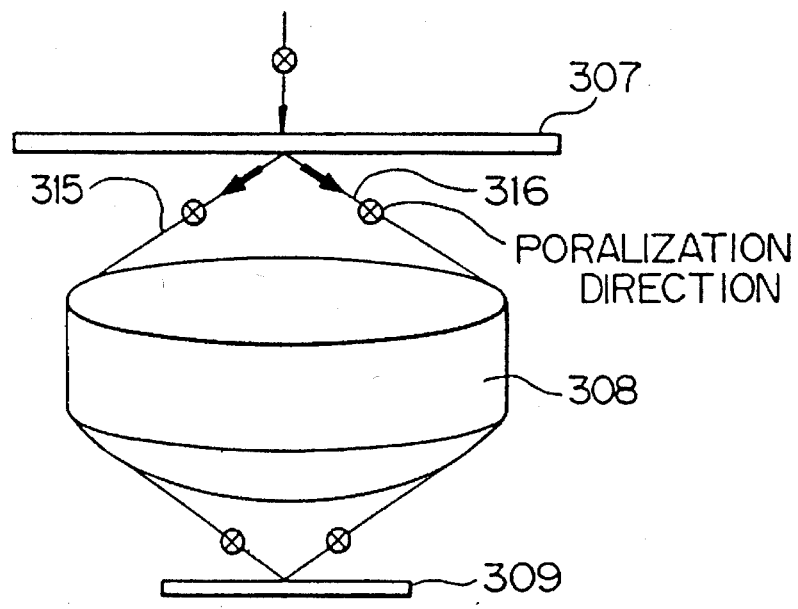
FIGS. 66(a) and 66(b) are a pair of diagrams showing an outline of the difference of image formation capacity caused by polarization.
Figure 66B:
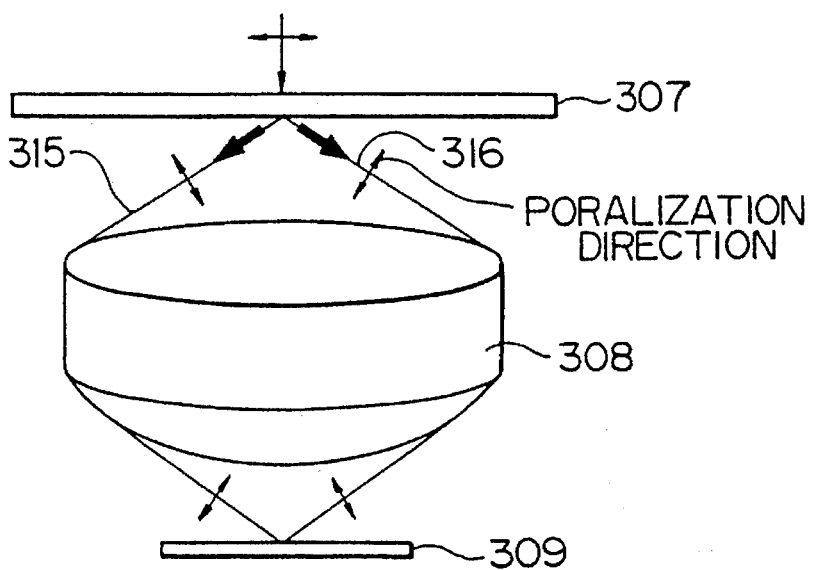

FIGS. 66(*a*) and 66(*b*) are schematic illustrations for explaining a difference of image forming ability caused by polarization. In this case, a parallel pattern of line and space is formed on the mask.

FIG. 66(*a*) is a view for explaining a case in which polarized light parallel with a pattern direction of line and space is used for image formation.

Assume that a pattern of line and space is formed on the mask 307 in a direction vertical to the surface of the drawing. Assume the linearly polarized light which has been polarized in a directing vertical to the surface of the drawing is vertically incident on the mask 307. That is, the direction of polarization and that of the pattern are parallel with each other.

After the ray of light has passed through the mask 307, diffraction light 315 of the −1 order and diffraction light 316 of the finest order are generated as shown in the drawing, and collected by the projection lens 308, and the collected light is incident on an exposure surface such as a wafer 309. At this time, the direction of polarization is always vertical to the surface of the drawing, and the direction of polarization of diffraction light 315 of the −1 order and that of diffraction light 316 of the first order are the same. Accordingly, diffraction light 315 of the −1 order and diffraction light 316 of the first order interfere with each other on the wafer 309, and an image is formed.

FIG. 66(*b*) shows a behavior of light in the case where the direction of line and space pattern is vertical to the direction of polarization. In the same manner as a case shown in FIG. 66(*a*), the mask 307 is provided with a line and space pattern in a direction vertical to the surface of the drawing. Linearly polarized light having the polarization direction of the surface of the drawing is vertically incident on the mask 307.

The polarization direction of diffraction light 315 of the −1 order and that of diffraction light 316 of the first order are on the surface of the drawing after the light has passed through the mask 307, and the polarization direction is vertical to the advancing direction of light. The polarization direction of light collected by the projection lens 308 and irradiated on the wafer 309 is also vertical to the advancing direction of light and on the surface of the drawing.

As can be seen from the drawing, when an angle formed between diffraction light 315 of the −1 order and diffraction light 316 of the first order is increased, the polarization directions cross each other, so that the degree of interference between diffraction light 315 of the −1 order and diffraction light 316 of the first order is reduced.

If diffraction light 315 of the −1 order and diffraction light 316 of the first order make a right angle with each other, interference is not caused at all. That is, these two rays of diffraction light form no image and become noise components.

According to the study described above, the present embodiment provides an exposure method in which only rays of light are used that can effectively cause interference on the image forming surface.

Figure 59:
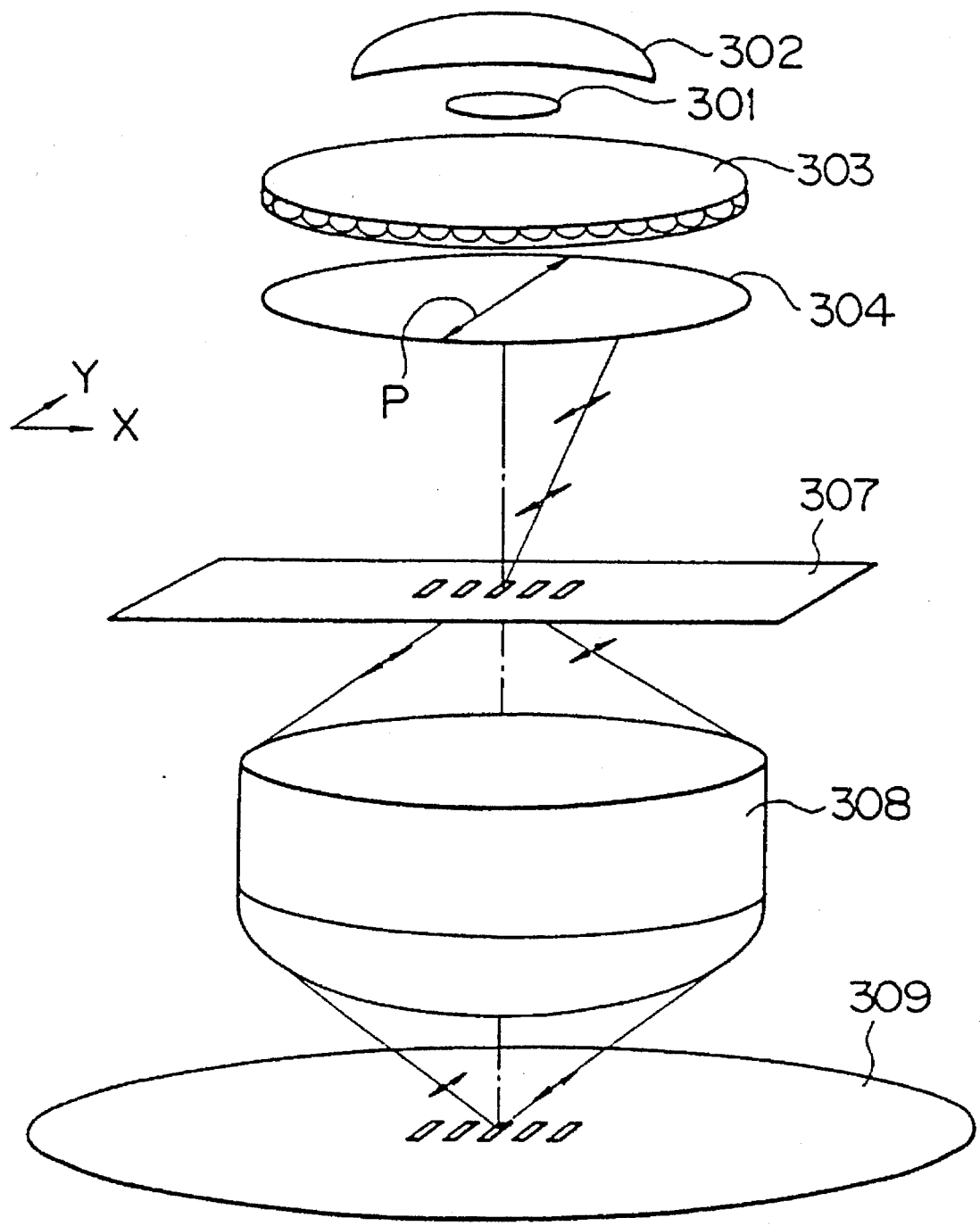
FIG. 59 is a perspective view for explaining an outline of projection exposure according to the embodiment 15.

FIG. 59 is a schematic illustration for explaining an exposure method according to the embodiment 15 of the present invention. Numeral 301 is, for example, an extra-high voltage mercury lamp. A reflecting mirror 302 is disposed above the light source 301, so that the light emitted upward is reflected downward.

A fly eye lens is disposed below the light source 301 so that the incident light is uniformly irradiated on a mask 307.

A polarizing plate 304 is disposed between the fly eye lens 303 and the mask 307. The polarizing plate 304 is provided with a sufficient polarizing capacity for a wavelength of light to be used.

The mask 307 is composed, for example, in such a manner that a phase shifter is provided on a quartz glass plate. In this case, a region in which the optical intensity is reduced by interference is generated along the periphery of the phase shifter. Moreover, a chromic film to determine an aperture through which light is transmitted may be formed. In this connection, a projection lens 308 is disposed below the mask 307, and focuses the incident light on the wafer 309.

As shown in the drawing, a pattern in which a profile long in the Y direction is repeatedly formed is provided on the mask 307. In this case, polarization direction P of the polarizing plate 304 is set in the Y direction so that it can be parallel with the pattern direction on the mask 307. Consequently, a ray of light that has passed through the polarizing plate 304 is polarized in the Y direction as shown in the drawing.

Diffraction light is generated in the light that has passed through the pattern on the mask 307, and the diffraction light is collected by the projection lens 308 and focused on the wafer 309. At this time, the polarizing direction of the light incident on the wafer 309 is oriented in the Y direction, so that the light effectively interferes with each other, and an image is formed on the wafer 309.

FIG. 60 shows a sample pattern of a mask used for an experiment of projection exposure to which polarization is applied. The mask pattern is composed of a line and space pattern 312 long in the Y direction, and a line and space pattern 314 long in the X direction. In this case, the patterns 312 and 314 were made of only a phase shifter of $SiO_2$ provided on a quartz glass plate.

The optical conditions of the exposure system were as follows: exposure wavelength=365 nm (i ray), NA=0.54, and σ=0.5. Reduction ratio 1/m was set at ⅕, and a plurality of mask patterns of different pitch were made.

The film thickness of a phase shifter to form the patterns 312 and 314 was about 388 nm. That is, when a ray of light passes through the phase shifter, phase difference of π is caused in the light, the wavelength of which is 365 nm.

For the photoregister, a PF115 material (brand name) manufactured by Sumitomo Chemical Co., was used.

Figure 61A:
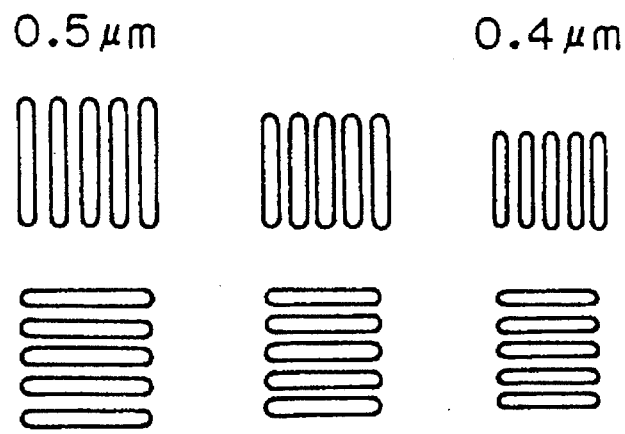
FIGS. 61(a) and 61(b) are schematic views showing experimental results.
Figure 61B:
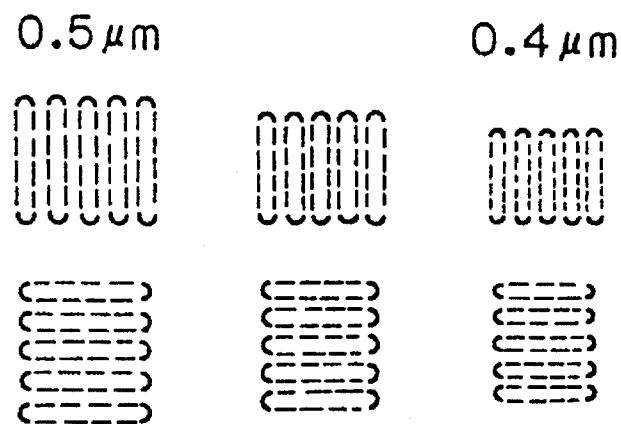

FIG. 61(a) is a schematic view of a register pattern obtained when a sample pattern was exposed with non-polarized light according to conventional technique. FIG. 61(b) is a schematic view of a register pattern obtained when a sample pattern was exposed with polarized light in the Y direction.

According to the result of image formation of the pattern in which the phase shifters of 2 μm width on the mask (0.4 μm width on the wafer) were disposed at pitch of 4 μm, sufficient resolution was not provided by the conventional technique irrespective of the pattern direction.

On the other hand, as shown in FIG. 61(b), in the exposure in which polarized light in the Y direction was used, sufficient resolution was provided to the pattern that is long in the Y direction. However, the resolution of the pattern 314 that is long in the X direction is lower than that of the conventional technique.

As can be seen from the results shown in FIGS. 61(a) and 61(b), when the polarizing direction is selected in accordance with the pattern direction, the resolution can be improved.

Accordingly, in the case where a pattern to be exposed is oriented in one direction, high resolution can be provided when linearly polarized light in the pattern direction is used. For example, it can be applied to the exposure of an electrode of an SAW filter and also applied to the exposure of a diffraction grating.

When a pattern of the X direction and that of the Y direction are mixed in a pattern to be exposed, the pattern to be exposed is divided into two, and one of them may be selected in accordance with the polarized direction.

Figure 62:
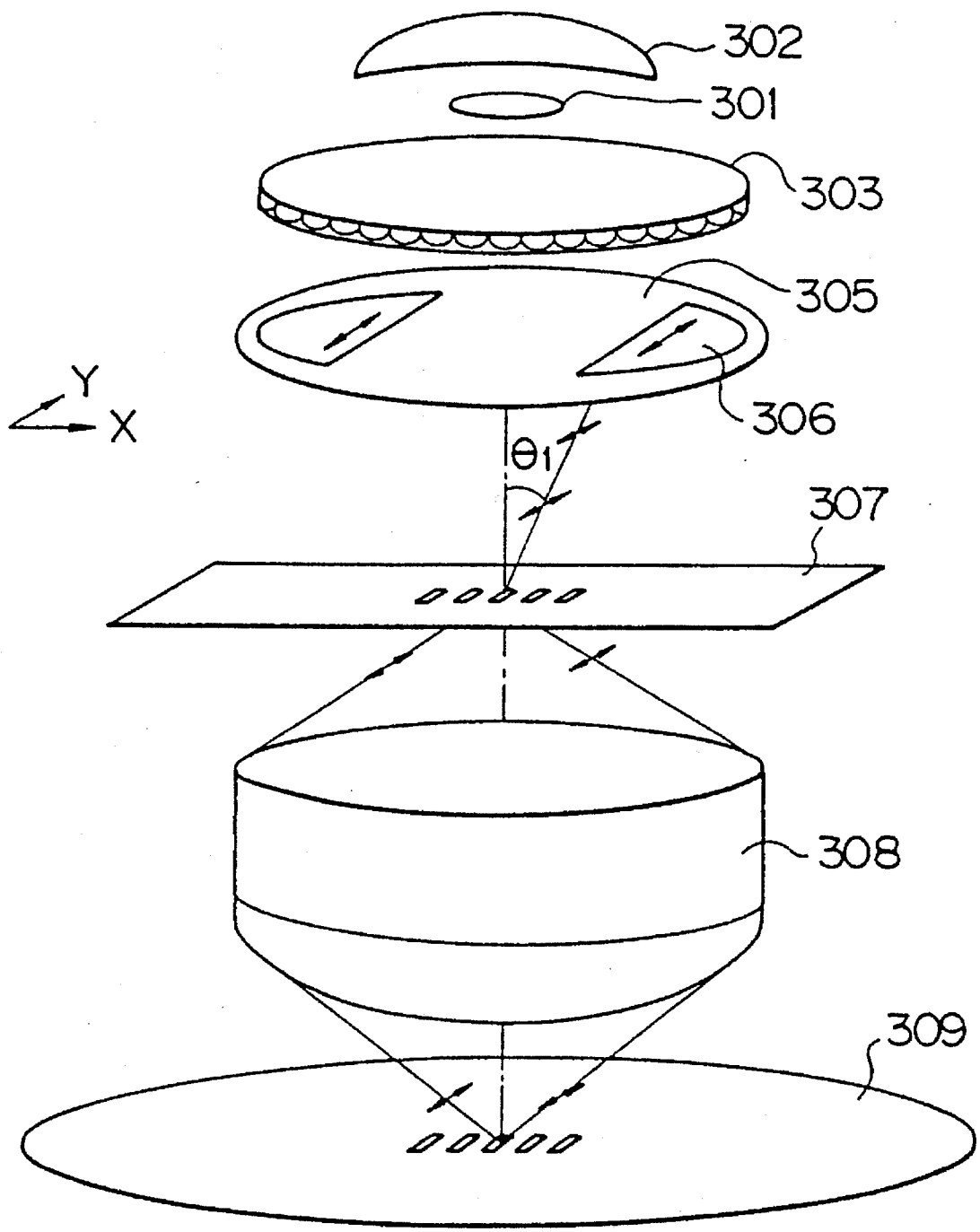
FIG. 62 is a perspective view for explaining projection exposure of the embodiment 16.

FIG. 62 is a view for explaining projection exposure of the embodiment 16 of the present invention. For this embodiment, oblique incidence illumination exposure is used. A light source 301, reflecting mirror 302, fly eye lens 303, mask 307, projection lens 308 and wafer 309 are the same as those explained in the embodiment shown in FIG. 59.

Between the fly eye lens 303 and the mask 307, is provided a diaphragm plate 305 having apertures disposed symmetrically with respect to an optical axis. The diaphragm plate 305 is made of, for example, an aluminum plate. A polarizing plate 306 is disposed in the aperture of the diaphragm plate 305. Accordingly, a ray of light emitted from the light source 301 passes through the fly eye lens 303 and is transmitted through the polarizing plate 306 in the aperture of the diaphragm plate 306, and then the ray of light reaches the mask 307.

In the case where the pattern on the mask 307 is long in the Y direction, the apertures of the diaphragm plate 305 that are opposed to each other are arranged in the X direction, so that the polarizing direction of the polarizing plate is set in the Y direction. As a result of the foregoing, the ray of light that has passed through the mask 307 having the pattern of the Y direction reaches an image formation surface while the polarizing direction is maintained in the Y direction, and image formation is effectively conducted.

It is preferable that an oblique incidence angle $\theta_1$ of a ray of light incident on the mask is in the following range.

$$\theta_1 = \sin^{-1}\{(0.4 \text{ to } 1.0) \times (NA/m)\}$$

The present invention has been explained above with reference to the embodiments., however, it should be understood that the present invention is not limited to the specific embodiments. For example, in the structure shown in FIG. 62, the diaphragm plate 305 and the polarizing plate 306 may be separate bodies. Moreover, the profile of the opposed apertures may be formed rectangular or into other shapes.

Moreover, it is possible to provide the mask with polarization effects. It will be clear for a person with ordinary skill in the art that variations, improvements and combinations can be made in the present invention.

When projection exposure is conducted with linearly polarized light that is oriented in the mask direction, the resolution can be improved.

We claim:

1. An optimization method for a light source profile in an optical exposure apparatus including a light source having a light source surface of a predetermined irradiation area, an illumination lens, a photomask having a predetermined mask profile, a projection lens and a device substrate, wherein a light from said light source is irradiated on to said photomask through said illumination lens, said light passing through said photomask is exposed on said device substrate through said projection lens to form a device profile on said device substrate, said optimization method comprising the steps of:

dividing said light source surface into a predetermined number of blocks, so that a point light source corresponding to each divided block is a processing element of optimization processing:

converting said respective processing element into binary information;

varying a value of said processing element by the predetermined number of the blocks in accordance with the conditions of said device profile, said mask profile, optical parameter and optimization parameter; and conducting optimization combination processing to determine the light source profile, until a predetermined evaluation judgement condition is obtained.

2. The optimization method for a light source profile according to claim 1, wherein said optimization combination processing is a simulated annealing method.

3. The optimization method for a light source profile according to claim 1, wherein said optimization combination processing is carried out in such a manner that: optical intensity is determined for each pair of point light sources symmetrical with respect to an optical axis; said pair of point light sources are successively adopted from one, a focal depth of which is largest, until a predetermined illumination can be provided.

4. An optimization method for a light source profile in an optical exposure apparatus including a light source having a light source surface of a predetermined irradiation area, an illumination lens, a photomask having a predetermined mask profile, a projection lens and a device substrate, wherein a light from said light source is irradiated on to said photomask through said illumination lens, said light passing through said photomask is exposed on said device substrate through said projection lens to form a device profile on said substrate, said optimization method comprising the steps of:

dividing said light source surface into a predetermined number of blocks, so that a point light source corresponding to each divided block is a processing element of optimization processing:

converting said processing element into binary information;

inputting conditions of a device profile, mask profile, optical parameter and optimization parameter;

generating a sampling point for evaluating said processing elements;

registering ideal optical intensity data as teaching data for each sampling point; and selecting a combination or said processing elements to determine an evaluation function of the combination, so that a light source profile is determined by varying the combination of said processing elements until said evaluation function obtains a predetermined evaluation judgement condition.

5. The optimization method for a light source profile according to claim 4, wherein said optimization combination processing is a simulated annealing method.

6. The optimization method for a light source profile according to claim 4, wherein said optimization combination processing is carried out in such a manner that: optical intensity is determined for each pair of point light sources symmetrical with respect to an optical axis; said pair of point light sources are successively adopted from one, a focal depth of which is largest, until a predetermined illumination can be provided.

* * * * *